(12) United States Patent
Adachi et al.

(10) Patent No.: US 8,257,913 B2
(45) Date of Patent: Sep. 4, 2012

(54) PROCESSING METHOD OF LITHOGRAPHIC PRINTING PLATE PRECURSOR

(75) Inventors: Keiichi Adachi, Shizuoka (JP); Shigekatsu Fujii, Shizuoka (JP); Yoshinori Taguchi, Shizuoka (JP); Takashi Sato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 844 days.

(21) Appl. No.: 12/239,035

(22) Filed: Sep. 26, 2008

(65) Prior Publication Data
US 2009/0148793 A1   Jun. 11, 2009

(30) Foreign Application Priority Data
Sep. 28, 2007   (JP) ................... 2007-256706

(51) Int. Cl.
*G03F 7/26* (2006.01)
*G03C 5/26* (2006.01)
(52) U.S. Cl. ........................ 430/434; 430/302
(58) Field of Classification Search .............. 430/401, 430/434
See application file for complete search history.

(56) References Cited

U.S. PATENT DOCUMENTS

| | | | |
|---|---|---|---|
| 3,891,439 A * | 6/1975 | Katz et al. ............. | 430/331 |
| 6,365,330 B1 * | 4/2002 | Leichsenring et al. ...... | 430/331 |
| 2002/0092436 A1 | 7/2002 | Tsuchiya et al. | |
| 2003/0224281 A1 * | 12/2003 | Ishizuka et al. .............. | 430/157 |
| 2004/0191693 A1 * | 9/2004 | Takamiya .................... | 430/302 |
| 2007/0178414 A1 | 8/2007 | Adachi | |

FOREIGN PATENT DOCUMENTS

| | | |
|---|---|---|
| EP | 0770494 A2 | 5/1997 |
| EP | 1457836 A2 | 9/2004 |
| EP | 1457837 A2 | 9/2004 |
| EP | 1816521 A2 | 8/2007 |
| JP | 2938397 B2 | 6/1999 |
| JP | 2002-91016 A | 3/2002 |
| JP | 2005-242108 A | 9/2005 |
| JP | 2007-212870 A | 8/2007 |
| JP | 2007-233321 A | 9/2007 |

OTHER PUBLICATIONS

Extended European search report dated Sep. 23, 2010, issued in corresponding European Application No. 08165236.4.
Office Action dated Jul. 12, 2011 in Japanese Application No. 2007-256706.

* cited by examiner

*Primary Examiner* — Cynthia Kelly
*Assistant Examiner* — Chanceity Robinson
(74) *Attorney, Agent, or Firm* — Sughrue Mion, PLLC

(57) ABSTRACT

A processing method of a lithographic printing plate precursor includes: exposing imagewise a lithographic printing plate precursor comprising a support on a surface of which at least one of: a hydrophilizing treatment; and an undercoat layer has been provided and an image-recording layer, to cure an exposed area of the image-recording layer; and undergoing developing processing with an aqueous solution having pH of from 2 to 10, wherein the aqueous solution comprises an amphoteric surfactant and an anionic surfactant selected from an anionic surfactant having an aliphatic chain and a total number of carbon atoms included in the aliphatic chain of 6 or more and an anionic surfactant having an aromatic ring and a total number of carbon atoms of 12 or more, and a content of the anionic surfactant is from 0.1 to 3.3% by weight of the aqueous solution.

3 Claims, 3 Drawing Sheets

PROCESSING METHOD OF LITHOGRAPHIC PRINTING PLATE PRECURSOR

FIELD OF THE INVENTION

The present invention relates to a processing method of a lithographic printing plate precursor, particularly, to a processing method of a lithographic printing plate precursor which has an excellent function for preventing printing stain due to readsorption of a photosensitive layer component (particularly, a binder) dispersed in a processing solution to a substrate.

BACKGROUND OF THE INVENTION

In general, a lithographic printing plate is composed of an oleophilic image area accepting ink and a hydrophilic non-image area accepting dampening water in the process of printing. Lithographic printing is a printing method which comprises rendering the oleophilic image area of the lithographic printing plate to an ink-receptive area and the hydrophilic non-image area thereof to a dampening water-receptive area (ink unreceptive area), thereby making a difference in adherence of ink on the surface of the lithographic printing plate, and depositing the ink only to the image area by utilizing the nature of water and printing ink to repel with each other, and then transferring the ink to a printing material, for example, paper.

In order to produce the lithographic printing plate, a lithographic printing plate precursor (PS plate) comprising a hydrophilic support having provided thereon an oleophilic photosensitive resin layer (photosensitive layer or image-recording layer) has heretofore been broadly used. Ordinarily, the lithographic printing plate is obtained by conducting plate making according to a method of exposing the lithographic printing plate precursor through an original, for example, a lith film, and then removing the unnecessary portion of the image-recording layer by dissolving with an alkaline developer or an organic solvent thereby revealing the hydrophilic surface of support to form the non-image area while leaving the image-recording layer for forming the image area.

Thus, in the hitherto known plate making process of lithographic printing plate precursor, after exposure, the step of removing the unnecessary portion of the image-recording layer by dissolving, for example, with a developer is required. However, in view of the environment and safety, a processing with a developer closer to a neutral range and a small amount of waste liquid are objectives to be achieved. Particularly, since disposal of waste liquid discharged accompanying the wet treatment has become a great concern throughout the field of industry in view of the consideration for global environment in recent years, the demand for the solution of the above-described problems has been increased more and more.

On the other hand, digitalized technique of electronically processing, accumulating and outputting image information using a computer has been popularized in recent years, and various new image outputting systems responding to the digitalized technique have been put into practical use. Correspondingly, attention has been drawn to a computer-to-plate (CTP) technique of carrying digitalized image information on highly converging radiation, for example, laser light and conducting scanning exposure of a lithographic printing plate precursor with the light thereby directly preparing a lithographic printing plate without using a lith film. Thus, it is one of important technical subjects to obtain a lithographic printing plate precursor adaptable to the technique described above.

As described above, the decrease in alkali concentration of developer and the simplification of processing step have been further strongly required from both aspects of the consideration for global environment and the adaptation for space saving and low running cost. However, since the development processing ordinarily comprises three steps of developing with an aqueous alkali solution having pH of 10 or more, washing of the alkali agent with a water-washing bath and then treating with a gum solution mainly comprising a hydrophilic resin as described above, an automatic developing machine per se requires a large space and problems of the environment and running cost, for example, disposal of the development waste liquid, water-washing waste liquid and gum waste liquid still remain.

In response, for instance, a developing method using an alkali solution having pH of 10 to 12.5 and containing a nonionic surfactant is proposed in JP-A 2002-91016 (the term "JP-A" as used herein means an "unexamined published Japanese patent application") (corresponding to US2002/0092436A1). However, since the photosensitive layer containing an alkali-soluble polymer is used, there is a problem in that the development can not be performed with a solution having pH lower than the above-described range. Also, a lithographic printing plate precursor comprising a hydrophilic support having provided thereon an image-forming layer containing hydrophobic thermoplastic polymer particles dispersed in a hydrophilic binder is described in Japanese Patent 2,938,397 (corresponding to EP0770494A2). The lithographic printing plate precursor can be exposed imagewise using an infrared laser to agglomerate the hydrophobic thermoplastic polymer particles by heat thereby forming an image, and mounted on a cylinder of a printing machine to carry out on-machine development by supplying dampening water and/or ink.

Although the method of forming image by the agglomeration of fine particles only upon thermal fusion shows good on-machine development property, it has a problem in that the image strength (adhesion property to a support) is extremely weak and printing durability is insufficient.

As described above, the system including development with an alkali agent has a problem of supplying a replenisher for compensating the decrease of pH due to absorption of carbon dioxide and an apparatus therefor and of increase in the amount of waste liquid involved and a problem of the running cost of developer as well as the problem of environment.

Also, according to the development in an acidic to neutral range, ordinarily, it is difficult to ensure developing property and the components of the photosensitive layer removed once in the non-image area are difficult to be stably dispersed in the developer. As a result, the components of the photosensitive layer are precipitated in a developing bath and when running processing is carried out, a problem may occur in that the precipitates adhere as development scum on the lithographic printing plate precursor during the processing to be apt to cause image defect.

SUMMARY OF THE INVENTION

Therefore, an object of the present invention is to provide a processing method of a lithographic printing plate precursor which overcomes the problems of prior art described above. More specifically, an object of the present invention is to provide a processing method of a lithographic printing plate precursor which exhibits an excellent developing property in a development processing with an aqueous solution having pH of 2 to 10 and prevents adsorption of an image-recording layer component (particularly, a binder) removed by development and present in a processing solution to a substrate and generation of printing stain.

As a result of the intensive investigations, the inventors have found that the above-described object can be achieved by conducting development processing of a lithographic printing plate precursor comprising a support on a surface of which a hydrophilizing treatment and/or an undercoat layer has been provided and an image-recording layer after image exposure, with an aqueous solution having pH of 2 to 10 and containing an amphoteric surfactant and a specific anionic surfactant to complete the present invention.

Specifically, the present invention includes the following items.

(1) A processing method of a lithographic printing plate precursor comprising exposing imagewise a lithographic printing plate precursor comprising a support on a surface of which a hydrophilizing treatment and/or an undercoat layer has been provided and an image-recording layer to cure an exposed area of the image-recording layer and then undergoing developing processing with an aqueous solution having pH of 2 to 10, wherein the aqueous solution for use in the development processing contains an amphoteric surfactant and an anionic surfactant selected from an anionic surfactant having an aliphatic chain and a total number of carbon atoms included in the aliphatic chain of 6 or more and an anionic surfactant having an aromatic ring and a total number of carbon atoms of 12 or more and a content of the anionic surfactant is from 0.1 to 3.3% by weight of the aqueous solution.

(2) The processing method of a lithographic printing plate precursor as described in (1) above, wherein the undercoat layer contains an acid group or a salt of an acid.

(3) The processing method of a lithographic printing plate precursor as described in (2) above, wherein the acid group is a sulfonic acid group.

(4) The processing method of a lithographic printing plate precursor as described in any one of (1) to (3) above, wherein the image-recording layer contains a binder polymer and the binder polymer contains an onium group.

(5) The processing method of a lithographic printing plate precursor as described in (4) above, wherein the binder polymer contains an ammonium group in its side chain.

(6) The processing method of a lithographic printing plate precursor as described in any one of (1) to (5) above, wherein an oil-desensitizing treatment is carried out simultaneously with the development processing.

(7) A processing solution for development of a lithographic printing plate precursor comprising an aqueous solution having pH of 2 to 10 and containing an amphoteric surfactant and an anionic surfactant selected from an anionic surfactant having an aliphatic chain and a total number of carbon atoms included in the aliphatic chain of 6 or more and an anionic surfactant having an aromatic ring and a total number of carbon atoms of 12 or more, wherein a content of the anionic surfactant is from 0.1 to 3.3% by weight of the aqueous solution.

According to the present invention, a processing method of a lithographic printing plate precursor which exhibits an excellent developing property in a development processing with an aqueous solution having pH of 2 to 10 and prevents adsorption of an image-recording layer component (particularly, a binder) removed by development and present in a processing solution to a substrate and generation of printing stain can be provided.

Specifically, in the processing method according to the invention, the development of image-recording layer progresses not as layer removal but in the form of dispersion development close to dissolution development and the image-recording layer is finely dispersed in the developer during the development. According to the invention, the component of image-recording layer (particularly, a binder) thus-dispersed interacts with the surface of substrate to prevent from adsorption to the surface of substrate (non-image area). Therefore, the stain at the printing is prevented.

DESCRIPTION OF REFERENCE NUMERALS AND SIGNS

Figure 1:
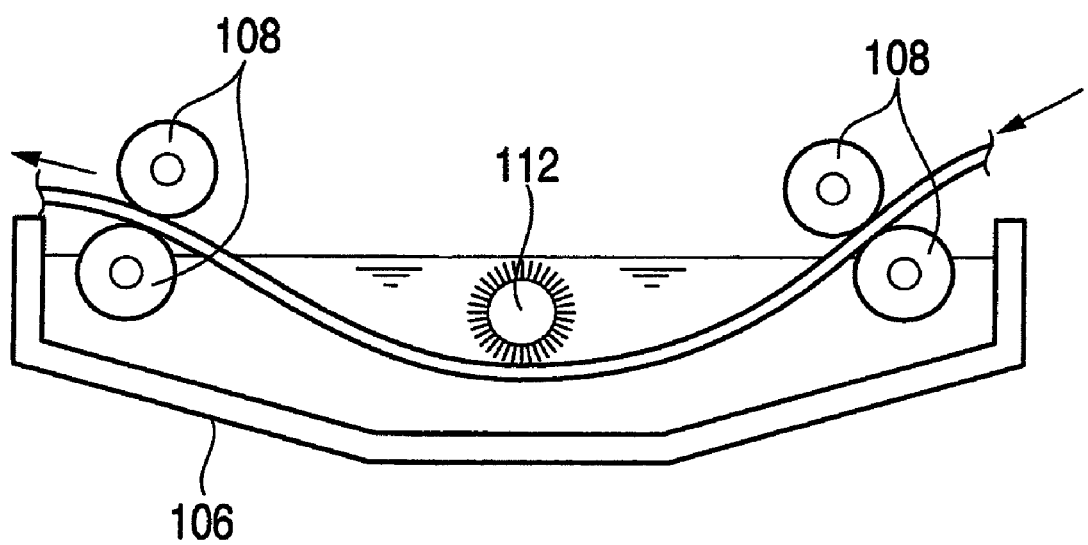
FIG. 1 is an illustration for schematically showing a development processor for use in the processing method of a lithographic printing plate precursor according to the invention.

1: Transport roller pair
2: Transport roller pair
3: Rotating brush roller
4: Transport roller pair
5: Transport roller pair
6: Rotating brush roller
7: Rotating brush roller
8: Transport roller pair
9: Transport roller pair
10: Backing roller
11: Transport roller pair
12: Transport roller pair
13: Transport roller pair
106: Developing tank
108: Transport roller
112: Rotating brush

DETAILED DESCRIPTION OF THE INVENTION

First, the lithographic printing plate precursor for use in the processing method according to the invention is described below. The lithographic printing plate precursor used in the invention has an image-recording layer on a support on a surface of which a hydrophilizing treatment and/or an undercoat layer has been provided.

[Image-Recording Layer]

The image-recording layer of the lithographic printing plate precursor according to the invention contains a binder polymer, a polymerizable compound and a polymerization initiator and preferably further contains a sensitizing dye.

The components constituting the image-recording layer will be described in detail below.

<Binder Polymer>

The binder polymer for use in the image-recording layer according to the invention is preferably a binder polymer having a hydrophilic group in view of developing property.

The hydrophilic group is selected from a monovalent and divalent hydrophilic groups and preferably includes, for instance, a hydroxy group, a carboxylate group, a hydroxyethyl group, an ethyleneoxy group, a hydroxypropyl group, an amino group, an aminoethyl group, an aminopropyl group, an ammonium group, an amido group, a carboxymethyl group, an ether group, and a salt formed by neutralization of an acid group, for example, a carboxylic acid group, a sulfonic acid group or a phosphoric acid group. An amino group, an ammonium group, an amido group, a —CH$_2$CH$_2$O— repeating unit or a —CH$_2$CH$_2$NH— repeating unit is particularly preferable and an amino group or an ammonium group is most preferable.

The content of the polymerization component having a hydrophilic group is preferably from 1 to 70% by mole based on in the total polymerization component of the binder polymer in view of developing property. In consideration of the compatibility between developing property and printing durability, the content is more preferably from 1 to 50% by mole, particularly preferably from 1 to 30% by mole.

It is preferred that the binder polymer for use in the invention does not substantially contain a carboxylic acid group or a phosphoric acid group in view of developing property and stain resistance.

Further, an acid value (acid content per g of polymer, indicated by the chemical equivalent number) of the binder polymer is preferably 0.3 meq/g or less, more preferably 0.1 meq/g or less.

The binder polymer for use in the invention is preferably insoluble in water and an aqueous solution having a pH of 10 or more. The solubility (binder polymer concentration at the saturation dissolution) of the binder polymer in water or an aqueous solution having a pH of 10 or more is preferably 1.0% by weight or less. The temperature for measuring the above-described solubility is ordinary temperature at the development and it is 25° C. herein.

The skeleton of the binder polymer for use in the invention is preferably a polymer compound selected from an acrylic resin, a vinyl acetal resin, a urethane resin, an amide resin, an epoxy resin, a methacrylic resin, a styrene resin and an ester resin. Among them, a vinyl copolymer, for example, an acrylic resin, a methacrylic resin or a styrene resin and a urethane resin are particularly preferable.

It is preferred that the binder polymer for use in the invention has a crosslinkable group. The term "crosslinkable group" as used herein means a group having a function capable of crosslinking the binder polymer in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bonding group, an amino group or an epoxy group as a functional group capable of conducting an addition polymerization reaction. Also, a functional group capable of forming a radical upon irradiation with light may be used and such a crosslinkable group includes, for example, a thiol group and a halogen atom. Among them, the ethylenically unsaturated bonding group is preferable.

In the binder polymer having a crosslinkable group, for example, a free radical (a polymerization initiating radical or a propagating radical in the process of polymerization of the polymerizable compound) is added to the crosslinkable functional group to cause an addition-polymerization between polymers directly or through a polymerization chain of the polymerizable compound, as a result, crosslinking is formed between polymer molecules to effect curing. Alternatively, an atom (for example, a hydrogen atom on the carbon atom adjacent to the functional crosslinkable group) in the polymer is withdrawn by a free radical to produce a polymer radical and the polymer radicals combine with each other to form crosslinking between polymer molecules to effect curing.

The content of the crosslinkable group (content of radical-polymerizable unsaturated double bond determined by iodine titration) in the binder polymer is preferably from 0.1 to 10.0 mmol, more preferably from 1.0 to 7.0 mmol, most preferably from 2.0 to 5.5 mmol, per g of the binder polymer.

From the standpoint of further improvement in the printing durability, it is preferred that the crosslinkable group is present near the hydrophilic group and both the hydrophilic group and the crosslinkable group may be present in the same polymerization unit.

It is preferred that the binder polymer for use in the invention has a unit of alkyl(meth)acrylate or aralkyl(meth)acrylate besides the unit having a hydrophilic group, the unit having a crosslinkable group or the unit having a hydrophilic group and a crosslinkable group. The alkyl group in the alkyl (meth)acrylate is preferably an alkyl group having from 1 to 5 carbon atoms and more preferably a methyl group. The aralkyl(meth)acrylate includes, for example, benzyl(meth) acrylate.

The binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymer may be any of a random polymer, a block polymer, a graft polymer and the like.

In the image-recording layer according to the invention, a binder polymer having an amino group and/or ammonium group as the hydrophilic group (hereinafter, also appropriately referred to as a "specific binder polymer") is preferably used as described above. The specific binder polymer will be described in detail below.

The specific binder polymer may be an appropriate compound as long as it is a polymer having an amino group and/or ammonium group in the main chain and/or side chain thereof. Preferably, it is a polymer having an amino group and/or ammonium group in the side chain thereof. As the amino group and ammonium group, respective structures represented by formulae <1> and <2> described below are preferable. The binder polymer containing the structure represented by formula <1> or <2> described below in the side chain thereof may be an appropriate compound as long as it is a polymer compound containing at least one group including the structure represented by formula <1> or <2> in a repeating unit.

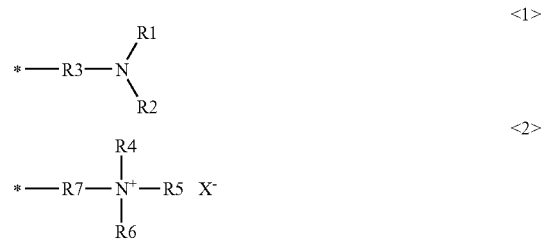

In formulae <1> and <2>, R1, R2 and R6 each independently represents a monovalent organic group. The monovalent organic group is a substituent comprising at least one atom selected from hydrogen, carbon, oxygen, nitrogen, sulfer, phosphorus, halogen and silicon. Specifically, it includs substituents formed from —H, —F, —Cl, Br, —I, >C<, =C<, ≡C—, —O—, O=, —N<, —N=, ≡N, —S—, S=, >S<, =S=, —P<, =P<, >Si<, =Si<, ≡Si— and combinations thereof. More specifically, a hydrogen atom, an alkyl group, an aryl group, an alkenyl group, an alkynyl group, a halogen atom, an alkoxy group and an acyl group are preferably exemplified. R3 and R7 each represents a single bond or a divalent organic group. The divalent organic group is a connecting group comprising at least one atom selected from hydrogen, carbon, oxygen, nitrogen, sulfur, phosphorus, halogen and silicon. Specifically, it includes connecting groups formed from —H, —F, —Cl, —Br, —I, >C<, =C<, =C—, —O—, O=, —N<, —N=, ≡N, —S—, S=, >S<, =S=, —P<, =P<, >Si<, =Si<, ≡Si— and combinations thereof. More specifically, an alkylene group, an arylene group, a connecting group containing a hetero atom, for example, an ester bond, an amido bond or an ether bond, and combinations thereof are preferably exemplified. Alternatively, appropriate two of R1 to R3 or appropriate two of R4 to R7 may be combined with each other to form a ring, or appropriate one of R1 to R3 or appropriate one of R4 to R7 may form a double bond between the nitrogen atom, in this case R1 or R2 in formula <1> or one of R4 to R6 in formula <2> is not present. In formula <2>, X⁻ represents an anion. In formulae <1> and <2>, * represents a position connecting to the polymer.

From the standpoint of developing property in a developer having pH of 2.0 to 10.0, it is preferred that R1 and R2 in formula <1> each independently represents a hydrogen atom, an alkyl group or an aryl group. The total number of carbon atoms included in R1 and R2 is preferably from 0 to 24, more preferably from 0 to 12. When the total number of carbon atoms included in R1 and R2 is 0, both R1 and R2 represent hydrogen atoms.

Also, from the standpoint of the developing property in a developer having pH of 2.0 to 10.0, it is preferred that R4, R5 and R6 in formula <2> each independently represents a hydrogen atom, an alkyl group or an aryl group. The total number of carbon atoms included in R4, R5 and R6 is preferably from 0 to 36, more preferably from 0 to 18. When the total number of carbon atoms included in R4, R5 and R6 is 0, R4, R5 and R6 all represent hydrogen atoms.

Specific examples of the anion represented by X⁻ include a halogen anion, a halogen oxoacid anion (for example, $ClO_4^-$, $IO_3^-$ or $BrO_3^-$), a halogeno complex anion (for example, $BF_4^-$, $PF_6^-$ or $AlCl_4^-$), a sulfate anion, a nitrate anion, a phosphate anion, a borate anion, a carboxylate anion, a sulfonate anion, a phosphonate anion and a metal complex anion (for example, $[Fe(CN)_6]^-$). Among them, from the standpoint of the developing property in a developer having pH of 2.0 to 10.0, a halogen anion, a halogeno complex anion, a borate anion, a carboxylate anion and a sulfonate anion are preferable, and a halogeno complex anion, a borate anion and a sulfonate anion are more preferable.

In order to introduce the amino group or ammonium group into a polymer, an appropriate method may be used. For instance, a method wherein a quaternary ammonium group-containing monomer as shown in Group A below is copolymerized with other polymerizable compound, a method wherein a tertiary amine-containing monomer as shown in Group B below is copolymerized with other polymerizable compound and then the amino group in the copolymer is converted to tertiary ammonium salt by neutralization with an acid or the amino group in the copolymer is converted to quaternary ammonium salt with an alkylating agent, a method wherein a quaternary ammonium group-containing diol as shown in Group C below is copolymerized with an isocyanate, carboxylic acid or carboxylic acid derivative, and a method wherein a tertiary amine-containing diol as shown in Group D below is copolymerized with an isocyanate, carboxylic acid or carboxylic acid derivative and then the amino group in the copolymer is converted to tertiary ammonium salt by neutralization with an acid or the amino group in the copolymer is converted to quaternary ammonium salt with an alkylating agent are exemplified.

Group A:

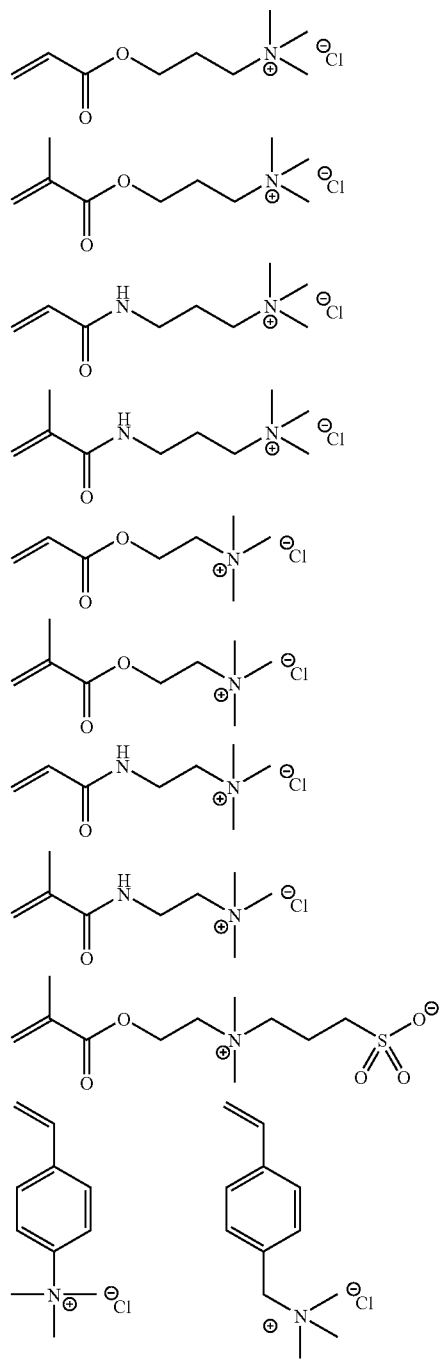

Group B:
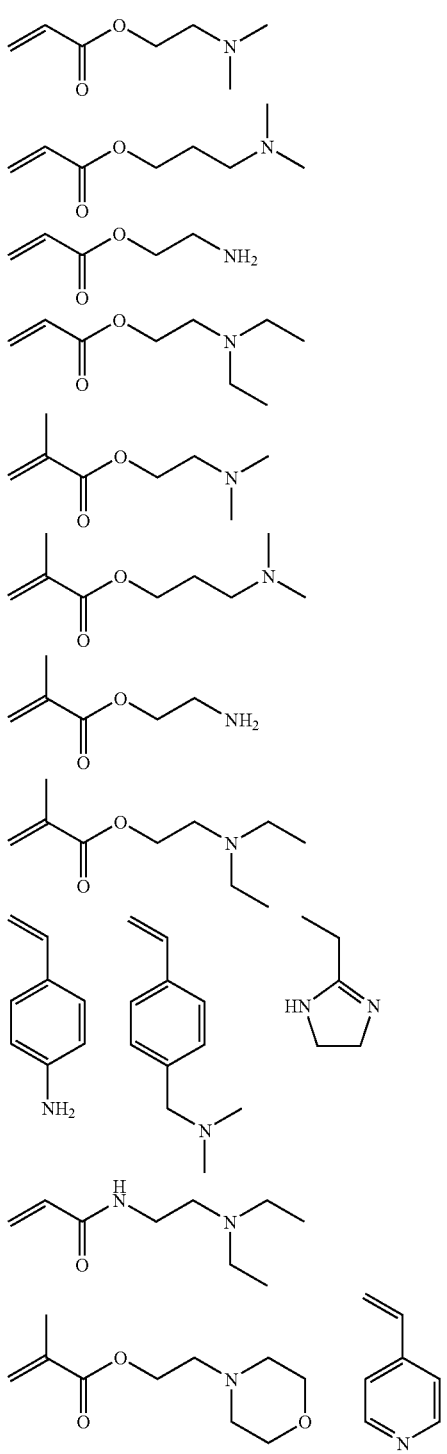
Group C:
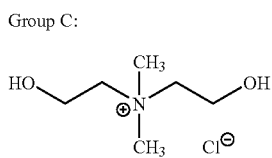
-continued
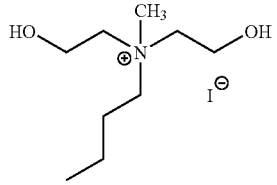
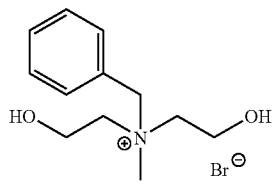
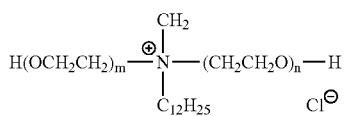
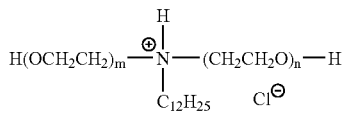
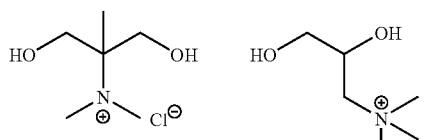
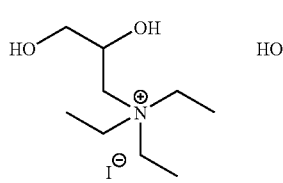
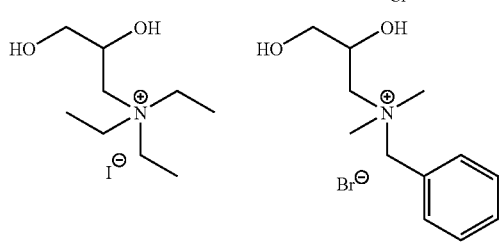
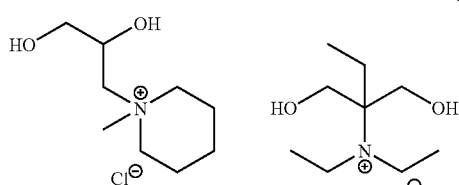
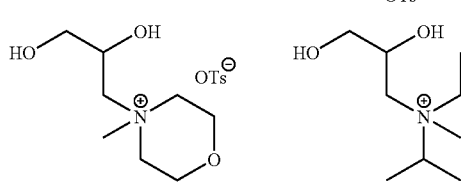
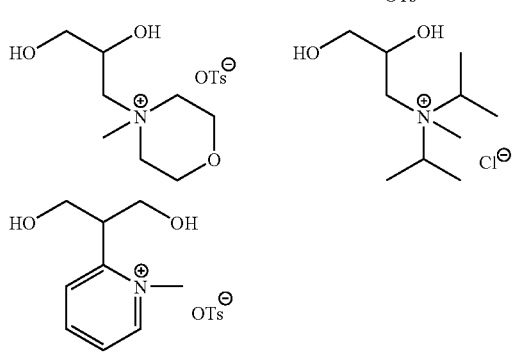

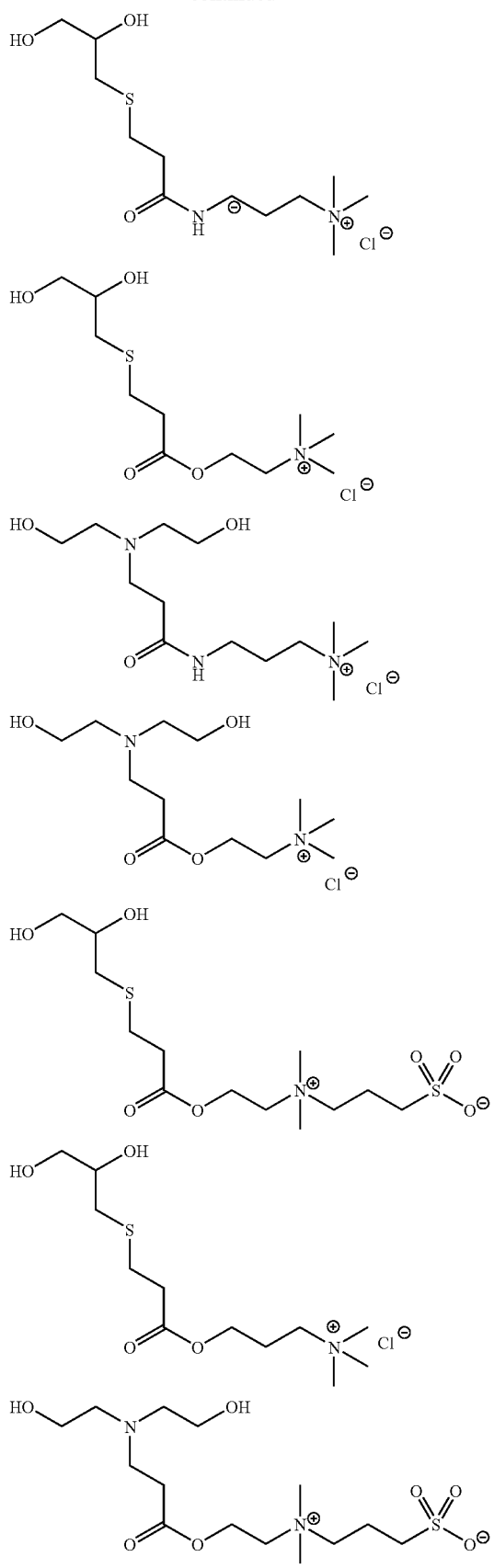

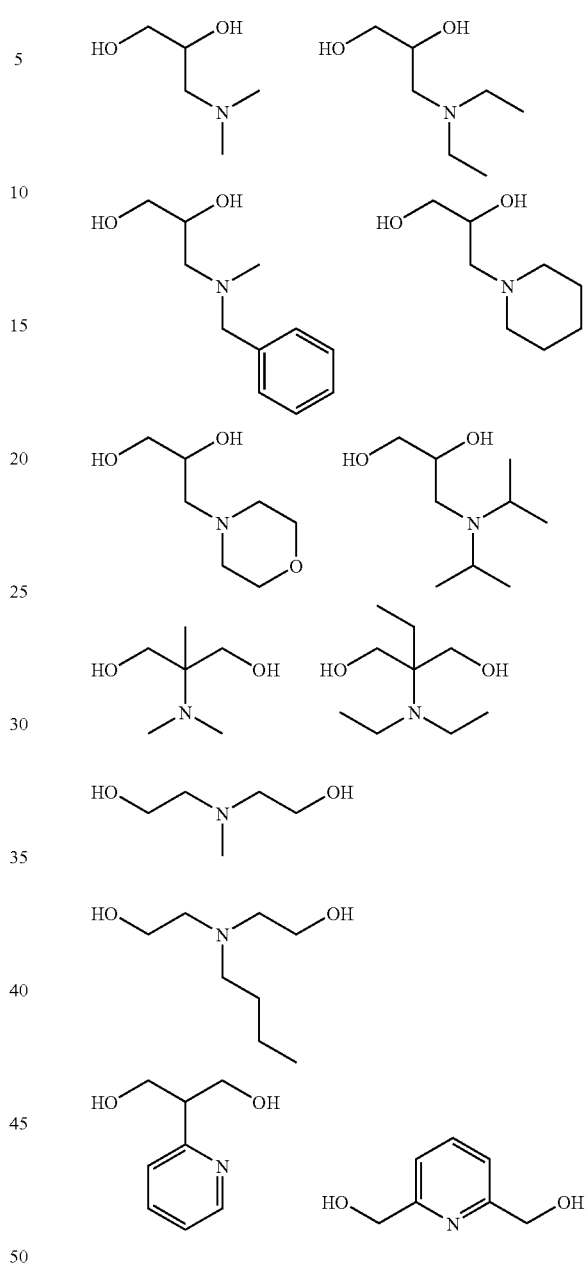

Specific examples of the specific binder polymer including the structure represented by any one of formulae <1> and <2> in its repeating unit are set forth below, but the invention should not be construed as being limited thereto.

With respect to Polymers PA-1 to PA-68 shown below, the composition ratio (% by mole) and weight average molecular weight (Mw) of each polymer are described together with the structure of the polymer.

With respect to Polymers PB-1 to PB-50b shown below, the numeral attached to the compound means a reaction ratio (% by mole) of each constituting component. Also, "PPG" means polypropylene glycol and the subsequent numeral means an average molecular weight. For example, "PPG1000" means polypropylene glycol having an average molecular weight of 1,000.

| | | Composition Ratio | Molecular Weight |
|---|---|---|---|
| PA-1 | structure: methyl methacrylate / 2-(dimethylamino)ethyl methacrylate | 90/10 | 70000 |
| PA-2 | structure: methyl methacrylate / 2-(methylammonium)ethyl methacrylate chloride | 90/10 | 70000 |
| PA-3 | structure: cyclohexyl methacrylate / 2-(dicyclohexylamino)ethyl methacrylate | 80/20 | 60000 |
| PA-4 | structure: cyclohexyl methacrylate / 2-(dicyclohexylammonium)ethyl methacrylate chloride | 80/20 | 60000 |
| PA-5 | structure: methyl methacrylate / ... | 90/5/5 | 60000 |

|  | Composition Ratio | Molecular Weight |
|---|---|---|
| PA-6 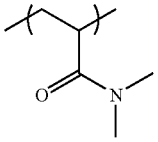 | 90/5/5 | 60000 |
| PA-7 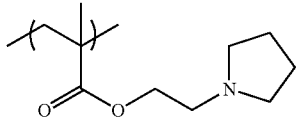 | 95/5 | 70000 |
| PA-8 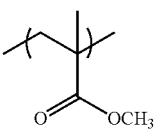 | 95/5 | 70000 |
| PA-9 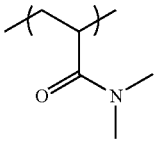 | 90/10 | 70000 |

-continued

| | Composition Ratio | Molecular Weight |
|---|---|---|
| PA-10 | 90/10 | 52000 |
| PA-11 | 90/10 | 58000 |
| PA-12 | 90/10 | 49000 |
| PA-13 | 90/10 | 50000 |
| PA-14 | 90/10 | 63000 |

-continued
|  |  | Composition Ratio | Molecular Weight |
|---|---|---|---|
| PA-15 | 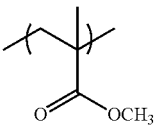 | 90/10 | 80000 |
| PA-16 | 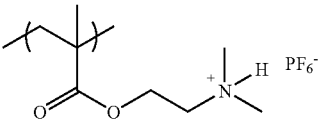 | 90/10 | 65000 |
| PA-17 | 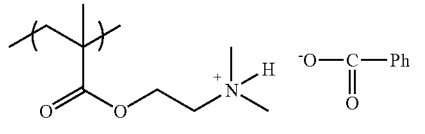 | 90/10 | 60000 |
| PA-18 | 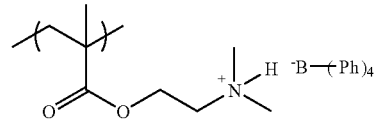 | 80/20 | 65000 |
| PA-19 | 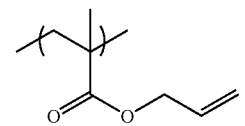 | 90/10 | 90000 |
| PA-20 | 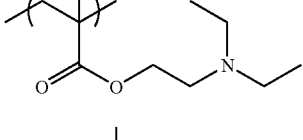 | 80/20 | 64000 |

|  | Composition Ratio | Molecular Weight |
|---|---|---|
| PA-21 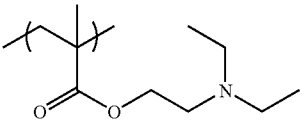 | 70/30 | 77000 |
| PA-22 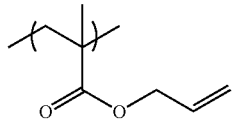 | 60/35/5 | 80000 |
| PA-23 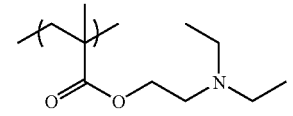 | 60/35/5 | 72000 |
| PA-24 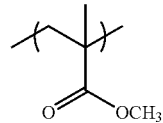 | 80/10/10 | 90000 |

-continued
| | | Composition Ratio | Molecular Weight |
|---|---|---|---|
| PA-25 | 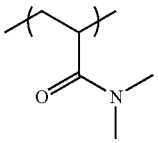 | 60/20/20 | 53000 |
| PA-26 | 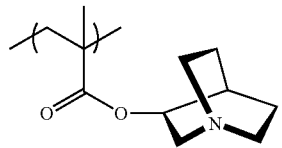 | 80/20 | 57000 |
| PA-27 | 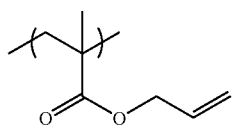 | 70/30 | 48000 |
| PA-28 | 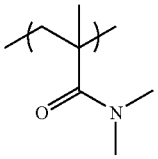 | 60/40 | 81000 |

|  | Composition Ratio | Molecular Weight |
|---|---|---|
| PA-29 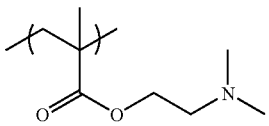 | 50/50 | 70000 |
| PA-30  | 50/50 | 72000 |
| PA-31 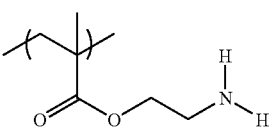 | 50/50 | 72000 |
| PA-32 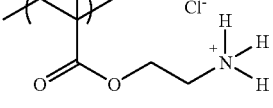 | 50/50 | 65000 |
| PA-33 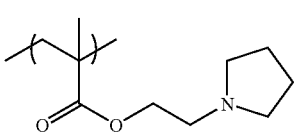 | 50/50 | 65000 |

-continued

| | | Composition Ratio | Molecular Weight |
|---|---|---|---|
| PA-34 | (styrene / dimethylaminoethyl methacrylate) | 60/40 | 50000 |
| PA-35 | (styrene / dimethylaminoethyl methacrylate·HBr) | 70/30 | 62000 |
| PA-36 | (glycidyl methacrylate / diphenylaminoethyl methacrylate) | 30/70 | 71000 |
| PA-37 | (glycidyl methacrylate / diphenylaminoethyl methacrylate·HCl) | 30/70 | 71000 |
| PA-38 | (methyl methacrylate / ...) | 60/40 | 65000 |

-continued

| | Composition Ratio | Molecular Weight |
|---|---|---|
| PA-39 | 70/30 | 70000 |
| PA-40 | 70/30 | 58000 |
| PA-41 | 65/35 | 60000 |
| PA-42 | 60/40 | 57000 |
| PA-43 | 60/40 | 65000 |

-continued

|  | Composition Ratio | Molecular Weight |
|---|---|---|
| PA-44 | 50/25/25 | 49000 |
| PA-45 | 50/50 | 71000 |
| PA-46 | 60/40 | 65000 |
| PA-47 | 70/30 | 69000 |

-continued
| | | Composition Ratio | Molecular Weight |
|---|---|---|---|
| PA-48 | 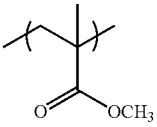 PF$_6^-$ | 70/30 | 60000 |
| PA-49 | 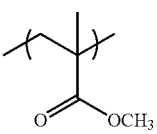 OTs$^-$ | 70/30 | 55000 |
| PA-50 | 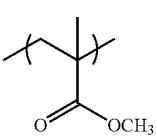 BF$_4^-$ | 70/30 | 50000 |
| PA-51 | 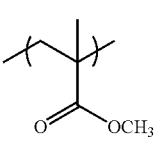 $^-$OSO$_3$CH$_3$ | 70/30 | 63000 |

-continued
|  | Composition Ratio | Molecular Weight |
|---|---|---|
| PA-52 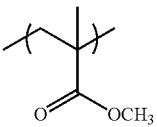 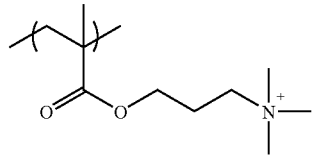 ⁻BPh₄ | 70/30 | 58000 |
| PA-53 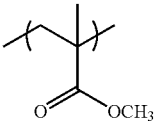 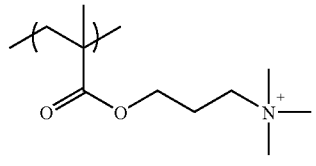 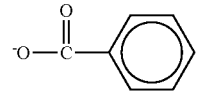 | 70/30 | 60000 |
| PA-54 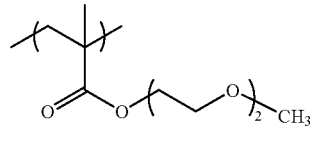 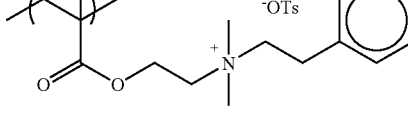 ⁻OTs | 60/40 | 58000 |
| PA-55 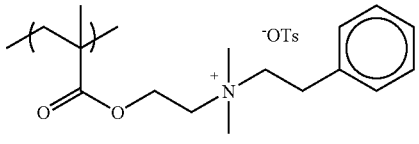 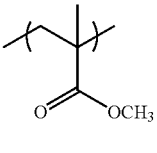 Cl⁻ 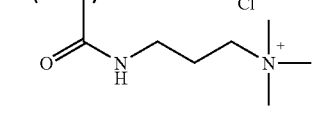 | 70/15/15 | 60000 |

-continued
| | | Composition Ratio | Molecular Weight |
|---|---|---|---|
| PA-56 | 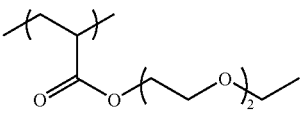 | 50/50 | 55000 |
| PA-57 | 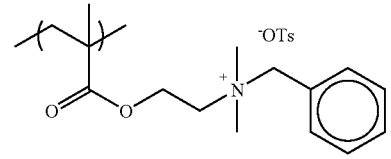 | 45/55 | 60000 |
| PA-58 | 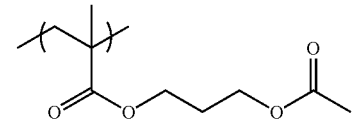 | 80/20 | 70000 |
| PA-59 | 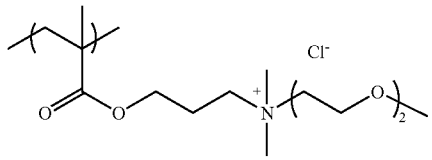 | 50/50 | 60000 |
| PA-60 | 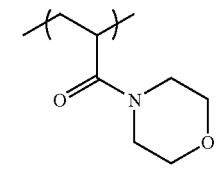 | 60/40 | 69000 |

-continued
|  | Composition Ratio | Molecular Weight |
|---|---|---|
| PA-61 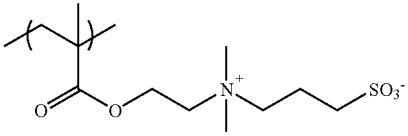 | 40/60 | 80000 |
| PA-62 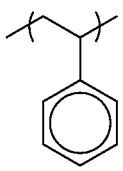 | 40/60 | 73000 |
| PA-63 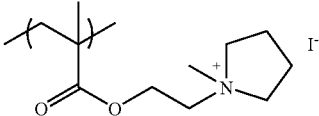 | 80/20 | 50000 |
| PA-64 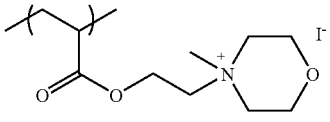 | 50/50 | 40000 |

|  | Composition Ratio | Molecular Weight |
|---|---|---|
| PA-65 | 70/30 | 50000 |
| PA-66 | 80/20 | 44000 |
| PA-67 | 50/50 | 55000 |
| PA-68 | 30/70 | 58000 |
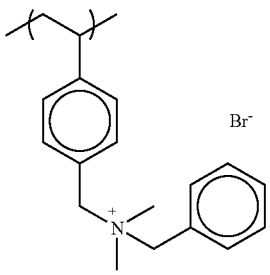
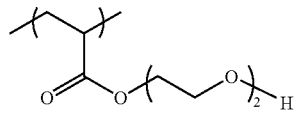
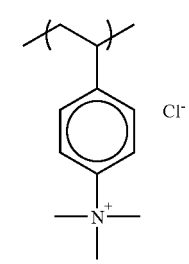
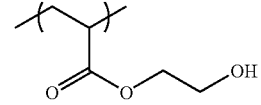
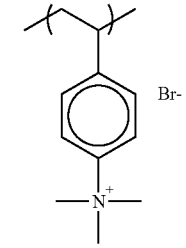
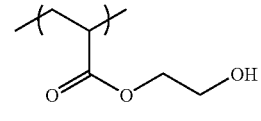
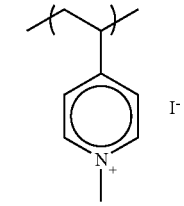
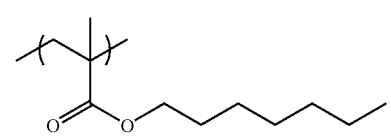

| | Composition Ratio | Molecular Weight |
|---|---|---|
| 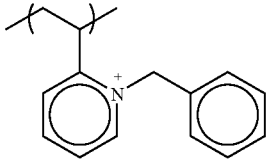 | | |
In the following tables, "(X)" means "Structure of Diisocyanate/Dicarboxylic Acid", and "(Y)" means "Structure of Diol/Diamine".

| | (X) | | (Y) | | Mw |
|---|---|---|---|---|---|
| PB-1 | 4,4'-methylenebis(phenyl isocyanate) | 50 | [2-hydroxy-3-hydroxypropyl-trimethylammonium chloride] | 50 | 60000 |
| PB-2 | 4,4'-methylenebis(phenyl isocyanate) | 50 | PPG1000 | 20 | 45000 |
| | | | [2-hydroxy-3-hydroxypropyl-trimethylammonium chloride] | 30 | |
| PB-3 | 2,4-toluene diisocyanate | 50 | PPG1000 | 20 | 55000 |
| | | | [2-hydroxy-3-hydroxypropyl-trimethylammonium chloride] | 30 | |
| PB-4 | m-xylylene diisocyanate | 50 | PPG1000 | 20 | 50000 |
| | | | [2-hydroxy-3-hydroxypropyl-trimethylammonium chloride] | 30 | |
| PB-5 | 1,4-phenylene diisocyanate | 50 | PPG1000 | 20 | 52000 |
| | | | [2-hydroxy-3-hydroxypropyl-trimethylammonium chloride] | 30 | |

-continued

| | (X) | | (Y) | Mw |
|---|---|---|---|---|
| PB-6 | [meta-bis(2-isocyanatopropan-2-yl)benzene structure] 50 | PPG1000 20 | [N,N-dimethyl-N-(2,3-dihydroxypropyl)-methylammonium chloride] 30 | 70000 |
| PB-7 | OCN–(CH₂)₆–NCO 50 | PPG1000 20 | [N,N-dimethyl-N-(2,3-dihydroxypropyl)-methylammonium chloride] 30 | 78000 |
| PB-8 | [isophorone diisocyanate structure] 50 | PPG1000 20 | [N,N-dimethyl-N-(2,3-dihydroxypropyl)-methylammonium chloride] 30 | 53000 |
| PB-9 | [4,4'-methylenebis(phenyl isocyanate) structure] 50 | PPG1000 25 | [N,N,N-triethyl-N-(2,3-dihydroxypropyl)ammonium iodide] 25 | 55000 |

| | (X) | | (Y) | Mw |
|---|---|---|---|---|
| PB-10 | 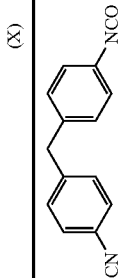 50 | PPG1000 | 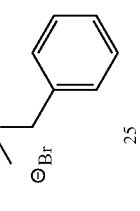 25 | 56000 |
| PB-11 | 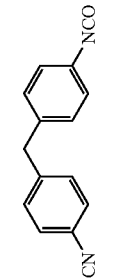 50 | PPG1000 25 | 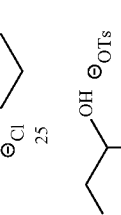 25 | 60000 |
| PB-12 |  50 | PPG1000 25 | 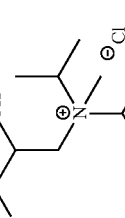 25 | 48000 |
| PB-13 | 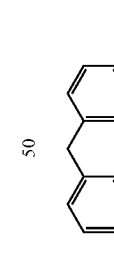 50 | PPG1000 10 | 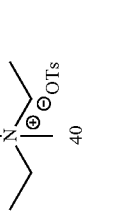 40 | 55000 |
| PB-14 |  50 | PPG1000 10 |  40 | 63000 |

| | (X) | | (Y) | Mw |
|---|---|---|---|---|
| PB-15 | [4,4'-methylenebis(phenyl isocyanate)] 50 | PPG1000 10 | [pyridinium diol, OTs⁻, N-methyl] 40 | 50000 |
| PB-16 | [4,4'-methylenebis(phenyl isocyanate)] 50 | PPG1000 20 | [trimethylammonium amide diol, Cl⁻] 30 | 52000 |
| PB-17 | [4,4'-methylenebis(phenyl isocyanate)] 50 | PPG1000 20 | [trimethylammonium ester diol, Cl⁻] 30 | 51000 |
| PB-18 | [4,4'-methylenebis(phenyl isocyanate)] 50 | PPG1000 20 | [sulfobetaine ester diol] 30 | 49000 |

-continued

| | (X) | | (Y) | Mw |
|---|---|---|---|---|
| PB-19 | [MDI-type diisocyanate] 50 | PPG1000 20 | [HOCH₂CH₂-N(CH₂CH₂OH)-CH₂CH₂C(O)NH-CH₂CH₂CH₂-N⁺(CH₃)₃ Cl⁻] 30 | 53000 |
| PB-20 | [MDI-type diisocyanate] 50 | PPG1000 20 | [HOCH₂CH₂-N(CH₂CH₂OH)-CH₂CH₂C(O)O-CH₂CH₂-N⁺(CH₃)₃ Cl⁻] 30 | 55000 |
| PB-21 | [MDI-type diisocyanate] 50 | PPG1000 20 | [HOCH₂-CH(OH)-CH₂-N⁺H(CH₃)₂ Cl⁻] 30 | 67000 |
| PB-21b | [MDI-type diisocyanate] 50 | PPG1000 20 | [HOCH₂-CH(OH)-CH₂-N(CH₃)₂] 30 | 67000 |
| PB-22 | [MDI-type diisocyanate] 50 | PPG1000 20 | [HOCH₂-CH(OH)-CH₂-N⁺H(CH₂CH₃)₂ Cl⁻] 30 | 79000 |

-continued
| | (X) | | (Y) | | Mw |
|---|---|---|---|---|---|
| PB-22b | 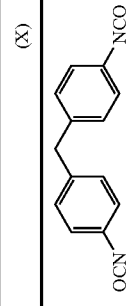 50 | PPG1000 20 |  30 | | 79000 |
| PB-23 | 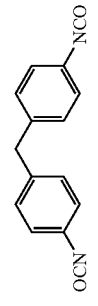 50 | PPG1000 20 | 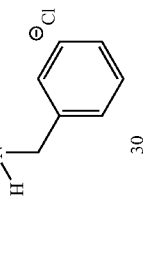 30 | | 77000 |
| PB-23b |  50 | PPG1000 20 | 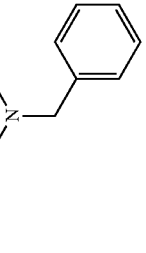 30 | | 77000 |
| PB24 | 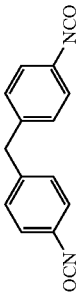 50 | PPG1000 20 | 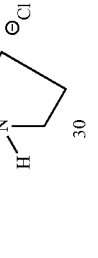 30 | | 76000 |

-continued

| | (X) | | (Y) | Mw |
|---|---|---|---|---|
| PB-24b | [4,4'-methylenebis(phenyl isocyanate)] 50 | PPG1000 20 | [1-(2,3-dihydroxypropyl)pyrrolidine] 30 | 76000 |
| PB-25 | [4,4'-methylenebis(phenyl isocyanate)] 50 | 20 | [morpholinium with 2,3-dihydroxypropyl, Br⁻] 30 | 80000 |
| PB-25b | [4,4'-methylenebis(phenyl isocyanate)] 50 | PPG1000 20 | [4-(2,3-dihydroxypropyl)morpholine] 30 | 80000 |
| PB-26 | [4,4'-methylenebis(phenyl isocyanate)] 50 | 20 | [diisopropylammonium with 2,3-dihydroxypropyl, OTs⁻] 30 | 56000 |
| PB-26b | [4,4'-methylenebis(phenyl isocyanate)] 50 | PPG1000 20 | [N,N-diisopropyl-2,3-dihydroxypropylamine] 30 | 56000 |

-continued

| | (X) | | (Y) | Mw |
|---|---|---|---|---|
| PB-27 | [4,4'-methylenebis(phenyl isocyanate)] 50 | PPG1000 20 | [2-amino-2-methyl-1,3-propanediol based quaternary ammonium, N,N-dimethyl, Cl⁻] 30 | 90000 |
| PB-27b | [MDI] 50 | PPG1000 20 | [2-(dimethylamino)-2-methyl-1,3-propanediol] 30 | 90000 |
| PB-28 | [MDI] 50 | PPG1000 20 | [2-(pyridinium-2-yl)-1,3-propanediol, Cl⁻] 30 | 78000 |
| PB-28b | [MDI] 50 | PPG1000 20 | [2-(pyridin-2-yl)-1,3-propanediol] 30 | 78000 |
| PB-29 | [MDI] 30 / [HDI] 20 | PEG600 15 | [(2-hydroxy-3-(trimethylammonio)propanol), Cl⁻] 35 | 68000 |

-continued

| | (X) | | (Y) | Mw |
|---|---|---|---|---|
| PB-30 | OCN-C6H4-CH2-C6H4-NCO 40 / OCN-(CH2)6-NCO 10 | PPG1000 10 | 3-(dimethylammonio)-2-hydroxypropyl with Cl⁻, dihydroxy 25 | 59000 |
| PB-30b | OCN-C6H4-CH2-C6H4-NCO 40 / OCN-(CH2)6-NCO 10 | PPG1000 10 | 3-(dimethylamino)-2-hydroxypropyl, dihydroxy 25 | 59000 |
| PB-31 | OCN-C6H4-CH2-C6H4-NCO 30 / OCN-(CH2)6-NCO 20 | PPG1000 10 | 3-(dimethylammonio)-2-hydroxypropyl with Br⁻, dihydroxy 25 | 91000 |
| PB-31b | OCN-C6H4-CH2-C6H4-NCO 30 / OCN-(CH2)6-NCO 20 | PPG1000 10 | 3-(dimethylamino)-2-hydroxypropyl, dihydroxy 25 | 91000 |
| PB-32 | OCN-C6H4-CH2-C6H4-NCO 40 / OCN-(CH2)6-NCO 10 | PPG1000 10 | 3-(dimethylammonio)-2-hydroxypropyl with OTs⁻, dihydroxy 25 | 84000 |

All rows share (Y) additional component: glyceryl methacrylate (2,3-dihydroxypropyl methacrylate) 15.

-continued

| | (X) | | | (Y) | | Mw |
|---|---|---|---|---|---|---|
| PB-32b | 4,4'-methylenebis(phenyl isocyanate) 40 / hexamethylene diisocyanate 10 | PPG1000 10 | | 3-dimethylamino-1,2-propanediol 25 | glycerol monomethacrylate 15 | 84000 |
| PB-33 | 4,4'-methylenebis(phenyl isocyanate) 40 / hexamethylene diisocyanate 10 | PPG1000 10 | | 3-dimethylamino-1,2-propanediol · MsOH salt 25 | glycerol monomethacrylate 15 | 70000 |
| PB-33b | 4,4'-methylenebis(phenyl isocyanate) 40 / hexamethylene diisocyanate 10 | PPG1000 10 | | 3-dimethylamino-1,2-propanediol 25 | glycerol monomethacrylate 15 | 70000 |
| PB-34 | 4,4'-methylenebis(phenyl isocyanate) 40 / hexamethylene diisocyanate 10 | PPG1000 10 | | 3-dimethylamino-1,2-propanediol · methylsulfate salt 25 | glycerol monomethacrylate 15 | 68000 |
| PB-34b | 4,4'-methylenebis(phenyl isocyanate) 40 / hexamethylene diisocyanate 10 | PPG1000 10 | | 3-dimethylamino-1,2-propanediol 25 | glycerol monomethacrylate 15 | 68000 |

| | (X) | | (Y) | | Mw |
|---|---|---|---|---|---|
| PB-35 | 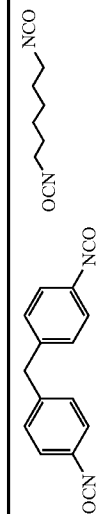 40 | PPG1000 10 |  25 | 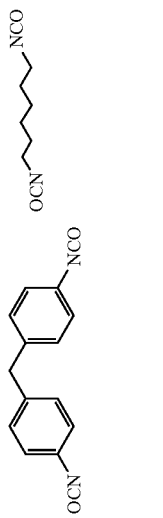 15 | 75000 |
| PB-35b | 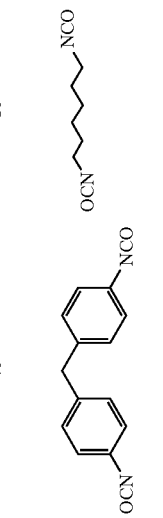 40 | 10 | 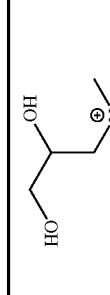 25 | 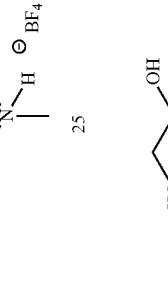 15 | 75000 |
| PB-36 | 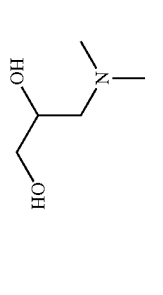 40 | PPG1000 10 | 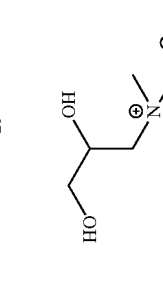 25 | 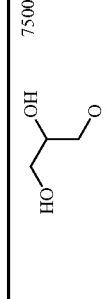 15 | 77000 |
| PB-36b | 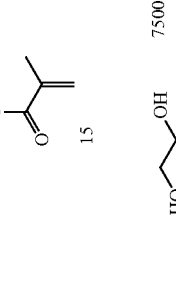 40 | 10 | 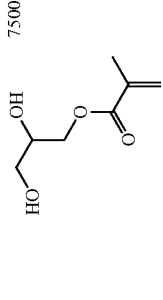 25 | 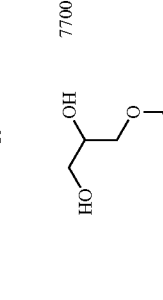 15 | 77000 |
| PB-37 |  40 | PPG1000 10 |  25 |  15 | 80000 |

-continued

| | (X) | | (Y) | | Mw |
|---|---|---|---|---|---|
| PB-37b | [4,4'-methylenebis(phenyl isocyanate)] 40 / [hexamethylene diisocyanate] 10 | PPG1000 10 | [dimethylaminopropanediol] 25 | [glycerol methacrylate] 15 | 80000 |
| PB-38 | [MDI] 40 / [HDI] 10 | PPG1000 10 | [sulfonate zwitterion with acrylamide] 25 | [glycerol methacrylate] 15 | 75000 |
| PB-38b | [MDI] 40 / [HDI] 10 | PPG1000 10 | [dimethylaminopropanediol] 25 | [glycerol methacrylate] 15 | 75000 |
| PB-39 | [MDI] 40 / [HDI] 10 | PPG1000 10 | [trimethylammonium ester, Cl⁻] 25 | [glycerol methacrylate] 15 | 66000 |
| PB-40 | [toluene diisocyanate] 30 / [TMHDI] 20 | PEG2000 5 | [dimethylammonium chloride diol] 25 | [glycerol methacrylate] 20 | 58000 |

-continued

| | (X) | | (Y) | | Mw |
|---|---|---|---|---|---|
| PB-40b | tolylene diisocyanate, 30 | PEG2000, 5 | dimethylaminopropanediol, 25 | glycerol methacrylate, 20 | 58000 |
| PB-41 | H12MDI, 25 | PPG700, 15 | dimethylammonium chloride propanediol, 25 | glycerol methacrylate, 10 | 70000 |
| PB-41b | H12MDI, 25 | PPG700, 15 | dimethylaminopropanediol, 25 | glycerol methacrylate, 10 | 70000 |
| PB-42 | MDI (methylene diphenyl diisocyanate), 30 | PEG(4), 15 | dimethylammonium chloride propanediol, 25 | glycerol methacrylate, 10 | 65000 |
| PB-42b | MDI, 30 | PEG(4), 15 | dimethylaminopropanediol, 25 | glycerol methacrylate, 10 | 65000 |

| | (X) | | (Y) | Mw |
|---|---|---|---|---|
| PB-43 | 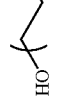 30 | 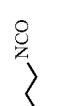 20 15 |  25 |  10 | 66000 |
| PB-43b | 〃 30 | 〃 20 15 |  25 | 〃 10 | 66000 |
| PB-44 | 〃 30 | 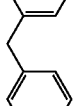 20 15 |  25 | 〃 10 | 70000 |
| PB-44b | 〃 30 | 〃 20 15 | 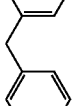 25 | 〃 10 | 70000 |
| PB-45 | 〃 30 |  20 15 |  25 | 〃 10 | 58000 |

-continued

| | (X) | | (Y) | | Mw |
|---|---|---|---|---|---|
| PB-45b | [MDI-type diisocyanate] 30 | [aliphatic diisocyanate + polycaprolactone diol] 20  15 | [dimethylaminopropanediol] 25 | [glyceryl methacrylate] 10 | 58000 |
| PB-46 | [MDI-type diisocyanate] 30 | [TMHDI + polycaprolactone diol] 20  15 | [quaternized dimethylammonium Cl] 25 | [glyceryl methacrylate] 10 | 60000 |
| PB-46b | [MDI-type diisocyanate] 30 | [TMHDI + polycaprolactone diol] 20  15 | [dimethylaminopropanediol] 25 | [glyceryl methacrylate] 10 | 60000 |
| PB-47 | [MDI-type diisocyanate] 50 | PPG1000  10 | [quaternized dimethylammonium Cl] 35 | [diaminobutane] 5 | 55000 |
| PB-47b | [MDI-type diisocyanate] 50 | PPG1000  10 | [dimethylaminopropanediol] 35 | [diaminobutane] 5 | 55000 |

-continued

| | (X) | | (Y) | | Mw |
|---|---|---|---|---|---|
| PB-48 | terephthalic acid, 50 | PEG200, 30 | 3-(dimethylammonio)-2-hydroxypropan-1-ol chloride (HOCH2-CH(OH)-CH2-N+H(CH3)2 Cl−), 20 | | 63000 |
| PB-48b | terephthalic acid, 50 | PEG200, 30 | 3-(dimethylamino)propane-1,2-diol, 20 | | 63000 |
| PB-49 | adipic acid, 50 | PEG200, 30 | 3-(dimethylammonio)-2-hydroxypropan-1-ol chloride, 20 | | 62000 |
| PB-49b | adipic acid, 50 | PEG200, 30 | 3-(dimethylamino)propane-1,2-diol, 20 | | 62000 |

| | (X) | | (Y) | | Mw |
|---|---|---|---|---|---|
| PB-50 | 50 | 50 HO-C(=O)-(CH₂)₄-C(=O)-OH | 30 PEG200 25 | 20 HO-CH₂-CH(OH)-CH₂-N⁺(CH₃)₂H · Cl⁻ 20 | 5 H₂N-(CH₂)₄-NH₂ | 60000 |
| PB-50b | 50 | 50 HO-C(=O)-(CH₂)₄-C(=O)-OH | 30 PEG200 25 | 20 HO-CH₂-CH(OH)-CH₂-N(CH₃)₂ 20 | 5 H₂N-(CH₂)₄-NH₂ | 60000 |

The binder polymers may be used individually or in combination of two or more thereof. The content of the binder polymer is preferably from 5 to 75% by weight, more preferably from 10 to 70% by weight, still more preferably from 10 to 60% by weight, based on the total solid content of the image-recording layer from the standpoint of good strength of the image area and good image-forming property.

The total content of the binder polymer and the polymerizable compound described below is preferably 80% by weight or less based on the total solid content of the image-recording layer. When it exceeds 80% by weight, decrease in sensitivity and deterioration in developing property may be caused sometimes. It is more preferably from 35 to 75% by weight.

(Polymerizable Compound)

The polymerizable compound for use in the image-recording layer according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide (EO) modified triacrylate or polyester acrylate oligomer;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane or bis[p-(methacryloxyethoxy)phenyl] dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonic acid esters, for example, ethylene glycol dicrotonate, tetramethylene glycol dicrotonate, pentaerythritol dicrotonate or sorbitol tetracrotonate;

isocrotonic acid esters, for example, ethylene glycol diisocrotonate, pentaerythritol diisocrotonate or sorbitol tetraisocrotonate;

and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 (the term "JP-B" as used herein means an "examined Japanese patent publication") and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \qquad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photosensitive composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth)

acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, a structure containing a perfluoroalkyl group described in JP-A-61-22048 can be preferably used. Moreover, photocurable monomers or oligomers described in Nippon Secchaku Kyokaishi (Journal of Japan Adhesion Society), Vol. 20, No. 7, pages 300 to 308 (1984) can also be used.

Details of the method of using the polymerizable compound, for example, selection of the structure, individual or combination use or an amount added, can be appropriately determined in accordance with the characteristic design of the final lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the image-recording layer. For instance, the compatibility may be improved in some cases by using the compound of low purity or using two or more kinds of the compounds in combination. A specific structure may be selected for the purpose of improving an adhesion property to a support, a protective layer or the like described hereinafter.

The polymerizable compound is used preferably in a range of 5 to 80% by weight, more preferably in a range of 25 to 75% by weight, based on the total solid content of the image-recording layer. The polymerizable compounds may be used individually or in combination of two or more thereof. In the method of using the polymerizable compound, the structure, blend and amount added can be appropriately selected by taking account of the degree of polymerization inhibition due to oxygen, resolution, fogging property, change in refractive index, surface tackiness and the like.

(Polymerization Initiator)

The polymerization initiator for use in the image-recording layer according to the invention is a compound which generates a radical with light energy or heat energy to initiate or accelerate polymerization of the polymerizable compound. The polymerization initiator is appropriately selected to use, for example, from known radical polymerization initiators and compounds containing a bond having small bond dissociation energy.

The polymerization initiators include, for example, organic halogen compounds, carbonyl compounds, organic peroxides, azo compounds, azido compounds, metallocene compounds, hexaarylbiimidazole compounds, organic boron compounds, disulfone compounds, oxime ester compounds and onium salt compounds.

The organic halogen compounds described above specifically include, for example, compounds described in Wakabayashi et al., Bull. Chem. Soc. Japan, 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, Journal of Heterocyclic Chemistry, 1, No. 3 (1970). Among them, oxazole compounds and s-triazine compounds each substituted with a trihalomethyl group are preferable.

More preferably, s-triazine derivatives in which at least one of mono-, di- or tri-halogen substituted methyl group is connected to the s-triazine ring and oxazole derivatives in which at least one of mono-, di- or tri-halogen substituted methyl group is connected to the oxazole ring are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl-4,6-bis(trichloromethyl)-s-triazine, 2-(p-isopropyloxystryl-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine and compounds shown below.

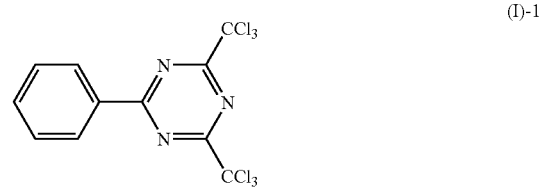

(I)-1

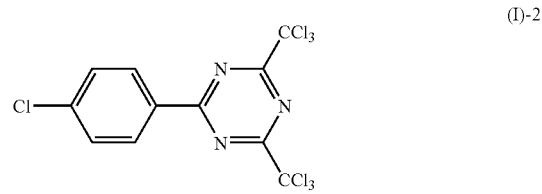

(I)-2

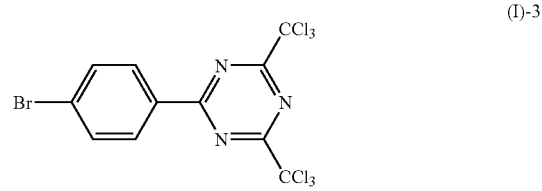

(I)-3

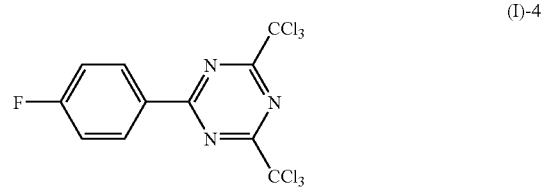

(I)-4

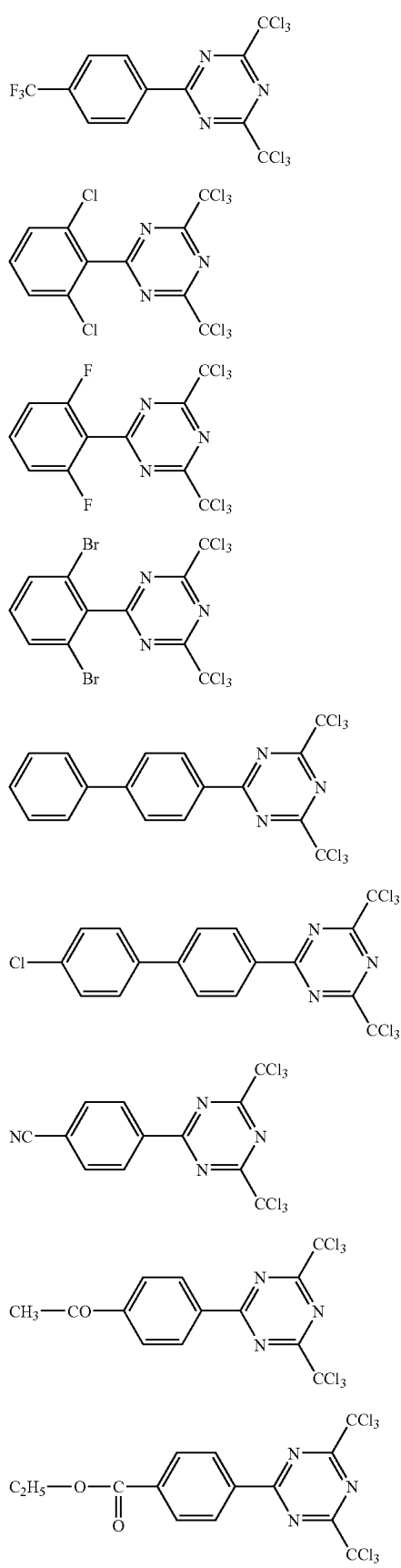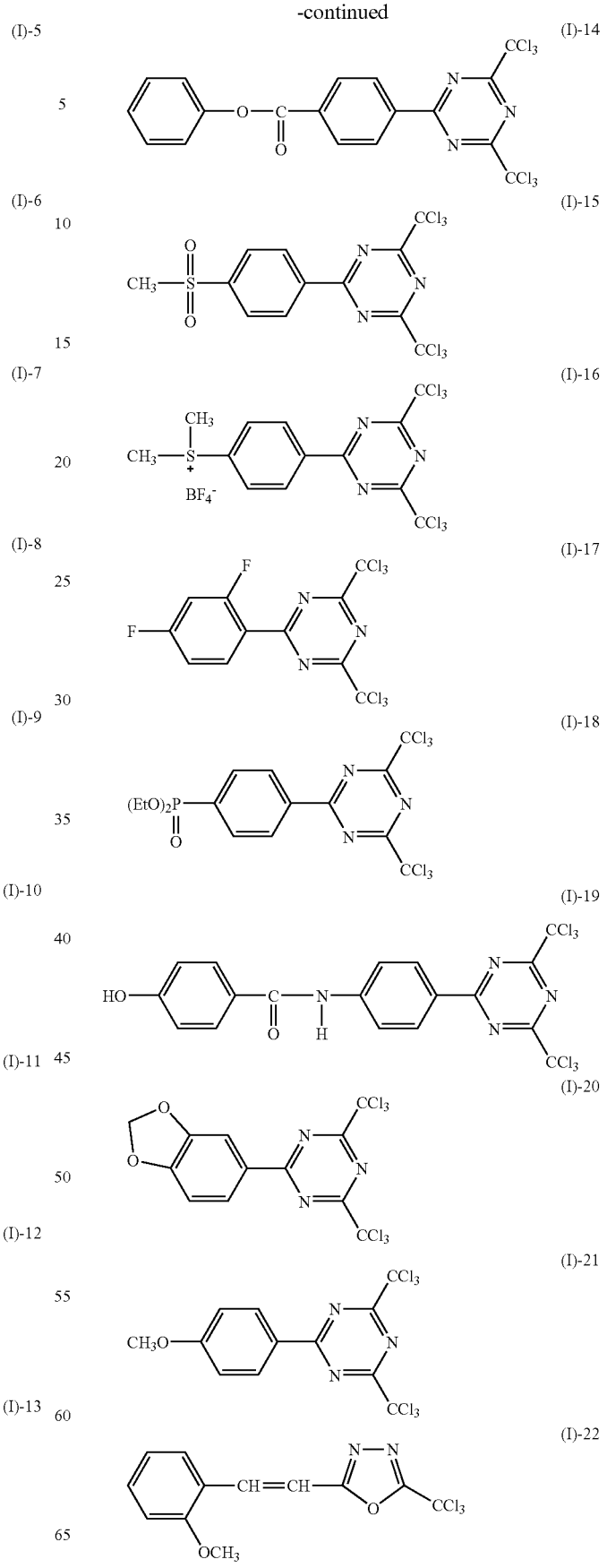

(I)-23
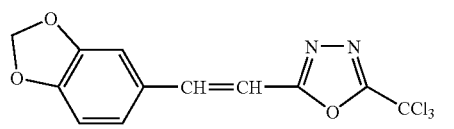

(I)-24
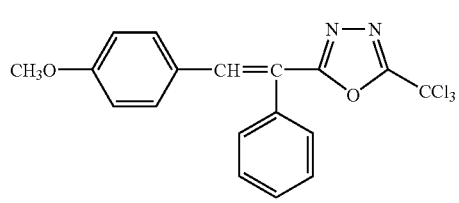

(I)-25
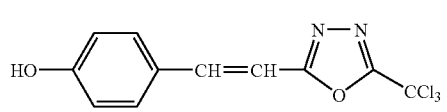

(I)-26
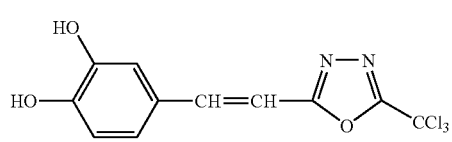

(I)-27
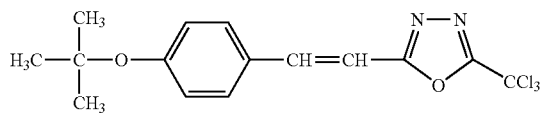

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1,-trichloromethyl-(p-butylphenyl)ketone, thioxantone derivatives, e.g., thioxantone, 2-ethylthioxantone, 2-isopropylthioxantone, 2-chlorothioxantone, 2,4-dimetylthioxantone, 2,4-dietylthioxantone or 2,4-diisopropylthioxantone, and benzoic acid ester derivatives, e.g., ethyl p-dimethylaminobenzoate or ethyl p-diethylaminobenzoate.

The azo compounds described above include, for example, azo compounds described in JP-A-8-108621.

The organic peroxides described above include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, peroxy succinic acid, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, or bis(cyclopentadienyl)-bis(2,6-difluoro-3-(pyr-1-yl)phenyl)titanium and iron-arene complexes described in JP-A-1-304453 and JP-A-1-152109.

The hexaarylbiimidazole compounds described above include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The organic boron compounds described above include, for example, organic boric acid salts described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, Rad Tech '98, Proceeding, Apr. 19-22 (1998), Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds described above include, for example, compounds described in JP-A-61-166544 and JP-A-2002-328465.

The oxime ester compounds described above include, for example, compounds described in J. C. S. Perkin II, 1653-1660 (1979), J. C. S. Perkin II, 156-162 (1979), Journal of Photopolymer Science and Technology, 202-232 (1995) and JP-A-2000-66385, and compounds described in JP-A-2000-80068. Specific examples thereof include compounds represented by the following structural formulae:

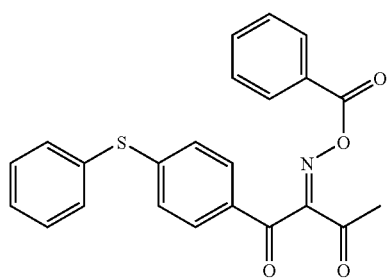
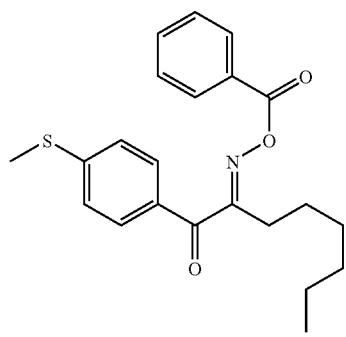
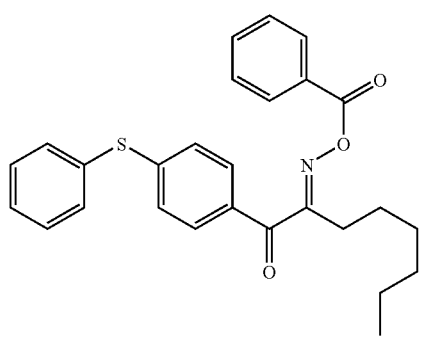
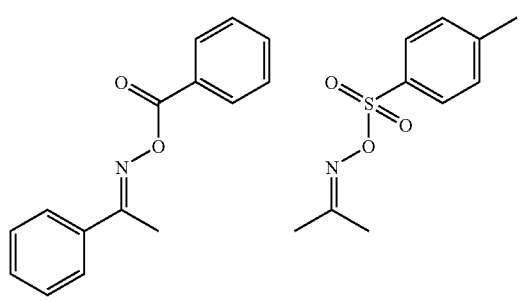
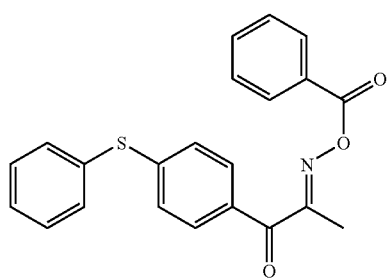
-continued
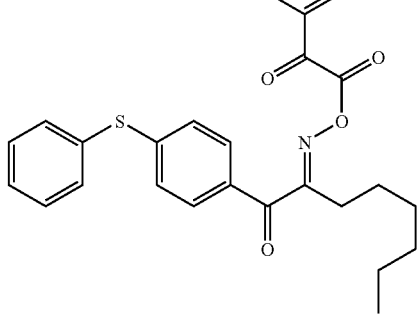
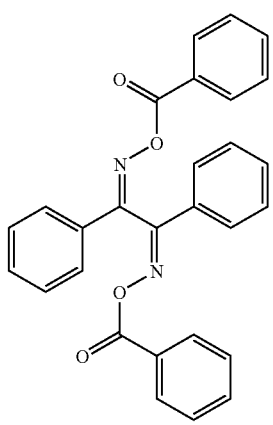
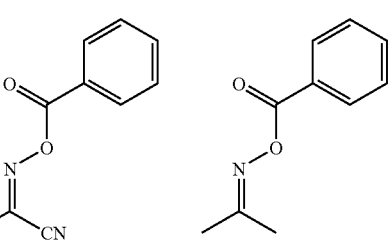
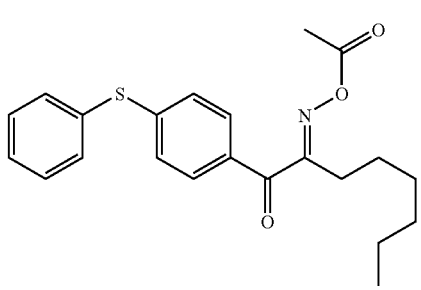
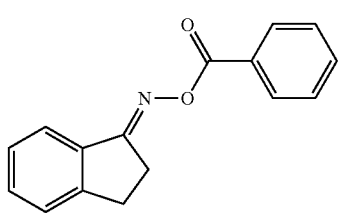

89
-continued

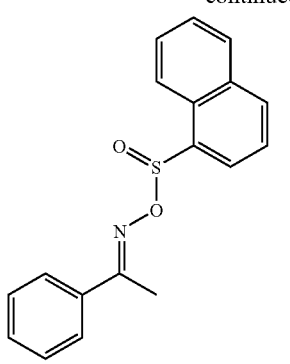

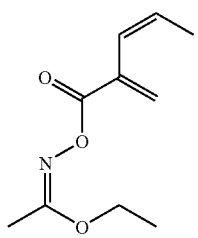

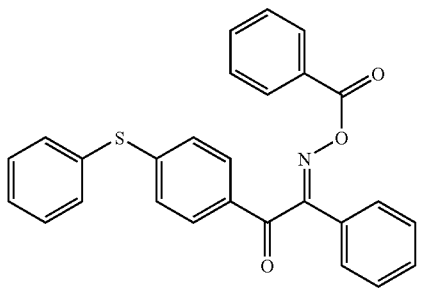

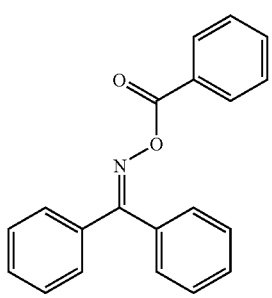

90
-continued

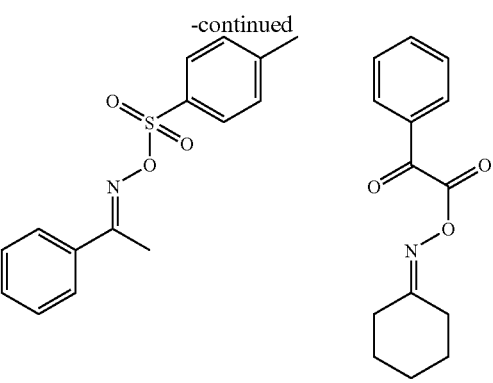

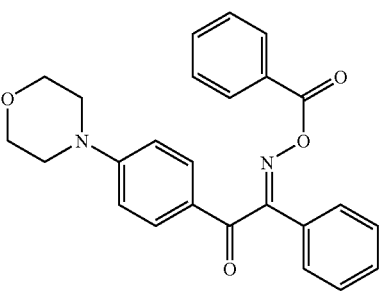

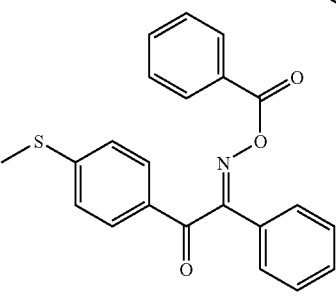

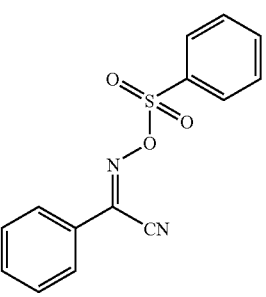

The onium salt compounds described above include onium salts, for example, diazonium salts described in S. I. Schlesinger, *Photogr. Sci. Eng.*, 18, 387 (1974) and T. S. Bal et al., *Polymer*, 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370, 693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), and arsonium salts described in C. S. Wen et al., *Teh, Proc. Conf. Rad. Curing ASIA*, p. 478, Tokyo, October (1988).

In the invention, the onium salt functions not as an acid generator, but as an ionic radical polymerization initiator.

The onium salts preferably used in the invention include onium salts represented by the following formulae (RI-I) to (RI-III):

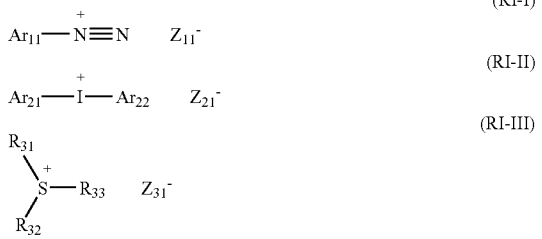

In formula (RI-I), $Ar_{11}$ represents an aryl group having 20 or less carbon atoms, which may have 1 to 6 substituents. Preferable examples of the substituent include an alkyl group having from 1 to 12 carbon atoms, an alkenyl group having from 2 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylimino group having from 2 to 12 carbon atoms, an alkylamido group or arylamido having from 2 to 12 carbon atoms, a carbonyl group, a carboxyl group, a cyano group, a sulfonyl group, an thioalkyl group having from 1 to 12 carbon atoms and an thioaryl group having from 6 to 12 carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion and a sulfate ion. Among them, a perchlorate ion, a hexafluorophosphate ion, a tetrafluoroborate ion, a sulfonate ion and a sulfinate ion are preferred in view of stability.

In the formula (RI-II), $Ar_{21}$ and $Ar_{22}$ each independently represents an aryl group having 20 or less carbon atoms, which may have 1 to 6 substituents. Preferable examples of the substituent include an alkyl group having from 1 to 12 carbon atoms, an alkenyl group having from 2 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylimino group having from 2 to 12 carbon atoms, an alkylamido group or arylamido group having from 2 to 12 carbon atoms, a carbonyl group, a carboxyl group, a cyano group, a sulfonyl group, an thioalkyl group having from 1 to 12 carbon atoms and an thioaryl group having from 6 to 12 carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity.

In the formula (RI-III), $R_{31}$, $R_{32}$ and $R_{33}$ each independently represents an aryl group having 20 or less carbon atoms, which may have 1 to 6 substituents, an alkyl group, an alkenyl group or an alkynyl group. Among them, the aryl group is preferred in view of reactivity and stability. Preferable examples of the substituent include an alkyl group having from 1 to 12 carbon atoms, an alkenyl group having from 2 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylamino group having from 2 to 12 carbon atoms, an alkylamido group or arylamido group having from 2 to 12 carbon atoms, a carbonyl group, a carboxyl group, a cyano group, a sulfonyl group, an thioalkyl group having from 1 to 12 carbon atoms and an thioaryl group having from 6 to 12 carbon atoms. $Z_{31}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity. Carboxylate ions described in JP-A-2001-343742 are more preferable, and carboxylate ions described in JP-A-2002-148790 are particularly preferable.

Specific examples of the onium salt, which are preferably used, are set forth below.

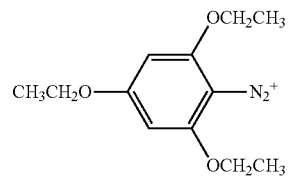

(N-1)

PF$_6^-$ (N-2)

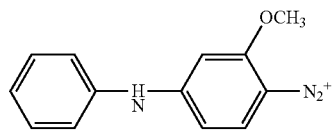

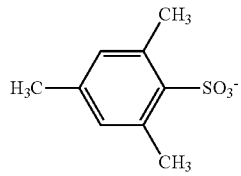

ClO$_4^-$ (N-4)
PF$_6^-$ (N-5)

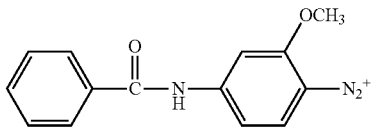

CF$_3$SO$_3^-$ (N-6)
BF$_4^-$ (N-7)

-continued
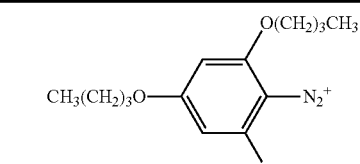 (N-8)
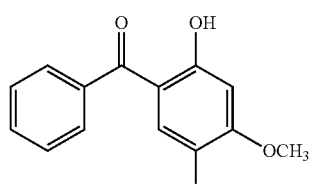 (N-9)
ClO₄⁻ (N-9)
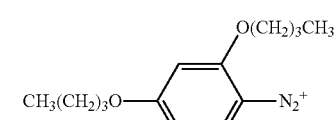 (N-10)
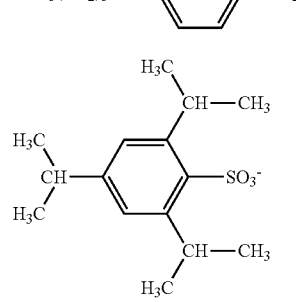 (N-11)
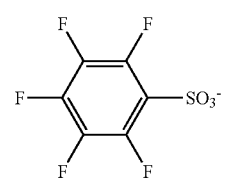 (N-12)
PF₆⁻ (N-12)
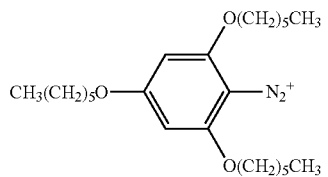 (N-13)
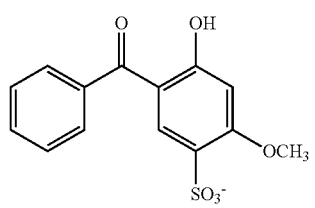 (N-14)
ClO₄⁻ (N-14)
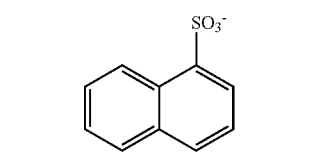 (N-15)
-continued
PF₆⁻ (N-16)
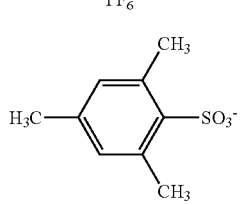 (N-17)
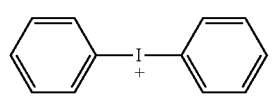 (I-1)
 (I-1)
PF₆⁻ (I-2)
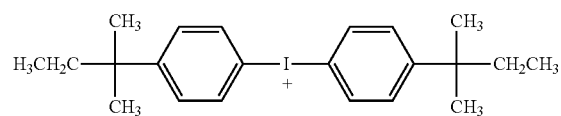 (I-3)
PF₆⁻ (I-3)
 (I-4)
ClO₄⁻ (I-5)
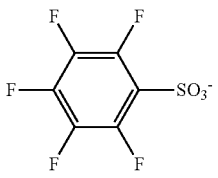 (I-6)
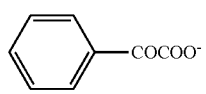 (I-7)
CF₃SO₃⁻ (I-8)
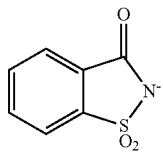 (I-9)
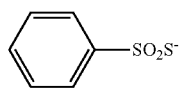 (I-10)
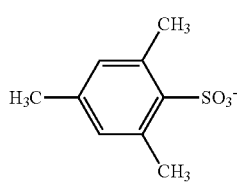 (I-11)

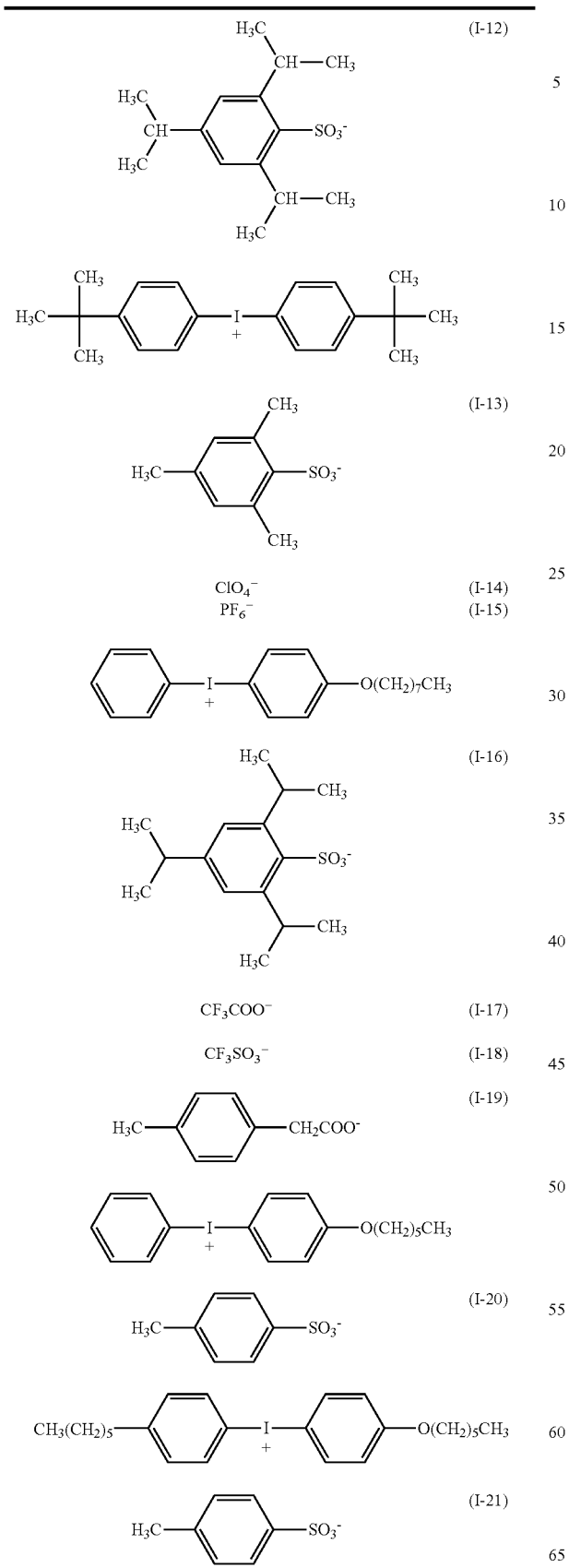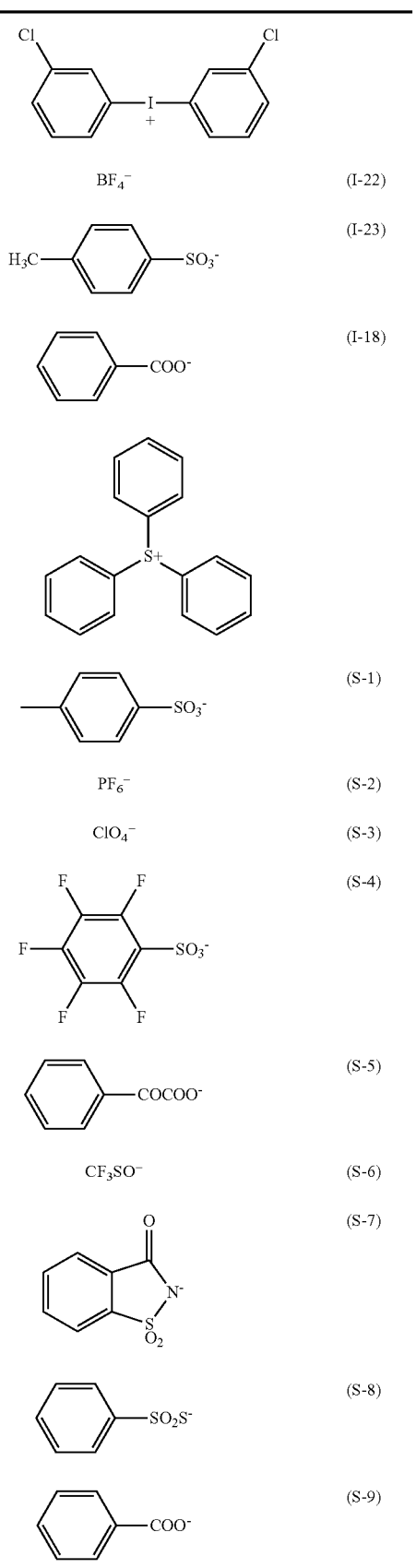

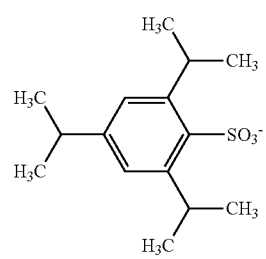
(S-10)

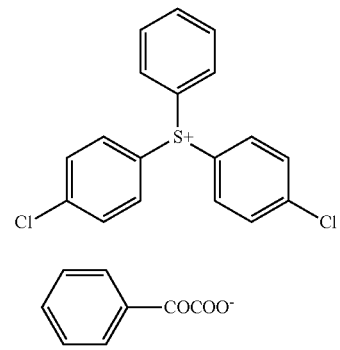
(S-11)

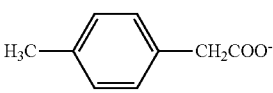
(S-12)

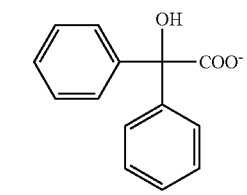
(S-13)

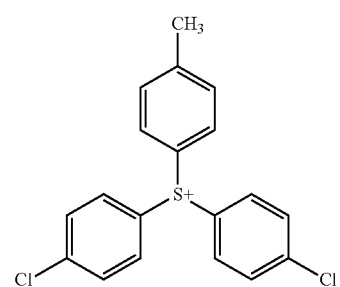
(S-14)

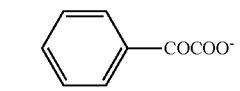
(S-15)

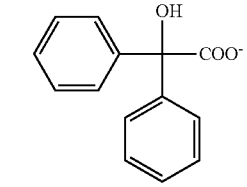

BF$_4^-$ (S-16)

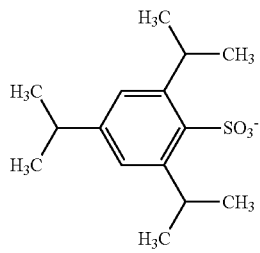
(S-17)

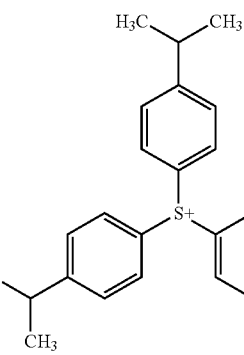

(S-18)

The polymerization initiator is not limited to those described above. In particular, from the standpoint of reactivity and stability, the triazine type initiators, organic halogen compounds, metallocene compounds, hexaarylbiimidazole compounds, organic boron compounds, oxime ester compounds and onium salt compounds are preferable and the triazine type initiators, organic halogen compounds, metallocene compounds, hexaarylbiimidazole compounds and onium salt compounds are more preferable.

The polymerization initiator can be added preferably in an amount from 0.1 to 50% by weight, more preferably from 0.5 to 30% by weight, particularly preferably from 0.8 to 20% by weight, based on the total solid content of the image-recording layer.

(Other Components)

To the image-recording layer according to the invention may further appropriately be added other components suitable for the use or production method thereof or the like. Other components are described below.

(Sensitizing Dye)

The sensitizing dye for use in the image-recording layer according to the invention is appropriately selected depending on the use or the like and is not particularly restricted. For instance, a compound absorbing light of 350 to 450 nm and an infrared absorbing agent are exemplified.

(1) Compound Absorbing Light of 350 to 450 nm

As the compound absorbing light of 350 to 450 nm used in the invention, the sensitizing dye having an absorption maximum in a wavelength range of 350 to 450 nm is preferable, and examples of such sensitizing dye include, for example, merocyanine dyes represented by formula (V) shown below, benzopyranes or coumarins represented by formula (VI) shown below, aromatic ketones represented by formula (VII) shown below and anthracenes represented by formula (VIII) shown below.

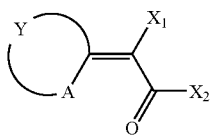
(V)

In formula (V), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

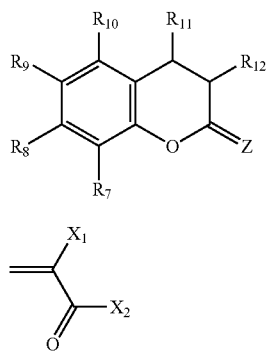
(VI)

(I')

In formula (VI), =Z represents an oxo group, a thioxo group, an imino group or an alkylydene group represented by the partial structural formula (1') described above, $X_1$ and $X_2$ have the same meanings as defined in formula (V) respectively, and $R_7$ to $R_{12}$ each independently represents a monovalent non-metallic atomic group.

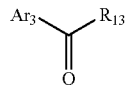
(VII)

In formula (VII), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

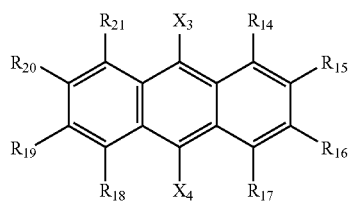
(VIII)

In formula (VIII), $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In formulae (V) to (VIII), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-aryl-ureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (V) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc.*, Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2] thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); isoquinolines (for example, isoquinoline or 3,4-dihydroisoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and pyridines (for example, pyridine or 5-methylpyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]

dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the sensitizing dyes having an absorption maximum in a wavelength range of 350 to 450 nm, dyes represented by formula (IX) shown below are more preferable in view of high sensitivity.

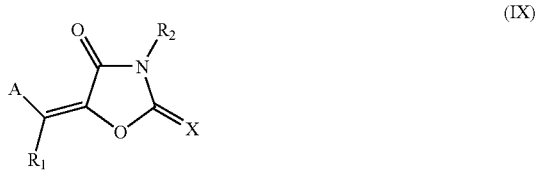

(IX)

In formula (IX), A represents an aromatic cyclic group which may have a substituent or a heterocyclic group which may have a substituent, X represents an oxygen atom, a sulfur atom or =N(R$_3$), and R$_1$, R$_2$ and R$_3$ each independently represents a monovalent non-metallic atomic group, or A and R$_1$ or R$_2$ and R$_3$ may be combined with each other to form an aliphatic or aromatic ring.

The formula (IX) will be described in more detail below. R$_1$, R$_2$ and R$_3$ each independently represents a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Preferable examples of R$_1$, R$_2$ and R$_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-aryl-sulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group include a monocyclic or polycyclic aromatic cyclic group containing at least one of a nitrogen atom, an oxygen atom and a sulfur atom. Examples of especially preferable heteroaryl group include a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1CO$—) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of $R_1$, $R_2$ and $R_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Examples of the preferable substituted or unsubstituted alkenyl group and the preferable substituted or unsubstituted aromatic heterocyclic residue represented by any one of $R_1$, $R_2$ and $R_3$ include those described with respect to the alkenyl group and heteroaryl group above, respectively.

Next, A in formula (IX) will be described below. A represents an aromatic cyclic group which may have a substituent or heterocyclic group which may have a substituent. Specific examples of the aromatic cyclic group which may have a substituent and heterocyclic group which may have a substituent include the aryl groups and the aromatic heterocyclic residues described for any one of $R_1$, $R_2$ and $R_3$ in formula (IX).

The sensitizing dye represented by formula (IX) is obtained by a condensation reaction of the above-described acidic nucleus or an active methyl group-containing acidic nucleus with a substituted or unsubstituted, aromatic ring or hetero ring, and in particular, can be synthesized with reference to the description of JP-B-59-28329.

Preferable specific examples (D1) to (D75) of the compound represented by formula (IX) are set forth below. Further, when isomers with respect to a double bond connecting an acidic nucleus and a basic nucleus are present in each of the compounds, the invention should not be construed being limited to any one of the isomers.

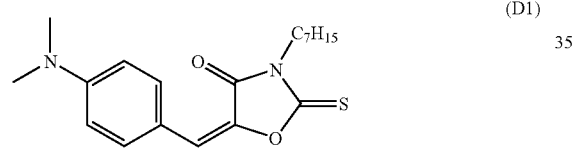
(D1)

(D2)

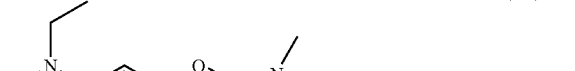
(D3)

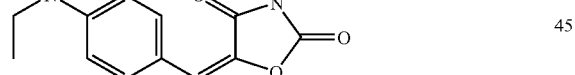
(D4)

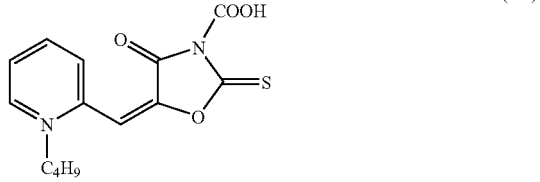
(D5)

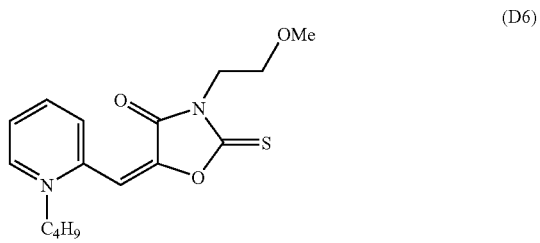
(D6)

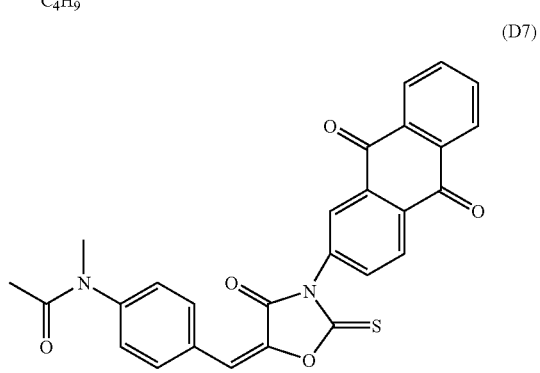
(D7)

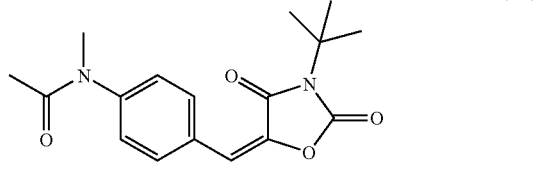
(D8)

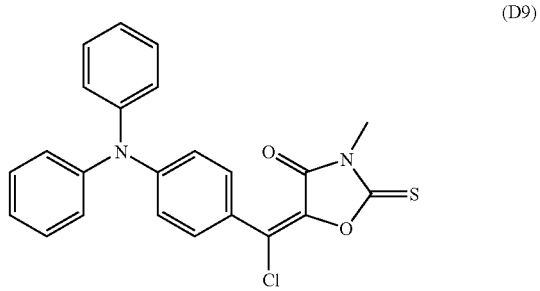
(D9)

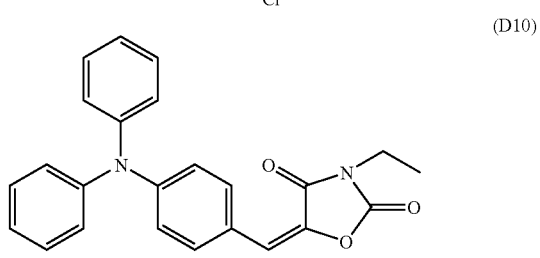
(D10)

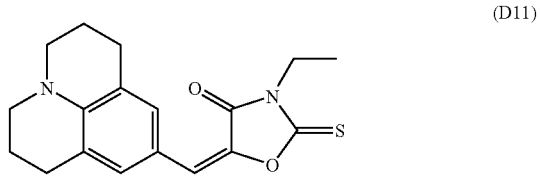
(D11)

-continued
(D12) 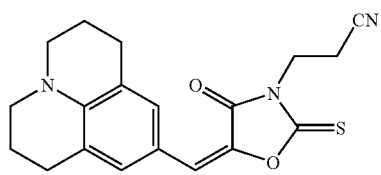
(D13) 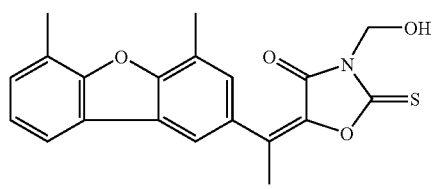
(D14) 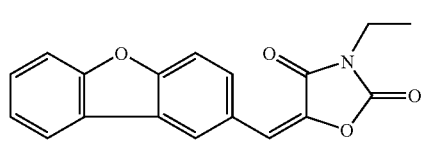
(D15) 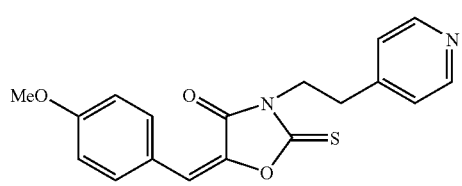
(D16) 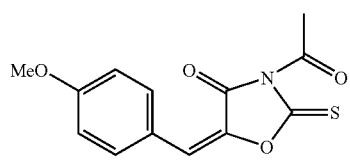
(D17) 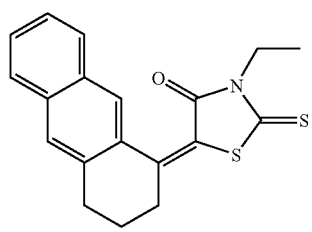
(D18) 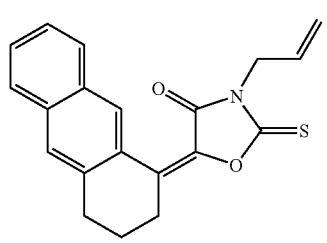
(D19) 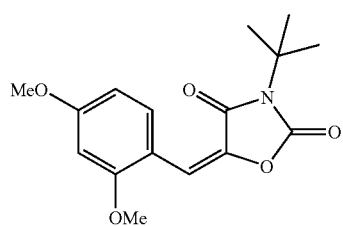
-continued
(D20) 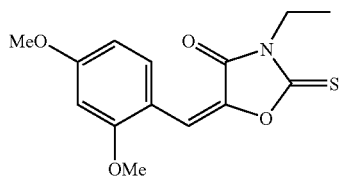
(D21) 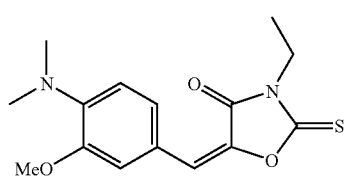
(D22) 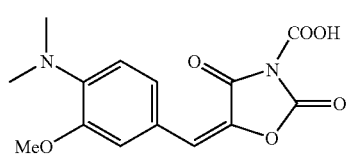
(D23) 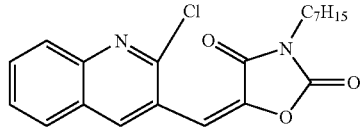
(D24) 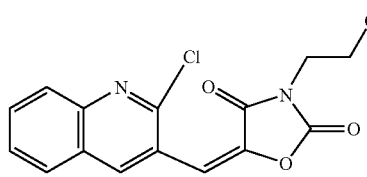
(D25) 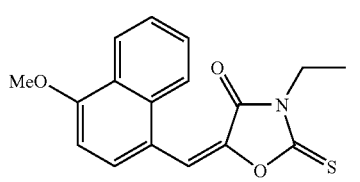
(D26) 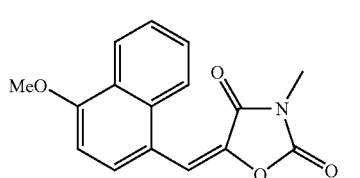
(D27) 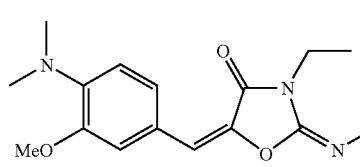
(D28) 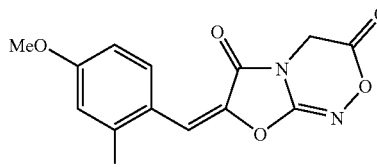

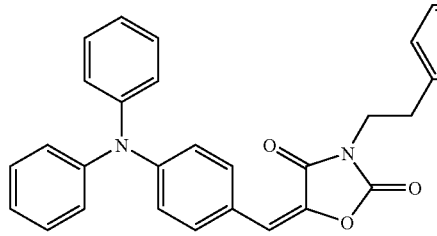
(D29)
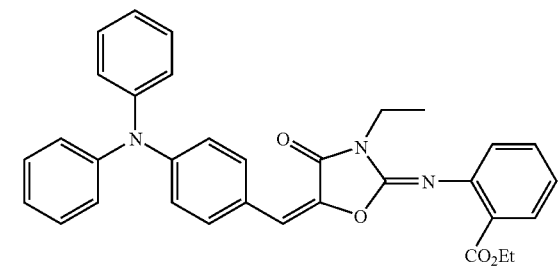
(D30)
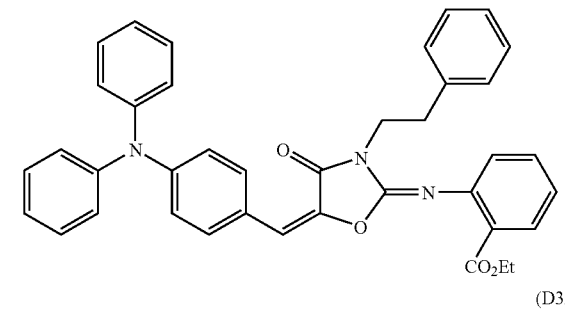
(D31)
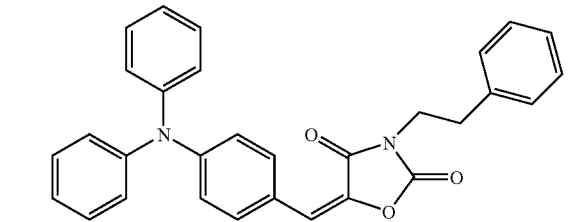
(D32)
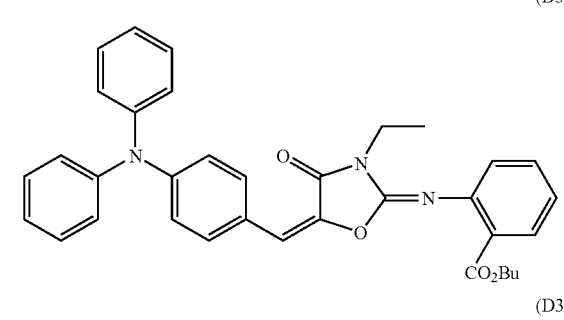
(D33)
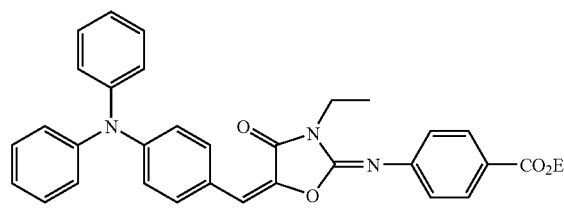
(D34)
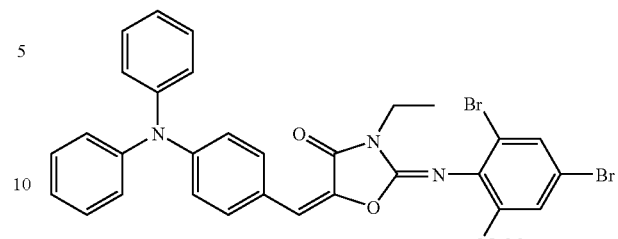
(D35)
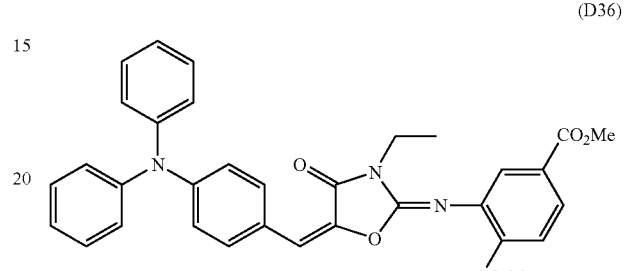
(D36)
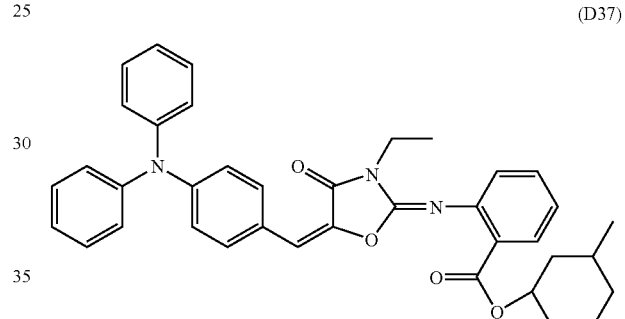
(D37)
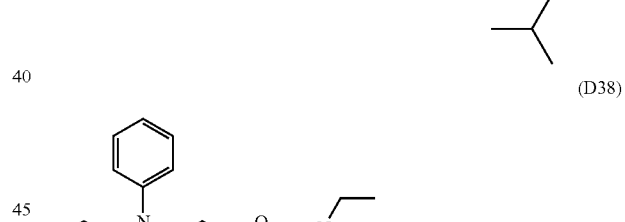
(D38)
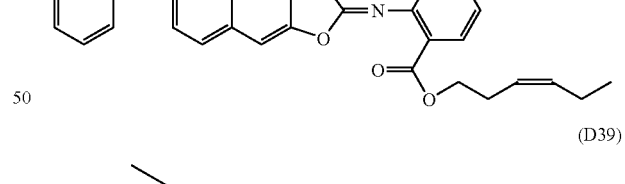
(D39)
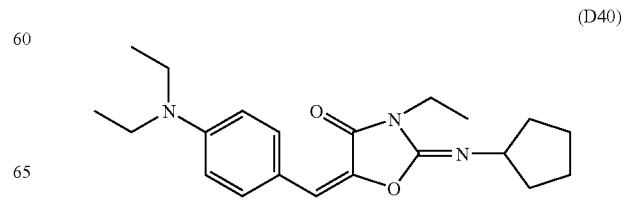
(D40)

(D41) 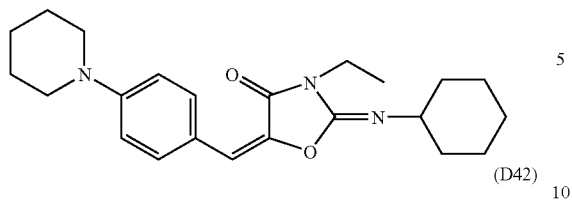
(D42) 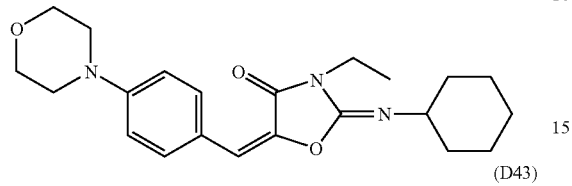
(D43) 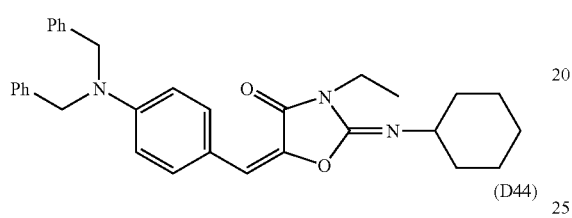
(D44) 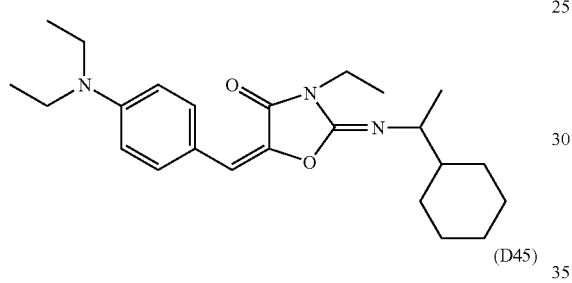
(D45) 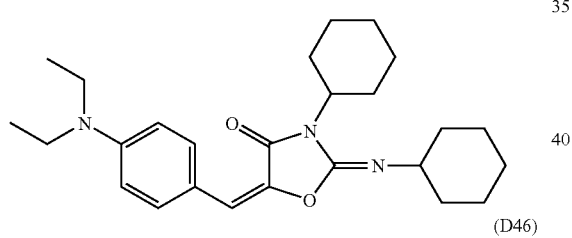
(D46) 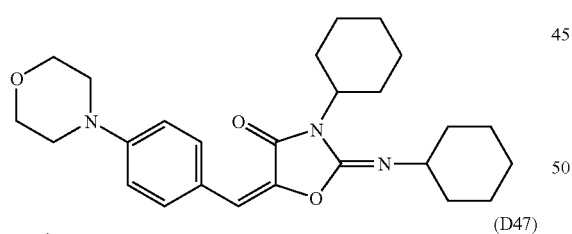
(D47) 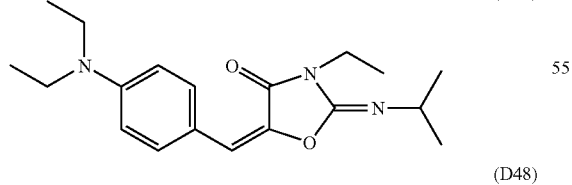
(D48) 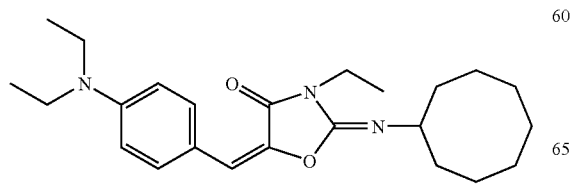
(D49) 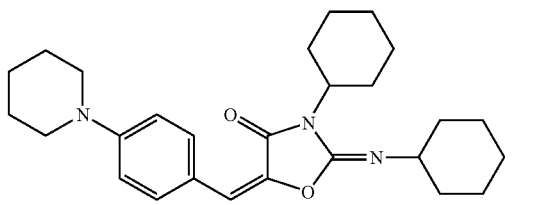
(D50) 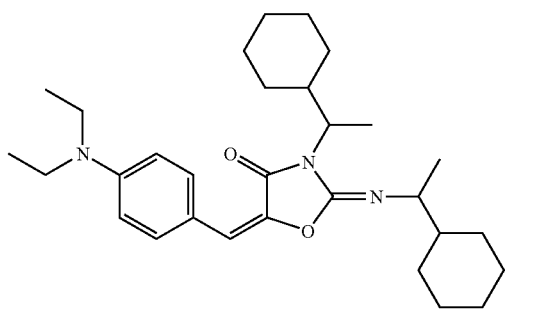
(D51) 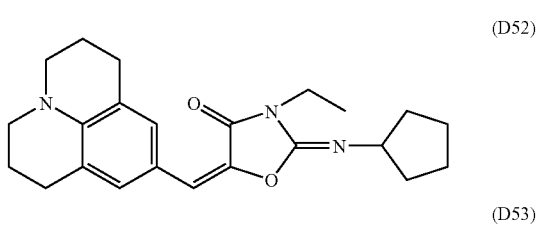
(D52) 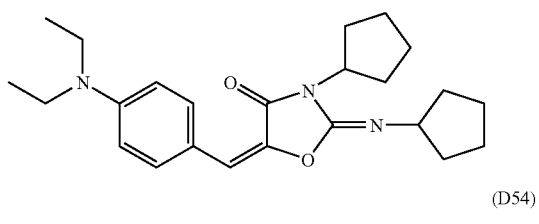
(D53) 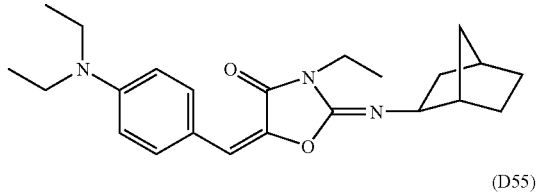
(D54) 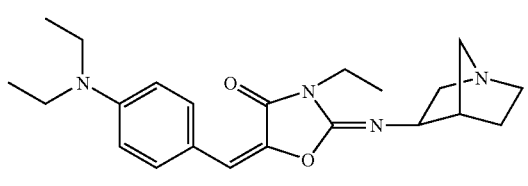
(D55)

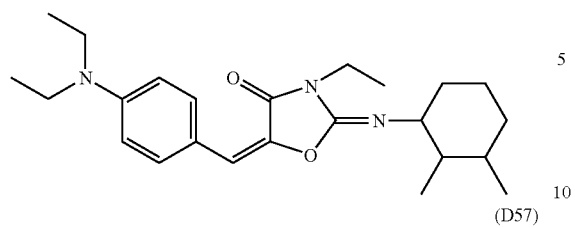
(D56)
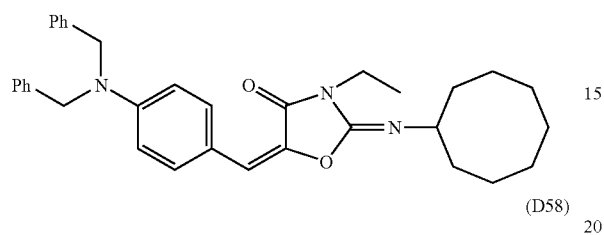
(D57)
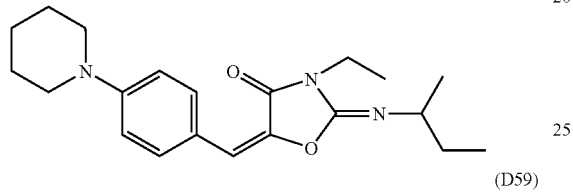
(D58)
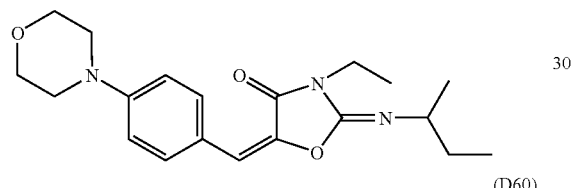
(D59)
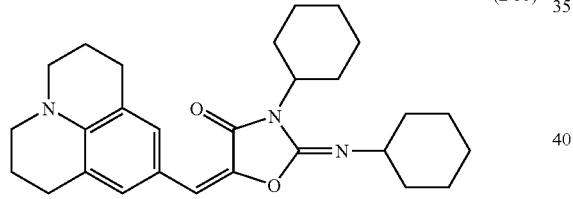
(D60)
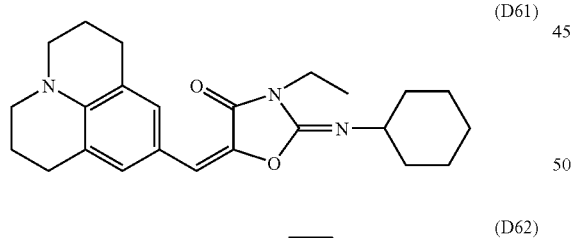
(D61)
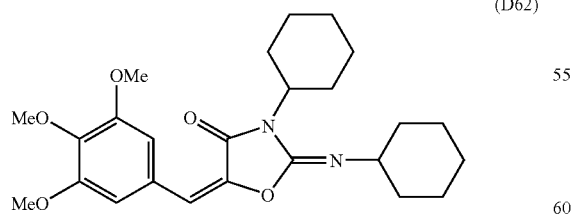
(D62)
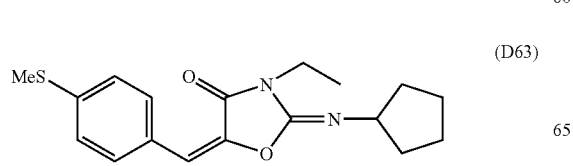
(D63)
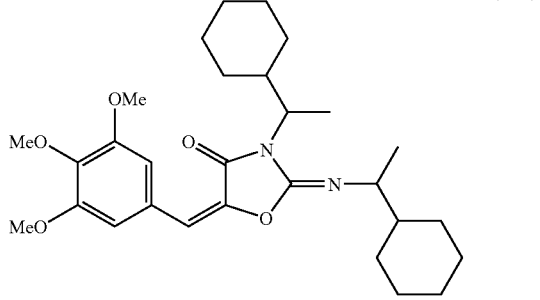
(D64)
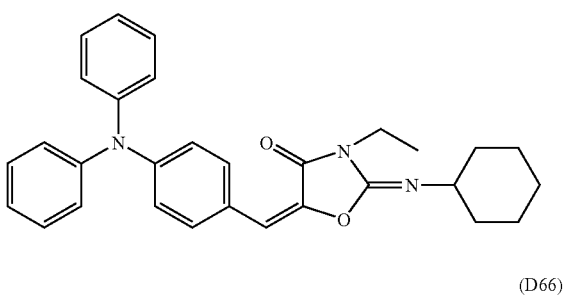
(D65)
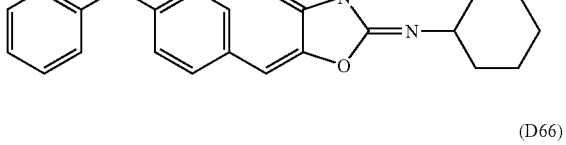
(D66)
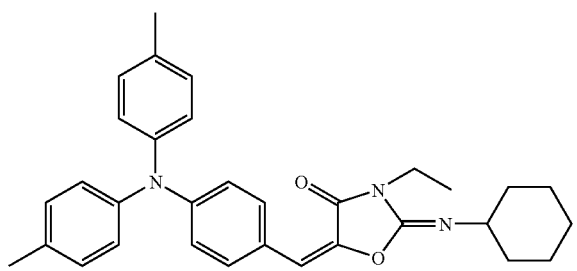
(D67)
(D68)

(D69)
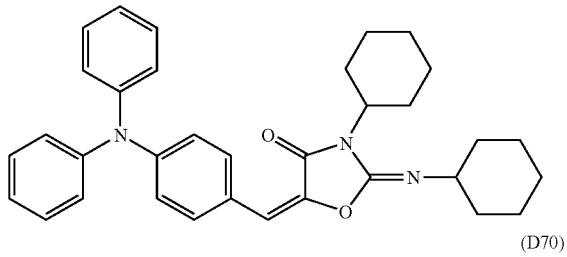

(D70)
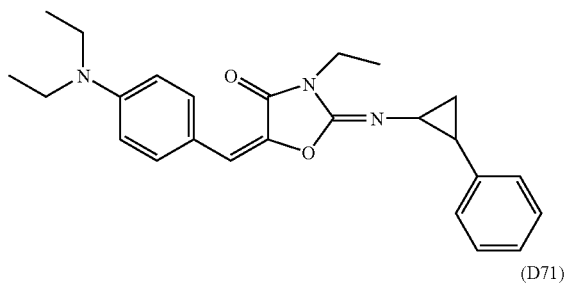

(D71)
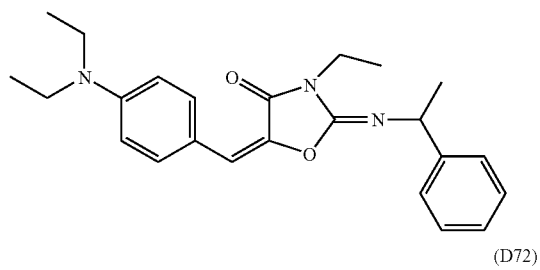

(D72)
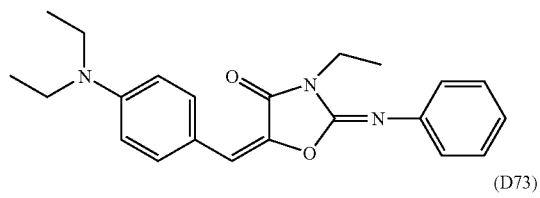

(D73)
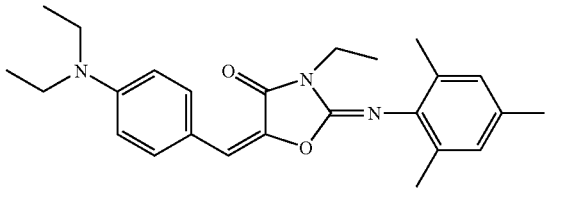

(D74)
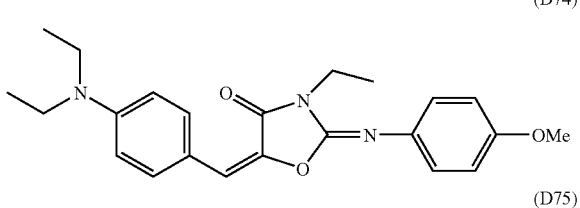

(D75)
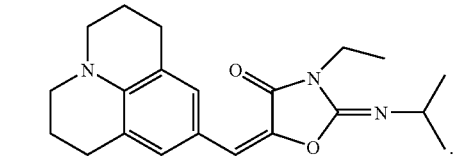

Details of the method of using the sensitizing dye, for example, selection of the structure, individual or combination use or an amount added, can be appropriately determined in accordance with the characteristic design of the final lithographic printing plate.

For instance, when two or more sensitizing dyes are used in combination, the compatibility thereof in the image-recording layer can be increased. For the selection of sensitizing dye, the molar absorption coefficient thereof at the emission wavelength of the light source used is an important factor in addition to the photosensitivity. Use of the dye having a large molar absorption coefficient is profitable, because the amount of dye added can be made relatively small. Also, in case of using in a lithographic printing plate precursor, the use of such a dye is advantageous in view of physical properties of the image-recording layer. Since the photosensitivity and resolution of the image-recording layer and the physical properties of the exposed area of the image-recording layer are greatly influenced by the absorbance of sensitizing dye at the wavelength of light source, the amount of the sensitizing dye added is appropriately determined by taking account of these factors.

However, for the purpose of curing a layer having a large thickness, for example, of 5 μm or more, low absorbance is sometimes rather effective for increasing the curing degree. In the case of using in a lithographic printing plate precursor where the image-recording layer has a relatively small thickness, the amount of the sensitizing dye added is preferably selected such that the image-recording layer has an absorbance from 0.1 to 1.5, preferably from 0.25 to 1. Ordinarily, the amount of the sensitizing dye added is preferably from 0.05 to 30 parts by weight, more preferably from 0.1 to 20 parts by weight, most preferably from 0.2 to 10 parts by weight, per 100 parts by weight of the total solid content of the image-recording layer.

(2) Infrared Absorbing Agent

The infrared absorbing agent is a component used for increasing sensitivity to an infrared laser. The infrared absorbing agent has a function of converting the infrared ray absorbed to heat. The infrared absorbing agent for use in the invention is preferably a dye or pigment having an absorption maximum in a wavelength range of 760 to 1,200 nm.

As the dye, commercially available dyes and known dyes described in literatures, for example, Senryo Binran (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-5941363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used. Other preferred examples of the dye include near infrared absorbing dyes represented by formulae (I) and (II) in U.S. Pat. No. 4,756,993.

Other preferable examples of the infrared absorbing dye include specific indolenine cyanine dyes described in JP-A-2002-278057 as illustrated below.

In formula (I), $X^1$ represents a hydrogen atom, a halogen atom, —$NPh_2$, $X^2$-$L^1$ or a group shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom indicates here a nitrogen atom, a sulfur atom, an oxygen atom, a halogen atom or a selenium atom.

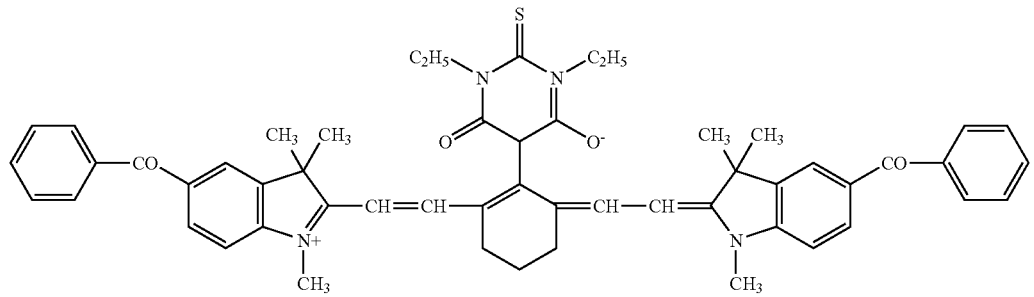

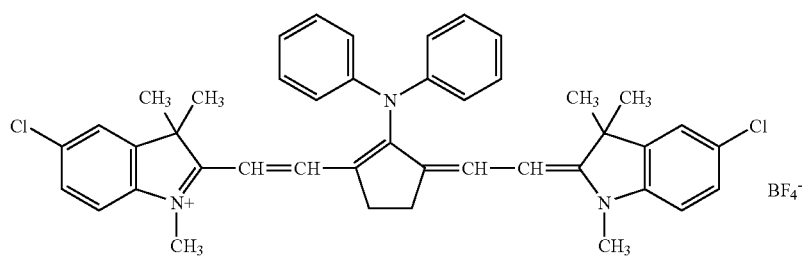

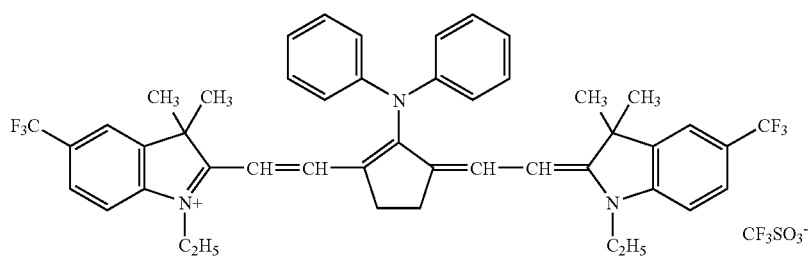

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As a particularly preferable example of the dye, a cyanine dye represented by the following formula (I) is exemplified.

Formula (I):

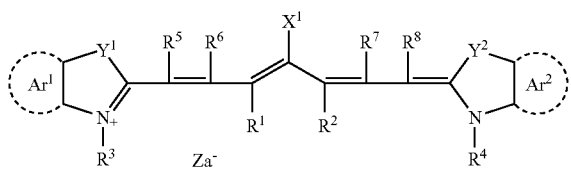

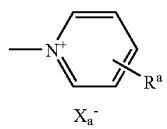

(wherein $Xa^-$ has the same meaning as $Za^-$ defined hereinafter. $R^a$ represents a substituent selected from a hydrogen atom, an alkyl group, an aryl group, a substituted or unsubstituted amino group and a halogen atom.)

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring and a naphthalene ring. Also, preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (I) has an anionic substituent in the structure thereof and neutralization of charge is not needed. Preferable examples of the counter ion for $Za^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for photosensitive layer.

Specific examples of the cyanine dye represented by formula (I), which can be preferably used in the invention, include those described in Paragraph Nos. [0017] to [0019] of JP-A-2001-133969.

Further, other particularly preferable examples include specific indolenine cyanine dyes described in JP-A-2002-278057 described above.

Examples of the pigment for use in the invention include commercially available pigments and pigments described in *Colour Index (C.I.)*, *Saishin Ganryo Binran (Handbook of the Newest Pigments)* compiled by Pigment Technology Society of Japan (1977), *Saishin Ganryo Oyou Gijutsu (Newest Application on Technologies for Pigments)*, CMC Publishing Co., Ltd. (1986) and *Insatsu Ink Gijutsu (Printing Ink Technology)*, CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo (Properties and Applications of Metal Soap)*, Saiwai Shobo, *Insatsu Ink Gijutsu (Printing Ink Technology)*, CMC Publishing Co., Ltd. (1984) and *Saishin Ganryo Oyo Gijutsu (Newest Application on Technologies for Pigments)*, CMC Publishing Co., Ltd. (1986).

The pigment has a particle size of preferably from 0.01 to 10 μm, more preferably from 0.05 to 1 μm, particularly preferably from 0.1 to 1 μm. In the range described above, good stability and good uniformity of the pigment dispersion in the image-recording layer can be obtained.

For dispersing the pigment, known dispersion techniques for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in *Saishin Ganryo Oyo Gijutsu (Newest Application on Technologies for Pigments)*, CMC Publishing Co., Ltd. (1986).

The infrared absorbing agent may be added by being incorporated into a microcapsule.

With respect to the amount of the infrared absorbing agent added, the amount is so controlled that absorbance of the image-recording layer at the maximum absorption wavelength in the wavelength region of 760 to 1,200 nm measured by reflection measurement is in a range of 0.3 to 1.3, preferably in a range of 0.4 to 1.2. In the range described above, the polymerization reaction proceeds uniformly in the thickness direction of the image-recording layer and good film strength of the image area and good adhesion property of the image area to a support are achieved.

The absorbance of the image-recording layer can be controlled depending on the amount of the infrared absorbing agent added and the thickness of the image-recording layer. The measurement of the absorbance can be carried out in a conventional manner. The method for measurement includes, for example, a method of forming a image-recording layer having a thickness determined appropriately in the range necessary for the lithographic printing plate precursor on a reflective support, for example, an aluminum plate, and measuring reflection density of the image-recording layer by an optical densitometer or a spectrophotometer according to a reflection method using an integrating sphere.

(Chain Transfer Agent)

The image-recording layer according to the invention may contain a chain transfer agent. The chain transfer agent contributes to improvements in the sensitivity and preservation stability. Compounds which function as the chain transfer agents include, for example, compounds containing SH, PH, SiH or GeH in their molecules. Such a compound donates hydrogen to a radical species of low activity to generate a radical, or is oxidized and then deprotonated to generate a radical.

In the image-recording layer according to the invention, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used as the chain transfer agent.

Among them, a thiol compound represented by formula (II) shown below is particularly preferably used. By using the thiol compound represented by formula (II) as the chain transfer agent, a problem of the odor and decrease in sensitivity due to evaporation of the compound from the image-recording layer or diffusion thereof into other layers are avoided and a lithographic printing plate precursor which is excellent in preservation stability and exhibits high sensitivity and good printing durability is obtained.

Formula (II):

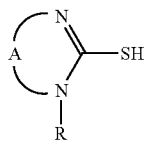

In formula (II), R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

Compounds represented by formulae (IIA) and (IIB) shown below are more preferably used.

Formula (IIA):

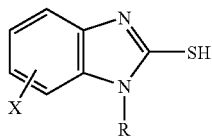

Formula (IIB):

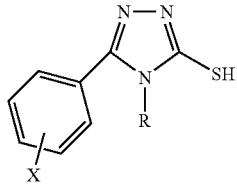

In formulae (IIA) and (IIB), R represents an alkyl group which may have a substituent or an aryl group which may have a substituent; and X represents a hydrogen atom, a halogen atom, an alkoxy group which may have a substituent, an alkyl group which may have a substituent or an aryl group which may have a substituent.

Specific examples of the compound represented by formula (II) are set forth below, but the invention should not be construed as being limited thereto.

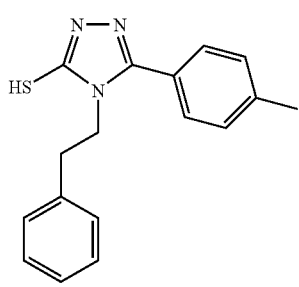

-continued

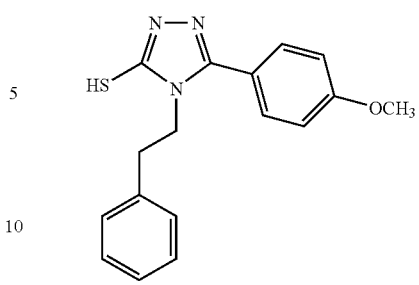

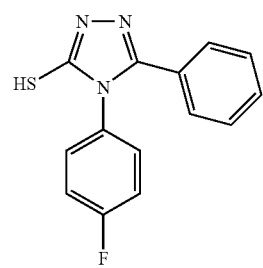

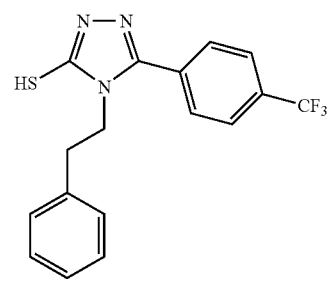

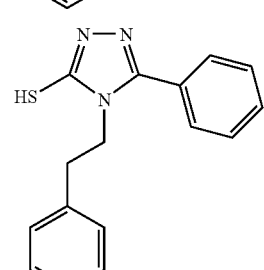

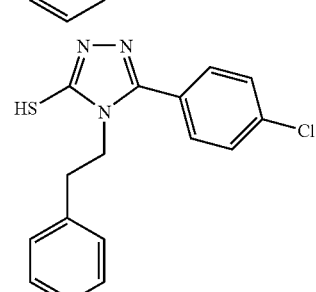

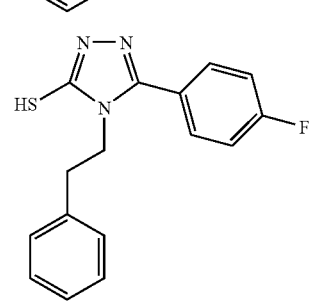

125
-continued
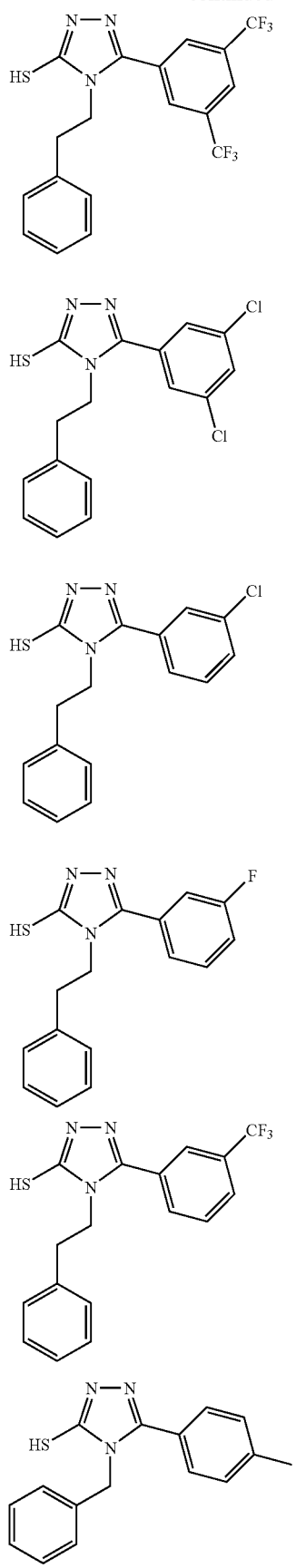
126
-continued
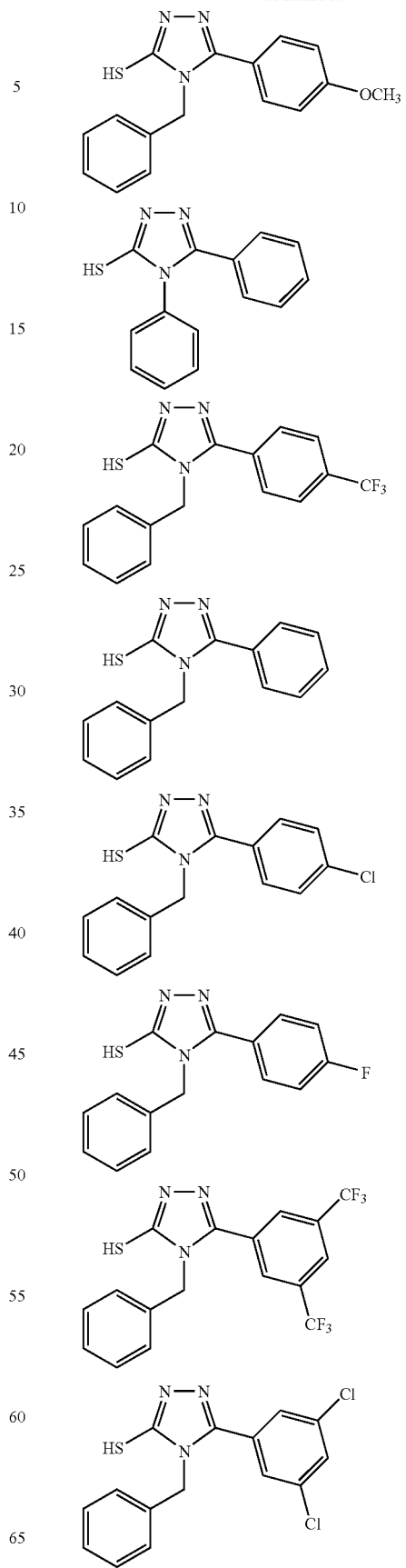

127
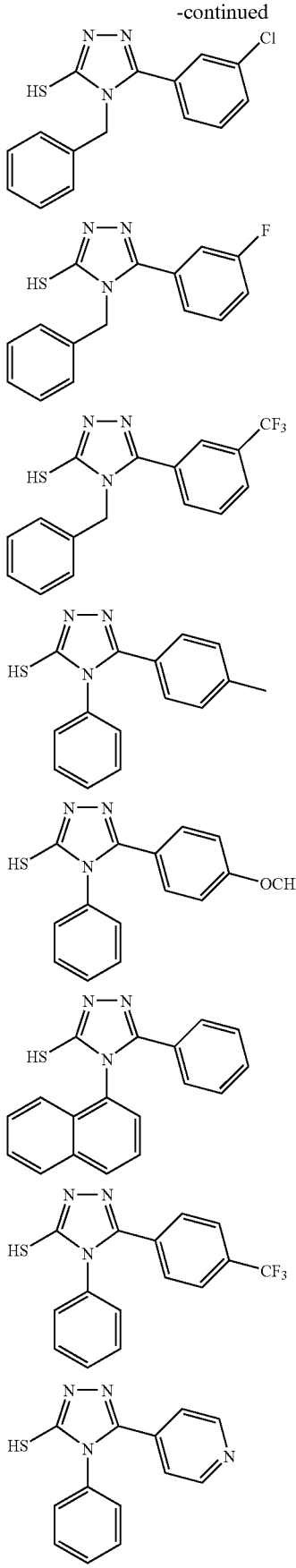
128
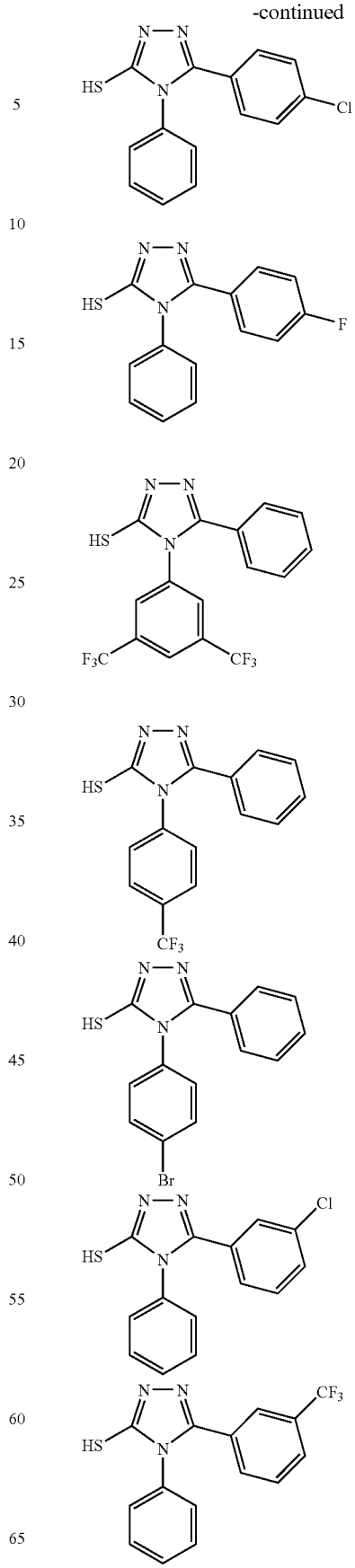

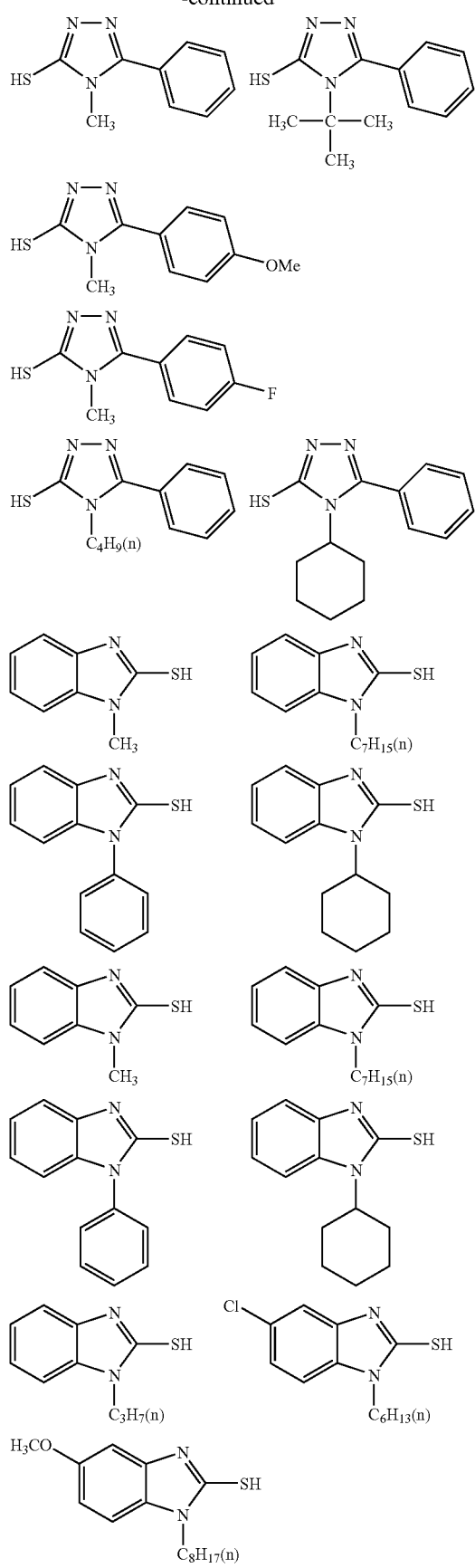
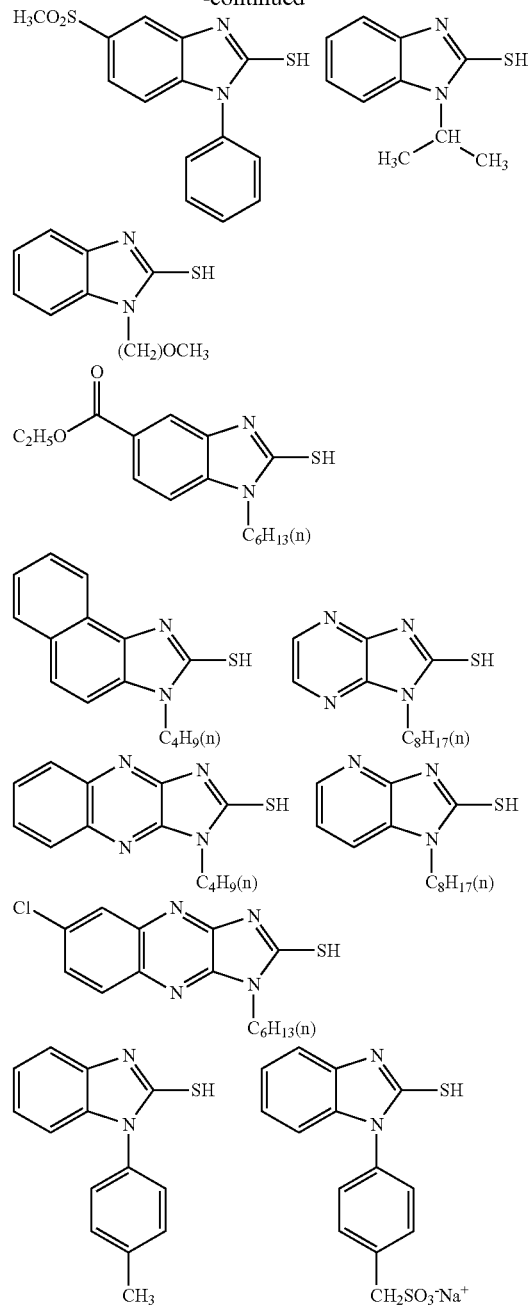

The amount of the chain transfer agent (for example, the thiol compound) used is preferably from 0.01 to 20% by weight, more preferably from 0.1 to 15% by weight, still more preferably from 1.0 to 10% by weight, based on the total solid content of the image-recording layer.

(Microcapsule)

In the invention, in order to incorporate the above-described constituting components of the image-recording layer and other constituting components described hereinafter into the image-recording layer, a part or whole of the constituting components is encapsulated into microcapsules and added to the image-recording layer as described, for example, in JP-A-2001-277740 and JP-A-2001-277742. In such a case, each constituting component may be present inside or outside the microcapsule in an appropriate ratio.

As a method of microencapsulating the constituting components of the image-recording layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by polymerization of monomer described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and particularly polyurea and polyurethane are preferred. Further, a compound having a crosslinkable functional group, for example, an ethylenically unsaturated bond, capable of being introduced into the binder polymer described above may be introduced into the microcapsule wall.

The average particle size of the microcapsule is preferably from 0.01 to 3.0 μm, more preferably from 0.05 to 2.0 μm, particularly preferably from 0.10 to 1.0 μm. In the range described above, preferable resolution and good preservation stability can be achieved.

(Surfactant)

In the invention, it is preferred to use a surfactant in the image-recording layer in order to progress the developing property and to improve the state of surface coated. The surfactant includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols and copolymers of polyethylene glycol and polypropylene glycol.

The anionic surfactant used in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferable surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The content of the surfactant is preferably from 0.001 to 10% by weight, more preferably from 0.01 to 7% by weight, based on the total solid content of the image-recording layer.

(Hydrophilic Polymer)

In the invention, a hydrophilic polymer may be incorporated into the image-recording layer in order to improve the developing property and dispersion stability of microcapsule.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinyl pyrrolidone, a homopolymer or polymer of acrylamide, a homopolymer or copolymer of methacrylamide, a homopolymer or copolymer of N-methylolacrylamide, polyvinyl pyrrolidone, an alcohol-soluble nylon, and a polyether of 2,2-bis(4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer is preferably 20% by weight or less, more preferably 10% by weight or less, based on the total solid content of the image-recording layer.
(Coloring Agent)

In the invention, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment, carbon black and titanium oxide can be preferably used.

It is preferable to add the coloring agent, because the image area and the non-image area after the image formation can be easily distinguished. The amount of the coloring agent added is preferably from 0.01 to 10% by weight based on the total solid content of the image-recording layer.
(Print-Out Agent)

In the image-recording layer according to the invention, a compound capable of undergoing discoloration by the effect of an acid or a radical can be added in order to form a print-out image. As such a compound, for example, various dyes, e.g., diphenylmethane-based, triphenylmethane-based, thiazine-based, oxazine-based, xanthene-based, anthraquinone-based, iminoquinone-based, azo-based and azomethine-based dyes are effectively used.

Specific examples thereof include dyes, for example, Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH (produced by Hodogaya Chemical Co., Ltd.), Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes, for example, p,p',p''-hexamethyltriaminotriphenyl methane (leuco Crystal Violet) and Pergascript Blue SRB (produced by Ciba Geigy).

Other preferable examples include leuco dyes known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidino-fluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye capable of undergoing discoloration by the effect of an acid or a radical is preferably added in an amount of 0.01 to 15% by weight based on the total solid content of the image-recording layer.
(Polymerization Inhibitor)

It is preferred that a small amount of a thermal polymerization inhibitor is added to the image-recording layer according to the invention in order to inhibit undesirable thermal polymerization of the polymerizable compound during the production or preservation of the image-recording layer.

The thermal polymerization inhibitor preferably includes, for example, hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the image-recording layer.
(Higher Fatty Acid Derivative)

In the image-recording layer according to the invention, for example, a higher fatty acid derivative, e.g., behenic acid or behenic acid amide may be added and localized on the surface of the image-recording layer during the process of drying after coating in order to avoid polymerization inhibition due to oxygen. The amount of the higher fatty acid derivative added is preferably from about 0.1 to about 10% by weight based on the total solid content of the image-recording layer.

(Plasticizer)

The image-recording layer according to the invention may contain a plasticizer. Preferable examples of the plasticizer include a phthalic acid ester, for example, dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalylethyl glycolate, methyl phthalylethyl glycolate, butyl phthalylbutyl glycolate or triethylene glycol dicaprylic acid ester; a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate. The content of the plasticizer is preferably about 30% by weight or less based on the total solid content of the image-recording layer.

(Fine Inorganic Particle)

The image-recording layer according to the invention may contain fine inorganic particle in order to increase strength of the cured layer in the image area The fine inorganic particle preferably includes, for example, silica, alumina, magnesium oxide, titanium oxide, magnesium carbonate, calcium alginate and a mixture thereof. Even if the fine inorganic particle has no light to heat converting property, it can be used, for example, for strengthening the layer or enhancing interface adhesion property due to surface roughening. The fine inorganic particle preferably has an average particle size from 5 nm to 10 μm, more preferably from 0.5 to 3 μm. In the range described above, it is stably dispersed in the image-recording layer, sufficiently maintains the film strength of the image-recording layer and can form the non-image area excellent in hydrophilicity and preventing from the occurrence of stain at the printing.

The fine inorganic particle described above is easily available as a commercial product, for example, colloidal silica dispersion.

The content of the fine inorganic particle is preferably 20% by weight or less, more preferably 10% by weight or less, based on the total solid content of the image-recording layer.

(Hydrophilic Low Molecular Weight Compound)

The image-recording layer according to the invention may contain a hydrophilic low molecular weight compound in order to improve the developing property. The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl ammonium hydrochloride.

[Lithographic Printing Plate Precursor]

Next, a method for preparation of a lithographic printing plate precursor is described in more detail below. The lithographic printing plate precursor of the invention comprises a undercoat layer, an image-recording layer and a support and is prepared by appropriately providing a protective layer or a backcoat layer depending on the use.

(Formation of Image-Recording Layer)

The image-recording layer according to the invention is formed by dispersing or dissolving each of the necessary constituting components described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The image-recording layer according to the invention may also be formed by preparing plural coating solutions by dispersing or dissolving the same or different components described above into the same or different solvents and conducting repeatedly plural coating and drying.

The coating amount (solid content) of the image-recording layer after the coating and drying may be varied depending on the use, but ordinarily, it is preferably from 0.3 to 3.0 g/m². In the range described above, the preferable sensitivity and good film property of the image-recording layer can be obtained.

Various methods can be used for the coating. Examples of the method include bar coater coating, spin coating, spray coating, curtain coating, dip coating, air knife coating, blade coating and roll coating.

(Support)

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0.1 to 0.6 mm, more preferably from 0.15 to 0.4 mm, still more preferably from 0.2 to 0.3 mm.

Prior to the use of aluminum plate, a surface treatment, for example, roughening treatment or anodizing treatment is preferably performed. The surface treatment facilitates improvement in the hydrophilic property and ensures adhesion between the image-recording layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast grinding method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$, more preferably from 1.5 to 4.0 g/m$^2$. In the range described above, good printing durability and favorable scratch resistance in the non-image area of lithographic printing plate can be achieved.

The aluminum plate subjected to the surface treatment and having the anodized film is used as it is as the support in the invention. However, in order to more improve an adhesion property to a layer provided thereon, hydrophilicity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and the sealing treatment with hot water are preferred.

The hydrophilizing treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461 and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among them, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion property of the hydrophilic layer to the support. As the antistatic layer, a polymer layer having fine particles of metal oxide or a matting agent dispersed therein described in JP-A-2002-79772 can be used.

The support preferably has a center line average roughness of its surface of 0.10 to 1.2 μm. In the range described above, good adhesion property to the image-recording layer, good printing durability, and good resistance to stain can be achieved.

The color density of the support is preferably from 0.15 to 0.65 in terms of the reflection density value. In the range described above, good image-forming property by preventing halation at the image exposure and good aptitude for plate inspection after development can be achieved.

(Protective Layer)

In the lithographic printing plate precursor according to the invention, a protective layer (oxygen-blocking layer) is preferably provided on the image-recording layer in order to prevent diffusion and penetration of oxygen which inhibits the polymerization reaction at the time of exposure. The protective layer for use in the invention preferably has oxygen permeability (A) at 25° C. under one atmosphere of $1.0 \leq (A) \leq 20$ (ml/m$^2$·day). When the oxygen permeability (A) is extremely lower than 1.0 (ml/m$^2$·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m$^2$·day), decrease in sensitivity may be incurred. The oxygen permeability (A) is more preferably in a range of $1.5 \leq (A) \leq 12$ (ml/m$^2$·day), still more preferably in a range of $2.0 \leq (A) \leq 10.0$ (ml/m$^2$·day). Besides the above described oxygen permeability, as for the characteristics required of the protective layer, it is desired that the protective layer does not substantially hinder the transmission of light for the exposure, is excellent in the adhesion property to the image-recording layer, and can be easily removed during a development step after the exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of the polyvinyl alcohol, those having a hydrolyzing rate of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, more preferably from 15 to 30% by weight, in the protective layer.

The components of the protective layer (selection of PVA and use of additives) and the coating amount are determined taking into consideration fogging prevention property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the polymer, for example, polyvinyl alcohol (PVA) is ordinarily from 2,000 to 10,000,000, preferably from 20,000 to 3,000,000.

As other additive of the protective layer, glycerin, dipropylene glycol or the like can be added in an amount corresponding to several % by weight of the polymer to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl phenyl ether can be added in an amount corresponding to several % by weight of the polymer.

The adhesion property of the protective layer to the image-recording layer and scratch resistance are also extremely important in view of handling of the printing plate precursor. Specifically, when a hydrophilic layer comprising a water-soluble polymer is laminated on the oleophilic image-recording layer, layer peeling due to an insufficient adhesion property is liable to occur, and the peeled portion causes such a defect as failure in curing of the image-recording layer due to polymerization inhibition by oxygen. Various proposals have been made for improving the adhesion property between the image-recording layer and the protective layer. For example, it is described in U.S. patent application Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the image-recording layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of image-recording layer.

The inorganic stratiform compound used here is a particle having a thin tabular shape and includes, for instance, mica, for example, natural mica represented by the following formula: A (B, C)$_{2-5}$D$_4$O$_{10}$ (OH, F, O)$_2$, (wherein A represents any one of K, Na and Ca, B and C each represents any one of Fe (II), Fe(III), Mn, Al, Mg and V, and D represents Si or Al) or synthetic mica; talc represented by the following formula: 3MgO.4SiO.H$_2$O; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite KMg$_3$(AlSi$_3$O$_{10}$)F$_2$ or potassium tetrasilic mica KMg$_{2.5}$(Si$_4$O$_{10}$)F$_2$, and swellable mica, for example, Na tetrasilic mica NaMg$_{2.5}$(Si$_4$O$_{10}$)F$_2$, Na or Li teniolite (Na, Li)Mg$_2$Li(Si$_4$O$_{10}$)F$_2$, or montmorillonite based Na or Li hectolite (Na, Li)$_{1/8}$Mg$_{2/5}$Li$_{1/8}$(Si$_4$O$_{10}$)F$_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and in order to compensate it, a cation, for example, Na$^+$, Ca$^{2+}$ or Mg$^{2+}$, is adsorbed between the lattice layers. The cation existing between the lattice layers is referred to as an exchangeable cation and is exchangeable with various cations. In particular, in the case where the cation between the lattice layers is Li+ or Na$^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water. The bentnite and swellable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm, preferably from 0.5 to 10 μm, particularly preferably from 1 to 5 μm. An average thickness of the particle is ordinarily 0.1 μm or less, preferably 0.05 μm or less, particularly preferably 0.01 μm or less. For example, in the swellable synthetic mica that is the representative compound of the inorganic stratiform compounds, thickness is approximately from 1 to 50 nm and plain size is approximately from 1 to 20 μm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/00 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added known additives for increasing adhesion property to the image-recording layer or for improving preservation stability of the coating solution.

The coating solution for protective layer thus-prepared is coated on the image-recording layer and then dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

The coating amount of the protective layer is preferably in a range of 0.05 to 10 g/m$^2$ in terms of the coating amount after drying. When the protective layer contains the inorganic stratiform compound, it is more preferably in a range of 0.1 to 0.5 g/m$^2$, and when the protective layer does not contain the inorganic stratiform compound, it is more preferably in a range of 0.5 to 5 g/m$^2$.

(Undercoat Layer)

In the lithographic printing plate precursor according to the invention, an undercoat layer may be provided between the image-recording layer and the support, if desired. The undercoat layer has the effect of strengthening the adhesion property between the support and the image-recording layer in the exposed area and the effect of facilitating separation of the image-recording layer from the support in the unexposed area, thereby improving the developing property.

As the compound for the undercoat layer, specifically, a silane coupling agent having an addition-polymerizable ethylenic double bond reactive group described in JP-A-10-

282679 and a phosphorus compound having an ethylenic double bond reactive group described in JP-A-2-304441 are preferably exemplified.

In the undercoat layer, known resins having a hydrophilic group can also be used. Specific examples of the resin include gum arabic, casein, gelatin, a starch derivative, carboxy methyl cellulose and a sodium salt thereof, cellulose acetate, sodium alginate, vinyl acetate-maleic acid copolymer, styrene-maleic acid copolymer, polyacrylic acid and a salt thereof, polymethacrylic acid and a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, a polyethylene glycol, a hydroxypropylene polymer, a polyvinyl alcohol, a hydrolyzed polyvinyl acetate having a hydrolysis degree of 60% by mole or more, preferably 80% by mole or more, polyvinyl formal, polyvinyl butyral, polyvinyl pyrrolidone, a homopolymer or copolymer of acrylamide, a homopolymer or polymer of methacrylamide, a homopolymer or copolymer of N-methylolacrylamide, polyvinyl pyrrolidone, an alcohol-soluble nylon, a polyether of 2,2-bis-(4-hydroxyphenyl)propane and epichlorohydrin.

The polymer compound for use in the undercoat layer preferably has adsorptivity to the surface of support. Whether the adsorptivity to the surface of support is present or not can be judged, for example, by the following method.

Specifically, a test compound is dissolved in a solvent in which the test compound is easily soluble to prepare a coating solution, and the coating solution is coated and dried on a support so as to have the coating amount after drying of 30 mg/m$^2$. After thoroughly washing the support coated with the test compound using the solvent in which the test compound is easily soluble, the residual amount of the test compound that has not been removed by the washing is measured to calculate the adsorption amount to the support. For measurement of the residual amount, the amount of the residual test compound may be directly determined, or it may be calculated from the amount of the test compound dissolved in the washing solution. The determination for the compound can be performed, for example, by fluorescent X-ray measurement, reflection spectral absorbance measurement or liquid chromatography measurement. The compound having the adsorptivity to support means a compound that remains by 1 mg/m$^2$ or more even after conducting the washing treatment described above.

Impartation of the adsorptivity to the surface of support to the polymer compound can be performed by introduction of the adsorbing group into the polymer compound. The adsorbing group to the surface of support is a functional group capable of forming a chemical bond (for example, an ionic bond, a hydrogen bond, a coordinate bond or a bond with intermolecular force) with a substance (for example, metal or metal oxide) or a functional group (for example, a hydroxy group) present on the surface of support. The adsorbing group is preferably an acid group or a cationic group.

The acid group preferably has an acid dissociation constant (pKa) of 7 or less. Examples of the acid group include a phenolic hydroxy group, a carboxyl group, —SO$_3$H, —OSO$_3$H, —PO$_3$H$_2$, —OPO$_3$H$_2$, —CONHSO$_2$—, —SO$_2$NHSO$_2$— and —COCH$_2$COCH$_3$. Among them, a phosphoric acid group (—OPO$_3$H$_2$ or —PO$_3$H$_2$) is particularly preferred. The acid group may be the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and iodonium group. Among them, the ammonium group, phosphonium group and sulfonium group are preferred, the ammonium group and phosphonium group are more preferred, and the ammonium group is most preferred.

In order to introduce the adsorbing group into the polymer compound, a monomer having an adsorbing group is used. Preferable examples of the monomer having the adsorbing group include compounds represented by the following formula (VII) or (VIII):

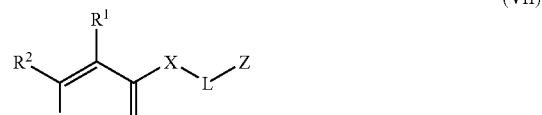

(VII)

(VIII)

In formulae (VII) and (VIII), $R^1$, $R^2$ and $R^3$ each independently represents a hydrogen atom, a halogen atom or an alkyl group having from 1 to 6 carbon atoms. $R^1$ and $R^2$ and $R^3$ each independently represents preferably a hydrogen atom or an alkyl group having from 1 to 6 carbon atoms, more preferably a hydrogen atom or an alkyl group having from 1 to 3 carbon atoms, and most preferably a hydrogen atom or a methyl group. It is particularly preferred that $R^2$ and $R^3$ each represents a hydrogen atom.

X represents an oxygen atom (—O—) or imino group (—NH—). Preferably, X represents an oxygen atom.

L represents a divalent connecting group. It is preferred that L represents a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted arylene group), a divalent heterocyclic group or a combination of each of the groups described above with an oxygen atom (—O—), a sulfur atom (—S—), an imino group (—NH—), a substituted imino group (—NR—, wherein R represents an aliphatic group, an aromatic group or a heterocyclic group) or a carbonyl group (—CO—).

The aliphatic group may form a cyclic structure or a branched structure. The number of carbon atoms of the aliphatic group is preferably from 1 to 20, more preferably from 1 to 15, most preferably from 1 to 10. It is preferred that the aliphatic group is a saturated aliphatic group rather than an unsaturated aliphatic group. The aliphatic group may have a substituent. Examples of the substituent include a halogen atom, a hydroxy group, an aromatic group and a heterocyclic group.

The number of carbon atoms of the aromatic group is preferably from 6 to 20, more preferably from 6 to 15, most preferably from 6 to 10. The aromatic group may have a substituent. Examples of the substituent include a halogen atom, a hydroxy group, an aliphatic group, an aromatic group and a heterocyclic group.

It is preferred that the heterocyclic group has a 5-membered or 6-membered ring as the hetero ring. Other heterocyclic ring, an aliphatic ring or an aromatic ring may be condensed to the heterocyclic ring. The heterocyclic group may have a substituent. Examples of the substituent include a halogen atom, a hydroxy group, an oxo group (=O), a thioxo group (=S), an imino group (=NH), a substituted imino group (=N—R, where R represents an aliphatic group, an aromatic group or a heterocyclic group), an aliphatic group, an aromatic group and a heterocyclic group.

It is preferred that L represents a divalent connecting group containing a plurality of polyoxyalkylene structures. It is more preferred that the polyoxyalkylene structure is a polyoxyethylene structure. Specifically, it is preferred that L contains —(OCH$_2$CH$_2$)$_n$— (n is an integer of 2 or more).

Z represents a functional group adsorbing to the hydrophilic surface of support. The adsorptive functional group is the same as that described above.

Y represents a carbon atom or a nitrogen atom. In the case where Y is a nitrogen atom and L is connected to Y to form a quaternary pyridinium group, Z is not mandatory, because the quaternary pyridinium group itself exhibits the adsorptivity.

Representative examples of the monomer represented by formula (VII) or (VIII) are set forth below.

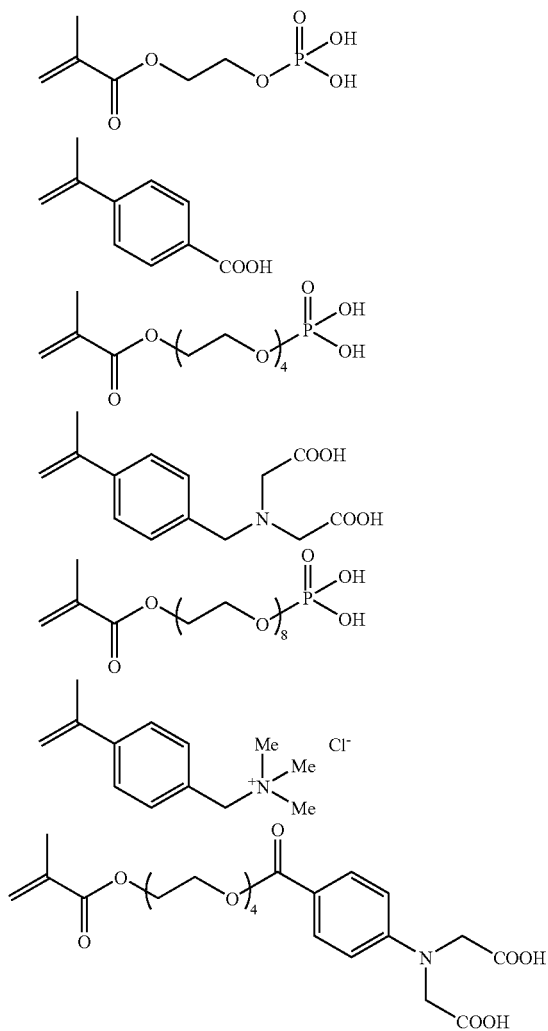

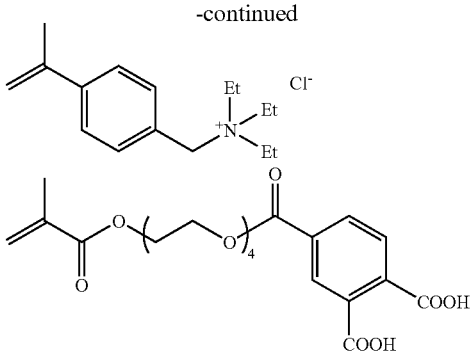

-continued

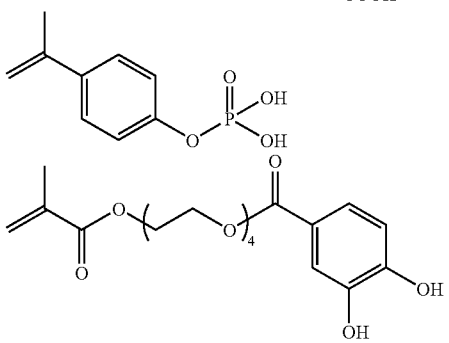

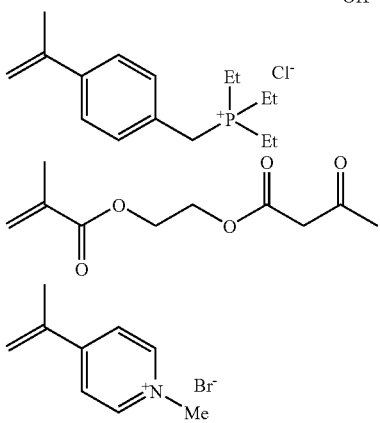

It is preferred that the polymer compound for use in the undercoat layer further has a hydrophilic group. Examples of the hydrophilic group includes a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

In the case of using the binder polymer containing a cationic group in its side chain in the image-recording layer according to the invention, as the hydrophilic group of the polymer compound for undercoat layer which interacts with the cationic group, an anionic group, for example, a carboxyl group, a carboxylate group, a sulfonic acid group or a phosphoric acid group is preferable.

It is preferred that the polymer compound for undercoat layer used in the invention further has a crosslinkable group. The crosslinkable group acts to improve the adhesion property to the image area. In order to impart the crosslinking property to the polymer compound for undercoat layer, introduction of a crosslinkable functional group, for example, an ethylenically unsaturated bond into the side chain of the polymer or introduction by formation of a salt structure between a polar substituent of the polymer compound and a compound containing a substituent having a counter charge to the polar substituent of the polymer compound and an ethylenically unsaturated bond is used.

Examples of the monomer having the ethylenically unsaturated bond in the molecule thereof include a monomer of an ester or amide of acrylic acid or methacrylic acid, wherein the ester or amide residue (R in —COOR or —CONHR) has the ethylenically unsaturated bond.

Examples of the residue (R described above) having an ethylenically unsaturated bond include —(CH$_2$)$_n$CR$_1$=CR$_2$R$_3$, —(CH$_2$O)$_n$CH$_2$CR$_1$=CR$_2$R$_3$, —(CH$_2$CH$_2$O)$_n$CH$_2$CR$_1$=CR$_2$R$_3$, —(CH$_2$)$_n$NH—CO—O—CH$_2$CR$_1$=CR$_2$R$_3$, —(CH$_2$)$_n$—O—CO—CR$_1$=CR$_2$R$_3$ and —(CH$_2$CH$_2$O)$_2$—X (wherein R$_1$ to R$_3$ each represents a hydrogen atom, a halogen atom or an alkyl group having from 1 to 20 carbon atoms, an aryl group, alkoxy group or aryloxy group, or R$_1$ and R$_2$ or R$_1$ and R$_3$ may be combined with each other to form a ring. n represents an integer of 1 to 10. X represents a dicyclopentadienyl residue).

Specific examples of the ester residue include —CH$_2$CH=CH$_2$, —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NH-COO—CH$_2$CH=CH$_2$ and —CH$_2$CH$_2$O—X (wherein X represents a dicyclopentadienyl residue).

Specific examples of the amide residue include —CH$_2$CH=CH$_2$, —CH$_2$CH$_2$O—Y (wherein Y represents a cyclohexene residue) and —CH$_2$CH$_2$OCO—CH=CH$_2$.

The content of the crosslinkable group in the polymer compound for undercoat layer (content of the radical polymerizable unsaturated double bond determined by iodine titration) is preferably from 0.1 to 10.0 mmol, more preferably from 1.0 to 7.0 mmol, most preferably from 2.0 to 5.5 mmol, based on 1 g of the polymer compound. In the range described above, preferable compatibility between the sensitivity and stain resistance and good preservation stability can be achieved.

As the polymer compound for undercoat layer, a polymer including a monomer unit having an adsorbing group and a monomer unit having a hydrophilic group is preferable and a polymer including a monomer unit having an adsorbing group, a monomer unit having a hydrophilic group and a monomer unit having a crosslinkable group is particularly preferable.

Specific examples of the polymer compound for undercoat layer are set forth below, but the invention should not be construed as being limited thereto.

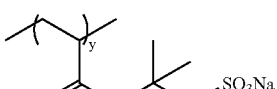

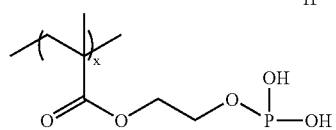

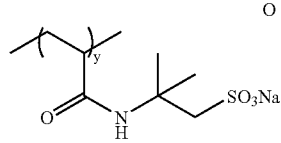

-continued

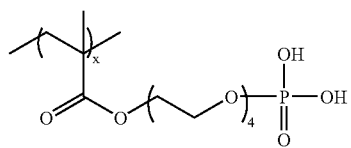

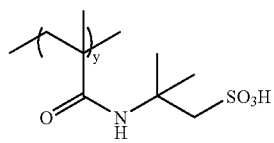

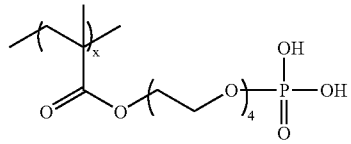

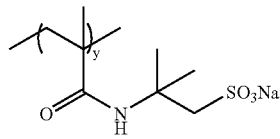

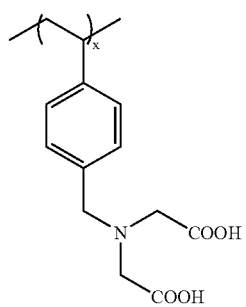

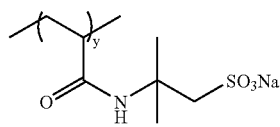

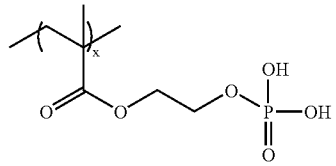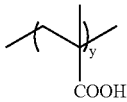

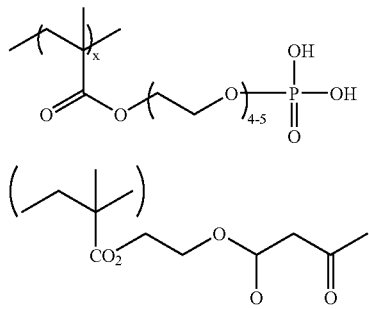

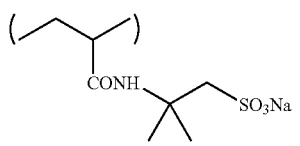

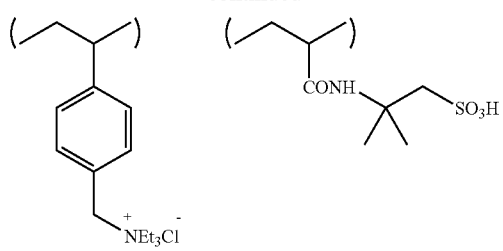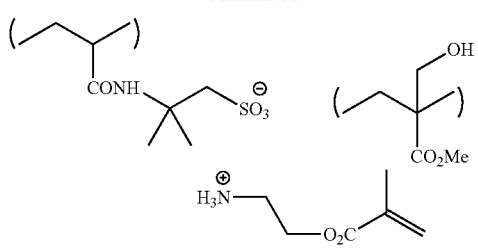

-continued

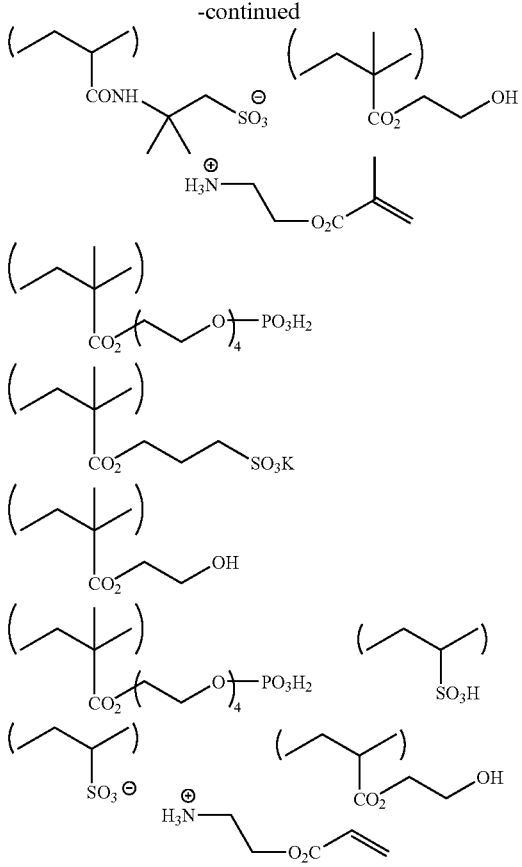

Further, a copolymer including a repeating unit having an ethylenically unsaturated bond or the like described in JP-A-2005-125749 is also preferably used.

The weight average molecular weight of the polymer compound for undercoat layer is preferably 5,000 or more, more preferably from 10,000 to 300,000. The number average molecular weight of the polymer compound is preferably 1,000 or more, more preferably from 2,000 to 250,000. The polydispersity (weight average molecular weight/number average molecular weight) thereof is preferably from 1.1 to 10.

The polymer compound for undercoat layer may be any of a random polymer, a block polymer, a graft polymer and the like, and is preferably a random polymer.

The polymer compounds for undercoat layer may be used individually or in a mixture of two or more thereof.

The coating amount (solid content) of the undercoat layer is preferably from 0.1 to 100 mg/m$^2$, more preferably from 1 to 30 mg/m$^2$.

(Backcoat Layer)

After applying the surface treatment to the support or forming an undercoat layer on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-34174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Processing Method of Lithographic Printing Plate Precursor]

According to the processing method of a lithographic printing plate precursor of the invention, the lithographic printing plate precursor according to the invention is exposed imagewise by a light source of an appropriate wavelength and then subjected to development processing with an aqueous solution having pH of 2 to 10 and containing an amphoteric surfactant and an anionic surfactant selected from an anionic surfactant having an aliphatic chain and a total number of carbon atoms included in the aliphatic chain of 6 or more and an anionic surfactant having an aromatic ring and a total number of carbon atoms of 12 or more, wherein the content of the anionic surfactant is from 0.1 to 3.3% by weight of the aqueous solution, thereby removing the image-recording layer of the non-image area to form an image on the support.

Further, in a plate-making process to prepare a lithographic printing plate from the lithographic printing plate precursor according to the invention, the entire surface of the lithographic printing plate precursor may be heated, if desired, before or during the exposure or between the exposure and the development. By the heating, the image-forming reaction in the image-recording layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that undesirable fog occurs in the non-image area. On the other hand, the heating after the development can be performed using a very strong condition. Ordinarily, the heat treatment is carried out in a temperature range of 200 to 500° C. When the temperature is too low, a sufficient effect of strengthening the image may not be obtained, whereas when it is excessively high, problems of deterioration of the support and thermal decomposition of the image area may occur.

The plate-making process is described in more detail below.

In the invention, although the development processing can be carried out just after the exposure step, the heat treatment step may intervene between the exposure step and the development step as described above. The heat treatment is effective for increasing the printing durability and improving uniformity of the image curing degree in the entire surface of printing plate precursor. The conditions of the heat treatment can be appropriately determined in a range for providing such effects. Examples of the heating means include a conventional convection oven, an IR irradiation apparatus, an IR laser, a microwave apparatus or a Wisconsin oven. For instance, the heat treatment can be conducted by maintaining the printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the above-described range, the effects described above are efficiently achieved and an adverse affect, for example, change in shape of the printing plate precursor due to the heat can be preferably avoided.

According to the invention, the development processing step is conducted after the exposure step, preferably after the exposure step and the heat treatment step to prepare a lithographic printing plate. It is preferable that a plate setter used in the exposure step, a heat treatment means used in the heat treatment step and a development apparatus used in the development processing step are connected with each other and the lithographic printing plate precursor is subjected to automatically continuous processing. Specifically, a plate-making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate-making line is blinded by a filter, a cover or the like.

After the image formation as described above, the entire surface of lithographic printing plate may be exposed to active ray, for example, ultraviolet light to accelerate curing of the image area. As a light source for the entire surface exposure, for example, a carbon arc lamp, a mercury lamp, a gallium lamp, a metal halide lamp, a xenon lamp, a tungsten lamp or various laser beams are exemplified. In order to obtain sufficient printing durability, the amount of the entire surface exposure is preferably 10 mJ/cm$^2$ or more, more preferably 100 mJ/cm$^2$ or more.

Heating may be performed at the same time with the entire surface exposure. By performing the heating, further improvement in the printing durability is recognized. Examples of the heating means include a conventional convection oven, an IR irradiation apparatus, an IR laser, a microwave apparatus or a Wisconsin oven. The plate surface temperature at the heating is preferably from 30 to 150° C., more preferably from 35 to 130° C., still more preferably from 40 to 120° C.

In advance of the above-described development processing, the lithographic printing plate precursor is imagewise exposed through a transparent original having a line image, a halftone dot image or the like, or imagewise exposed, for example, by scanning of laser beam based on digital data.

The desirable wavelength of the light source is from 350 to 450 nm, and specifically, an InGaN semiconductor laser is preferably used. The exposure mechanism may be any of an internal drum system, an external drum system and a flat bed system.

Other examples of the exposure light source which can be used in the invention include an ultra-high pressure mercury lamp, a high pressure mercury lamp, a medium pressure mercury lamp, a low pressure mercury lamp, a chemical lamp, a carbon arc lamp, a xenon lamp, a metal halide lamp, various visible or ultraviolet laser lamps, a fluorescent lamp, a tungsten lamp and sunlight.

As for the available laser light source of 350 to 450 nm, the followings can be used.

A gas laser, for example, Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW); a solid laser, for example, a combination of Nd:YAG (YVO$_4$) with SHG crystals×twice (355 nm, 5 mW to 1 W) and a combination of Cr:LiSAF with SHG crystal (430 nm, 10 mW); a semiconductor laser system, for example, a KNbO$_3$ ring resonator (430 nm, 30 mW), a combination of a waveguide-type wavelength conversion element with an AlGaAs or InGaAs semiconductor (380 nm to 450 nm, 5 mW to 100 mW), a combination of a waveguide-type wavelength conversion element with an AlGaInP or AlGaAs semiconductor (300 nm to 350 nm, 5 mW to 100 mW), and AlGaInN (350 nm to 450 nm, 5 mW to 30 mW); a pulse laser, for example, N$_2$ laser (337 nm, pulse 0.1 to 10 mJ) and XeF (351 nm, pulse 10 to 250 mJ) can be used. Among the light sources, the AlGaInN semiconductor laser (commercially available InGaN semiconductor laser, 400 to 410 nm, 5 to 30 mW) is particularly preferable in view of the wavelength characteristics and cost.

The laser used in the invention also includes an infrared laser. The infrared laser for use in the invention is not particularly restricted and, for example, a solid laser or semiconductor laser emitting an infrared ray having a wavelength of 760 to 1,200 nm is preferably exemplified. The output of the infrared laser is preferably 100 mW or more. Further, in order to shorten the exposure time, it is preferred to use a multibeam laser device.

The exposure time per pixel is preferably within 20 microseconds, and the irradiation energy is preferably from 10 to 300 mJ/cm$^2$.

As for the exposure apparatus for the lithographic printing plate precursor of scanning exposure system, the exposure mechanism includes an internal drum system, an external drum system and a flat bed system. As the light source, among the light sources described above, those capable of conducting continuous oscillation can be preferably utilized. In practice, the exposure apparatuses described below are particularly preferable in view of the relationship between the sensitivity of lithographic printing plate precursor (photosensitive material) and the time for plate-making.

A single beam to triple beam exposure apparatus of internal drum system, using one or more gas or solid laser light sources so as to provide a semiconductor laser having a total output of 20 mW or more A multi-beam (from 1 to 10 beams) exposure apparatus of flat bed system, using one or more semiconductor, gas or solid lasers so as to provide a total output of 20 mW or more A multi-beam (from 1 to 9 beams) exposure apparatus of external drum system, using one or more semiconductor, gas or solid lasers so as to provide a total output of 20 mW or more A multi-beam (10 or more beams) exposure apparatus of external drum system, using one or more semiconductor or solid lasers so as to provide a total output of 20 mW or more In the laser direct drawing-type lithographic printing plate precursor, the following equation (eq 1) is ordinarily established among the sensitivity X (J/cm$^2$) of photosensitive material, the exposure area S (cm$^2$) of photosensitive material, the power q (W) of one laser light source, the number n of lasers and the total exposure time t (s):

$$X \cdot S = n \cdot q \cdot t \qquad (\text{eq 1})$$

i) In the case of the internal drum (single beam) system

The following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \qquad (\text{eq 2})$$

ii) In the case of the external drum (multi-beam) system

The following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \qquad (\text{eq 3})$$

iii) In the case of the flat bed (multi-beam) system

The following equation (eq 4) is ordinarily established among the revolution number H (radian/s) of polygon mirror, the sub-scanning length Lx (cm) of photosensitive material, the resolution Z (dot/cm), the total exposure time t (s) and the number (n) of beams:

$$H \cdot Z \cdot n \cdot t = Lx \qquad (eq\ 4)$$

When the resolution (2,560 dpi) required for a practical printing plate, the plate size (A1/B1, sub-scanning length: 42 inch), the exposure condition of about 20 sheets/hour and the photosensitive characteristics (photosensitive wavelength, sensitivity: about 0.1 mJ/cm$^2$) of the lithographic printing plate precursor according to the invention are substituted for the above equations, it can be understood that the lithographic printing plate precursor according to the invention is preferably combined with a multi-beam exposure system using a laser having a total output of 20 mW or more, and on taking account of operability, cost and the like, it is most preferably combined with an external drum system semiconductor laser multi-beam (10 or more beams) exposure apparatus.

[Development Processing Solution]

The development processing solution (hereinafter, also simply referred to as a "processing solution" or a "developer") for use in the processing method of a lithographic printing plate precursor according to the invention is characterized by being an aqueous solution having pH of 2 to 10 and containing an amphoteric surfactant and an anionic surfactant selected from an anionic surfactant having an aliphatic chain and a total number of carbon atoms included in the aliphatic chain of 6 or more and an anionic surfactant having an aromatic ring and a total number of carbon atoms of 12 or more, wherein the content of the anionic surfactant is from 0.1 to 3.3% by weight of the aqueous solution.

The amphoteric surfactant for use in the developer according to the invention is a compound having an anionic site and a cationic site in the same molecule, as well known in the field of surfactant, and includes amphoteric surfactants of amino acid type, betaine type and amineoxide type. As the amphoteric surfactant for use in the developer according to the invention, the compound represented by formula <1> shown below and the compound represented by formula <2> shown below are preferable.

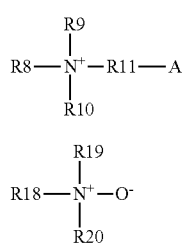

In formula <1>, R8 represents an alkyl group, R9 and R10 each represents a hydrogen atom or an alkyl group, R11 represents an alkylene group, and A represents a carboxylate ion or a sulfonate ion.

In formula <2>, R18, R19 and R20 each represents a hydrogen atom or an alkyl group, provided that all of R18, R19 and R20 are not hydrogen atoms at the same time.

In formula <1>, the alkyl group represented by R8, R9 or R10 or the alkylene group represented by R11 may be a straight chain or branched structure and may contain a connecting group in the chain thereof and a substituent. As the connecting group, a connecting group containing a hetero atom, for example, an ester bond, an amido bond or an ether bond is preferable. As the substituent, for example, a hydroxy group, an ethyleneoxide group, a phenyl group, an amido group or a halogen atom is preferable.

In the compound represented by formula <1>, as the total number of carbon atoms increases, the hydrophobic portion becomes large and dissolution of the compound in an aqueous developer becomes difficult. In such a case, the dissolution is improved by adding a dissolution auxiliary agent, for example, an organic solvent such as an alcohol. However, when the total number of carbon atoms excessively increases, the surfactant can not be dissolved in a proper mixing range in some cases. Therefore, the total number of carbon atoms included in R8 to R11 is preferably from 8 to 25, more preferably from 11 to 21.

In formula <2>, the alkyl group represented by R18, R19 or R20 may be a straight chain or branched structure and may contain a connecting group in the chain thereof and a substituent. As the connecting group, a connecting group containing a hetero atom, for example, an ester bond, an amido bond or an ether bond is preferable. As the substituent, for example, a hydroxy group, an ethyleneoxide group, a phenyl group, an amido group or a halogen atom is preferable.

In the compound represented by formula <2>, as the total number of carbon atoms increases, the hydrophobic portion becomes large and dissolution of the compound in an aqueous developer becomes difficult. In such a case, the dissolution is improved by adding a dissolution auxiliary agent, for example, an organic solvent such as an alcohol. However, when the total number of carbon atoms excessively increases, the surfactant can not be dissolved in a proper mixing range in some cases. Therefore, the total number of carbon atoms included in R18 to R20 is preferably from 8 to 22, more preferably from 10 to 20.

The total number of carbon atoms in the amphoteric surfactant is influenced by a material, especially, a binder, used in the image-recording layer. When a binder having high hydrophilicity is used, it tends to be preferable that the total number of carbon atoms is relatively small. On the other hand, when a binder having low hydrophilicity is used, it tends to be preferable that the total number of carbon atoms is large.

Specific preferable examples of the amphoteric surfactant for use in the developer are set forth below, but the invention should not be construed as being limited thereto.

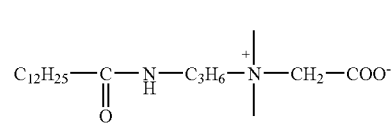

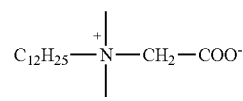

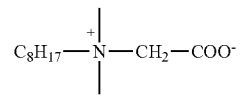

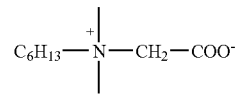

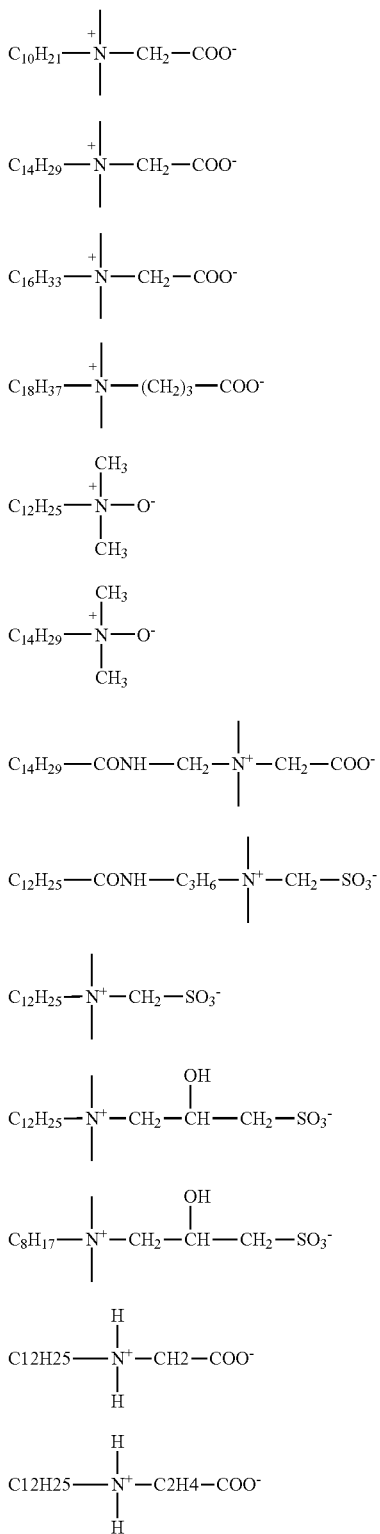

The amount of the amphoteric surfactant added to the developer is not particularly restricted and preferably from 1 to 50% by weight, particularly preferably from 3 to 30% by weight, most preferably from 5 to 15% by weight.

The anionic surfactant for use in the developer according to the invention is an anionic surfactant selected from an anionic surfactant having an aliphatic chain and a total number of carbon atoms included in the aliphatic chain of 6 or more and an anionic surfactant having an aromatic ring and a total number of carbon atoms of 12 or more.

As such an anionic surfactant, an appropriate compound may be used. Of the anionic surfactants having an aliphatic chain and a total number of carbon atoms included in the aliphatic chain of 6 or more, those having a total number of carbon atoms included in the aliphatic chain of 8 or more are more preferable. Of the anionic surfactant having an aromatic ring and a total number of carbon atoms of 12 or more, those having a total number of carbon atoms of 14 or more are more preferable.

As the anionic surfactant having an aliphatic chain and a total number of carbon atoms included in the aliphatic chain of 6 or more, anionic surfactants selected from compounds represented by formula <4> or <5> shown below are preferable.

$$C_lH_{2l+1}-X \qquad <4>$$

$$C_{n-m}H_{2(n-m)+l}OC_mH_{2m}-X \qquad <5>$$

In formulae <4> or <5>, l, n and m each represents an integer satisfying $l \geqq 6$, $n \geqq 6$ and $n \geqq m \geqq 0$, and X represents a sulfonate, a sulfuric monoester salt, a carboxylate or a phosphate.

As the anionic surfactant having an aromatic ring and a total number of carbon atoms of 12 or more, anionic surfactants selected from compounds represented by formulae <6> to <9> shown below are preferable.

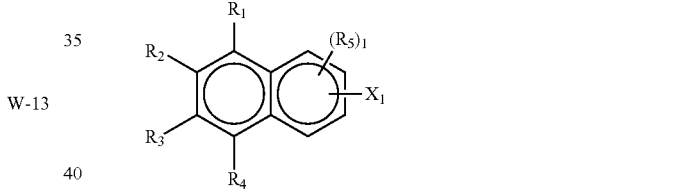

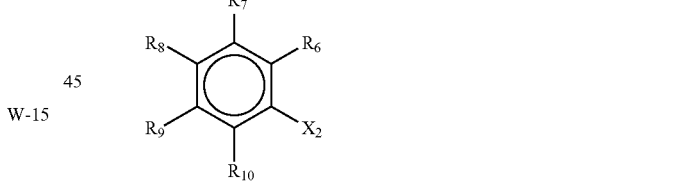

In formulae <6> and <7>, $R_1$ to $R_{10}$ each represents a hydrogen atom, an alkyl group or an alkyl group containing an oxygen atom; l represents an integer of 1 to 3, $X_1$ and $X_2$ each represents a sulfonate, a sulfuric monoester salt, a carboxylate or a phosphate, and provided that a total number of carbon atoms included in formula <6> or <7> is 12 or more.

The alkyl group containing an oxygen atom represented by any one of $R_1$ to $R_{10}$ in formulae <6> and <7> include an alkyl group containing an oxygen atom at its terminal and/or in its chain and a group represented by formula (A) shown below.

$$-C_mH_{2m}OC_{n-m}H_{2(n-m)+l} \qquad (A)$$

(wherein n and m each represents an integer, provided that $n \geqq 2$, $n \geqq m \geqq 0$)

The alkyl group or the alkyl chain in the alkyl group containing an oxygen atom represented by any one of $R_1$ to $R_{10}$ in formulae <6> and <7> may be a straight chain or branched structure and may contain a substituent. As the substituent, for example, a halogen atom, an ethyleneoxide group, a phenyl group and an amido group are exemplified.

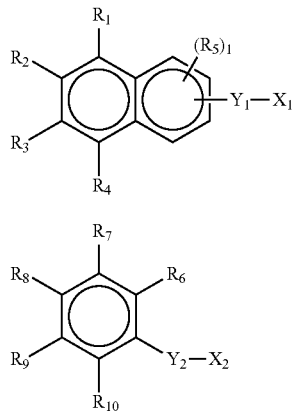

<8>

<9>

In formulae <8> and <9>, $R_1$ to $R_{10}$ each represents a hydrogen atom or an alkyl group, l represents an integer of 1 to 3, $X_1$ and $X_2$ each represents a sulfonate, a sulfuric monoester salt, a carboxylate or a phosphate, $Y_1$ and $Y_2$ each represents —$C_nH_{2n}$—, —$C_{n-m}H_{2(n-m)}OC_mH_{2m}$—, —O—($CH_2CH_2O)_n$—, —O—($CH_2CH_2CH_2O)_n$— or —CO—NH—, wherein n and m each represents an integer, provided that $n \geq 1$ and $n \geq m \geq 0$ and provided that a total number of carbon atoms included in formula <8> or <9> is 12 or more.

The alkyl group represented by any one of $R_1$ to $R_{10}$ in formulae <8> and <9> may be a straight chain or branched structure and may contain a substituent. As the substituent, for example, a halogen atom, an ethyleneoxide group, a phenyl group and an amido group are exemplified.

Specific preferable examples of the anionic surfactant for use in the developer are set forth below, but the invention should not be construed as being limited thereto.

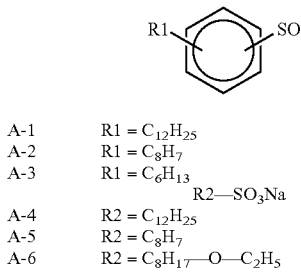

| A-1 | R1 = $C_{12}H_{25}$ |
| A-2 | R1 = $C_8H_7$ |
| A-3 | R1 = $C_6H_{13}$ |
| A-4 | R2 = $C_{12}H_{25}$ |
| A-5 | R2 = $C_8H_7$ |
| A-6 | R2 = $C_8H_{17}$—O—$C_2H_5$ |

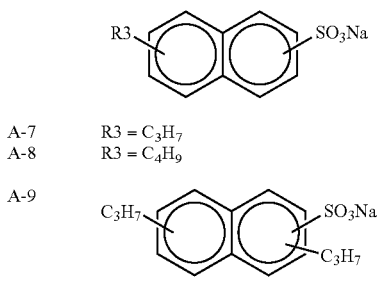

| A-7 | R3 = $C_3H_7$ |
| A-8 | R3 = $C_4H_9$ |
| A-9 | |

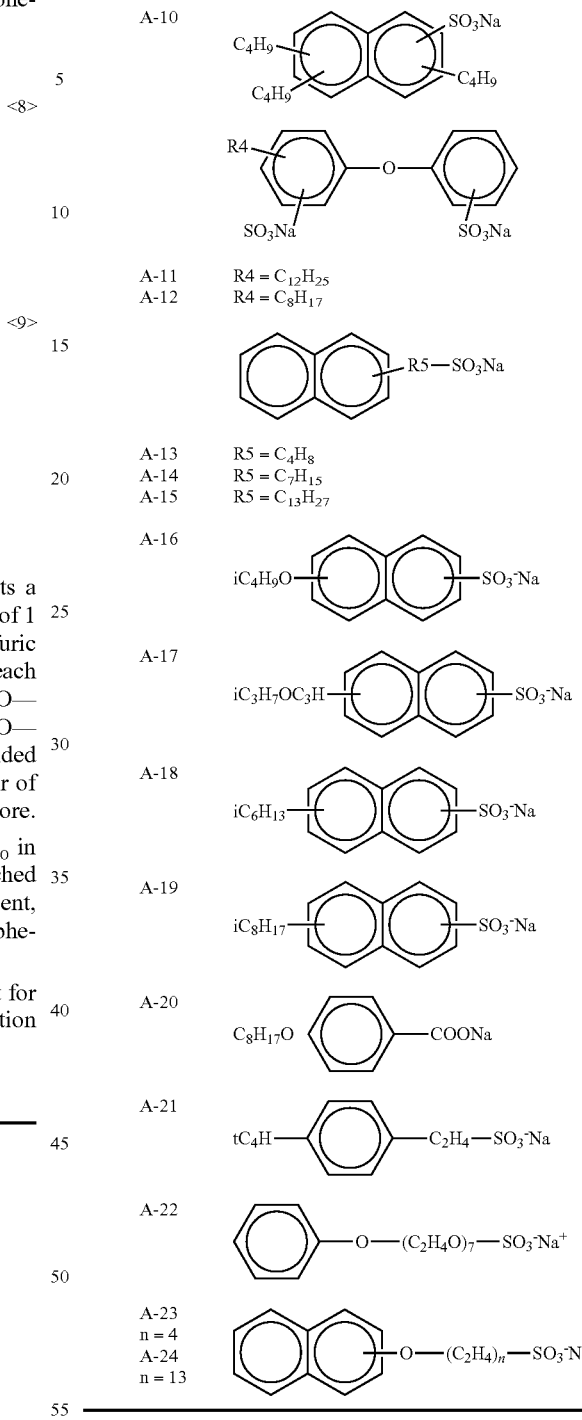

| A-11 | R4 = $C_{12}H_{25}$ |
| A-12 | R4 = $C_8H_{17}$ |

| A-13 | R5 = $C_4H_8$ |
| A-14 | R5 = $C_7H_{15}$ |
| A-15 | R5 = $C_{13}H_{27}$ |

A-23 n = 4
A-24 n = 13

The amount of the anionic surfactant added to the developer is not particularly restricted and suitably from 0.1 to 3.3% by weight, preferably from 0.3 to 3% by weight, particularly preferably from 0.5 to 1.5% by weight.

In the development processing solution according to the invention, a ratio of the anionic surfactant to the amphoteric surfactant is preferably from 0.1 to 50% by weight, more preferably from 1.0 to 30% by weight, still more preferably from 3.0 to 20% by weight.

It is also preferred that any of the amphoteric surfactant and anionic surfactant for use in the development processing solution according to the invention is not a polymer and the molecular weight thereof is preferably from 50 to 5,000, more preferably from 100 to 3,000, still more preferably from 120 to 1,000.

The development processing solution according to the invention may contain a water-soluble polymer compound in addition to the above-described specific surfactants so that an oil-desensitization treatment can be simultaneously performed with the development processing. Needless to say, the lithographic printing plate precursor is developed with the solution containing no water-soluble polymer compound and then subjected to the oil-desensitization treatment with an aqueous solution containing the water-soluble polymer compound.

The water-soluble polymer compound for use in the development processing solution includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those conventionally known can be used. For example, as a commercial product, Soyafive (trade name, produced by Fuji Oil Co., Ltd.) is available and various grade products can be used. The soybean polysaccharide preferably used has viscosity in a range of 10 to 100 mPa/sec in a 10% by weight aqueous solution thereof.

As the modified starch, those represented by formula (III) shown below are preferable. As starch for the modified starch represented by formula (III), any starch, for example, of corn, potato, tapioca, rice or wheat can be used. The modification of starch can be performed by a method wherein starch is decomposed, for example, with an acid or an enzyme to an extent that the number of glucose residue per molecule is from 5 to 30 and then oxypropylene is added thereto in an alkali.

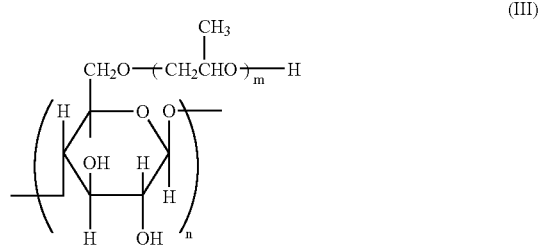

(III)

In formula (III), the etherification degree (substitution degree) is in a range of 0.05 to 1.2 per glucose unit, n represents an integer of 3 to 30, and m represents an integer of 1 to 3.

Of the water-soluble polymer compound, for example, soybean polysaccharide, modified starch, gum arabic, dextrin, carboxymethyl cellulose or polyvinyl alcohol is particularly preferable.

Two or more of the water-soluble polymer compounds may be used in combination. The content of the water-soluble polymer compound is preferably from 0.1 to 20% by weight, more preferably from 0.5 to 10% by weight, in the processing solution.

The processing solution according to the invention may contain a wetting agent, an antiseptic agent, a chelating agent, a defoaming agent, an organic acid, an organic solvent, an inorganic acid, an inorganic salt or the like, in addition to the above components.

As the wetting agent, for example, ethylene glycol, propylene glycol, triethylene glycol, butylene glycol, hexylene glycol, diethylene glycol, dipropylene glycol, glycerin, trimethylol propane or diglycerin is preferably used. The wetting agents may be used individually or in combination of two or more thereof. The wetting agent is ordinarily used in an amount of 0.1 to 5% by weight based on the total weight of the processing solution.

As the antiseptic agent, for example, phenol or a derivative thereof, formalin, an imidazole derivative, sodium dehydroacetate, a 4-isothiazolin-3-one derivative, benzisotiazolin-3-one, 2-methyl-4-isothiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative or a nitrobromoalcohol-based compound, e.g., 2-bromo-2-nitropropane-1,3-diol, 1,1-dibromo-1-nitro-2-ethanol or 1,1-dibromo-1-nitro-2-propanol is preferably used.

The amount of the antiseptic agent added is an amount stably exerts the effect to bacterium, molds, yeast or the like. Although the amount of the antiseptic agent may be varied depending on the kind of the bacterium, molds, yeast or the like, it is preferably in a range of 0.01 to 4% by weight based on the processing solution at the time of use. Also, it is preferred to use two or more kinds of the antiseptic agents so as to exert the effect to various molds and bacteria.

As the chelating agent, for example, ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof; organic phosphonic acids, for example, 1-hydroxyethane-1,1-diphosphonic acid, potassium salt thereof, sodium salt thereof, aminotri(methylenephosphonic acid), potassium salt thereof, sodium salt thereof; and phosphonoalkanetricarboxylic acids are illustrated. A salt of an organic amine is also effectively used in place of the sodium salt or potassium salt in the chelating agent.

The chelating agent is so selected that it is stably present in the processing solution and does not impair the printing property. The amount of the chelating agent added is preferably from 0.001 to 1.0% by weight based on the processing solution at the time of use.

As the defoaming agent, for example, a conventional silicone-based self-emulsifying type or emulsifying type defoaming agent, or a nonionic surfactant having HLB of 5 or less is used. The silicone defoaming agent is preferably used. Any of emulsifying dispersing type and solubilizing type can be used.

Since the processing solution according to the invention contains the specific anionic surfactant as described above and has a tendency of foam, it is preferred to use the defoaming agent.

The amount of the defoaming agent is preferably in a range of 0.001 to 1.0% by weight based on the processing solution at the time of use.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid or an organic phosphonic acid is illustrated. The organic acid can also be used in the form of an alkali metal salt or an ammonium salt. The amount of the organic acid added is preferably from 0.01 to 0.5% by weight based on the total weight of the processing solution.

The organic solvent include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) and a polar solvent.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

Further, when the organic solvent is insoluble in water, it may be employed by being solubilized in water using a surfactant or the like. In the case where the developer contains the organic solvent, the concentration of the organic solvent is desirably less than 40% by weight in view of safety and inflammability.

As the inorganic acid or inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate or nickel sulfate is illustrated. The amount of the inorganic acid or inorganic salt added is preferably from 0.01 to 0.5% by weight based on the total weight of the processing solution.

The processing solution for use in the invention can be obtained by dissolving or dispersing the above-described components according to need in water. The solid concentration of the processing solution is preferably from 2 to 25% by weight. It is also possible to prepare a concentrated solution and to dilute the concentrated solution with water at the time of use.

From the standpoint of the developing property, the pH of the processing solution for use in the invention is suitably from 2.0 to 10.0, preferably from 3.0 to 7.0, more preferably from 3.5 to 6.5, particularly preferably from 3.5 to 5.5.

In order to bring the processing solution into contact with the lithographic printing plate precursor, a treatment with hand, an immersion treatment and a treatment by a machine, for example, a horizontal transportation processing and the like are exemplified.

The exposed lithographic printing plate precursor is heated in a pre-heating unit provided in advance of the development. It is preferred that the lithographic printing plate precursor is introduced into the pre-heating unit within one minute after the exposure to undergo heating. The heating temperature is ordinarily from 50 to 150° C.

After the pre-heating, the lithographic printing plate precursor is subjected to pre-water washing for cooling the lithographic printing plate precursor and removing a protective layer.

The above-described pre-heating and pre-water washing and development described below are connected with a setter for exposure to perform the processing in many cases. Needless to say, it is not restricted to use these units in the connected state and they may be used separately.

While the pre-heating step and pre-water washing step are described, an embodiment omitting these two steps can be used. By omitting these two steps, the processing becomes simple. A manner of the omission depends on the performance of the lithographic printing plate precursor. Occasionally, both or one of these two steps are omitted.

The development is described below. In case of the treatment with hand, for example, a method is used wherein the treatment is performed by rubbing the entire surface of lithographic printing plate precursor with a sponge or absorbent cotton sufficiently impregnated with the processing solution and after the treatment the lithographic printing plate precursor is thoroughly washed with water. In case of the immersion treatment, for example, a method is used wherein the lithographic printing plate precursor is immersed in a vat or deep tank containing the processing solution for about 60 seconds with stirring and then thoroughly washed with water while rubbing with an absorbent cotton or sponge.

In the development processing, a device simplified in the structure or simplified in the process according to the developing method of the invention is used. Since the influence of carbon dioxide in the air is small in comparison with a conventional alkali development system, the closeness degree between the air and solution can be decreased. Further, when the oil-desensitization treatment is performed simultaneously with the development, the water washing step and oil-desensitization treatment step after the development as in a conventional method are not indispensable and provision of one bath or at most two baths is sufficient. Even when the aqueous solution containing no oil-desensitizing agent, for example, a water-soluble resin is used, the performance same as in the conventional system can be obtained by omitting the water washing and then conducting the oil-desensitization treatment with a conventional gum solution or the like. Moreover, by using only one bath of a one-solution developer containing no oil-desensitizing agent, for example, a water-soluble resin, a lithographic printing plate can be obtained so that it is possible to construct a simple processing system although the protecting property of the surface and oil-desensitizing property are inferior to the lithographic printing plate obtained according to the conventional system. Specifically, in such a case, the system can be constructed by providing two baths. Thus, a device cost can be decreased and a device can be placed in a space much smaller than the space necessary for placing the conventional device. The lithographic printing plate precursor can also be applied to an automatic development processor (including pre-heat step, pre-water washing step, development step, water washing step, finishing (gum coating step) conventionally used in the processing. In such a case, although the same processing solution can be used in the development step and finishing step, a processing solution for use in the development step can be designed in a simpler manner. Specifically, a construction including one bath of a one-solution developer containing no oil-desensitizing agent, for example, a water-soluble resin and employing a conventionally used finishing solution (gum solution) in the finishing bath is provided. By constructing as described above, the processing solution can be applied to an automatic development processor conventionally used so that the facilities can be effectively employed.

Since a rubbing member is ordinarily indispensable for the development processing, the rubbing member, for example, a brush is provided in the developing bath for removing the non-image area of the photosensitive layer.

The developer including the surfactant for use in the invention can remarkably reduce the load against the rubbing member, for example, a brush. In case of using a developer of a low alkaline to acidic region, the non-image area is ordinarily not removed without conducting development under strong rubbing conditions for removing the non-image area of the photosensitive layer. On the contrary, the developer containing the surfactant for use in the invention enables to conduct development using a rubbing member comparable with the rubbing member used in a conventional alkali development and under rubbing conditions (rotation number, brush pressure) similar to the rubbing conditions used in a conventional alkali development.

Needless to say, gum coaters or automatic development processors known for conventional PS plates or CTP plates can be used in the system according to the invention. In case of using the conventional automatic development processor, any processing system, for example, a processing system wherein the processing solution prepared in a developing tank is pumped up by a pump and sprayed through spray nozzles to the exposed lithographic printing plate precursor, a processing system wherein the exposed lithographic printing plate precursor is immersed in a bath filled with the processing solution while conveying the lithographic printing plate precursor by means of guide rollers or the like in the solution or a so-called disposable processing system wherein the processing solution substantially fresh is supplied in an amount necessary for processing every one sheet of the exposed lithographic printing plate precursor can be used. In any system, it is more preferred that a rubbing mechanism by means of a brush, molton or the like is provided. Also, a device in which a laser exposure unit and an automatic development processor unit are incorporated may be employed.

In the processing method of a lithographic printing plate precursor according to the invention, methods including the steps shown below are preferably used.

In case of one-solution processing:

Pre-heat→development processing (pre-water washing+development+gumming)→drying

Pre-heat→pre-water washing→development processing (development+gumming)→drying

In case of drop-in processing:

Pre-heat→pre-water washing→development processing→water washing→gum treatment→drying In the above methods, the pre-heat step can be appropriately omitted when the sensitivity of lithographic printing plate precursor is sufficiently high and the output of laser setter is sufficiently large.

Further, in order to impart more steadily the oil-desensitizing performance, in the construction of the one-solution processing, water washing and gum treatment steps or only a gum treatment step may be introduced after the development processing step.

EXAMPLES

The present invention will be described in more detail with reference to the following examples, but the invention should not be construed as being limited thereto.

Examples 1 to 12 and Comparative Examples 1 to 5

[Preparation of Lithographic Printing Plate Precursor]
(Preparation of Support 1)

An aluminum plate (material: JIS A1050) having a thickness of 0.3 mm was dipped in an aqueous 10% by weight sodium hydroxide solution at 60° C. for 25 seconds to effect etching, washed with running water, neutralized and cleaned with an aqueous 20% by weight nitric acid solution and then washed with water. The aluminum plate was subjected to an electrolytic surface roughening treatment in an aqueous 1% by weight nitric acid solution using an alternating current with a sinusoidal waveform at an anode time electricity of 300 coulomb/dm². Subsequently, the aluminum plate was dipped in an aqueous 1% by weight sodium hydroxide solution at 40° C. for 5 seconds, dipped in an aqueous 30% by weight sulfuric acid solution at 60° C. for 40 seconds to effect a desmut treatment, and then subjected to an anodizing treatment in an aqueous 20% by weight sulfiric acid solution for 2 minutes at a current density of 2 A/dm² to form an anodic oxide film having a thickness of 2.7 g/m². The center line average roughness (Ra) of the thus-treated aluminum plate was measured using a stylus having a diameter of 2 μm and found to be 0.25 μm (Ra indication according to JIS B0601). Thereafter, the aluminum plate was treated with an aqueous 1% by weight sodium silicate solution at 20° C. for 10 seconds to prepare Support 1.

(Preparation of Support 2)

Undercoat Solution (1) shown below was coated using a bar on the aluminum plate subjected to the anodizing treatment described above and dried in an oven at 80° C. for 10 seconds to form an undercoat layer having a dry coating amount of 10 mg/m², thereby preparing Support 2.

| <Undercoat Solution (1)> | |
| --- | --- |
| Undercoat Compound (1) shown below | 0.010 g |
| Methanol | 9.00 g |
| Water | 1.00 g |

Undercoat Compound (1):

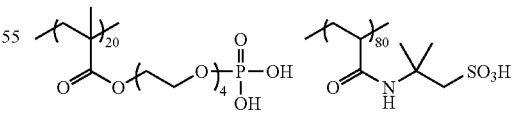

Molecular weight: 110,000

(Preparation of Support 3)

Undercoat Solution (2) shown below was coated using a bar on the aluminum plate subjected to the anodizing treatment described above and dried in an oven at 80° C. for 10 seconds to form an undercoat layer having a dry coating amount of 10 mg/m², thereby preparing Support 3.

<Undercoat Solution (2)>

| | |
|---|---|
| Undercoat Compound (2) shown below | 0.017 g |
| Methanol | 9.00 g |
| Water | 1.00 g |

Undercoat Compound (2):

Molecular weight: 110,000

Molar ratio of Copolymerization component: 10/20/70 (in a left-to-right order of the components of Undercoat Compound (2))

On each of the supports described above, Coating Solution (1) for Photosensitive Layer having the composition shown below was coated using a bar and dried in an oven at 70° C. for 60 seconds to form a photosensitive layer having a dry coating amount of 1.1 g/m². On the photosensitive layer, Coating Solution (1) for Protective Layer having the composition shown below was coated using a bar and dried at 125° C. for 70 seconds to form a protective layer having a dry coating amount of 0.75 g/m², thereby preparing a lithographic printing plate precursor.

<Coating Solution (1) for Photosensitive Layer>

| | |
|---|---|
| Binder polymer (as shown in Table 4 below) | 0.54 g |
| Polymerizable Compound (M-1) shown below | 0.48 g |
| Polymerization Initiator (I-1) shown below | 0.08 g |
| Sensitizing Dye (D-1) shown below | 0.06 g |
| Chain Transfer Agent (S-2) shown below | 0.07 g |
| Dispersion of ε-phthalocyanine pigment [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor N-nitrosophenylhydroxylamine aluminum salt | 0.01 g |
| Fluorine-Based Surfactant (F-1) shown below | 0.001 g |
| Polyoxyethylene-polyoxypropylene condensate (Pluronic L44, produced by ADEKA Corp.) | 0.04 g |
| Tetraethylammonium chloride | 0.01 g |
| 1-Methoxy-2-propanol | 3.5 g |
| Methyl ethyl ketone | 8.0 g |

M-1 A mixture of the following compounds:

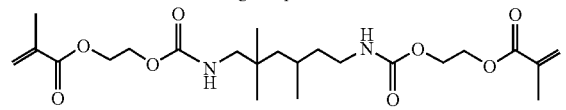

<Coating Solution (1) for Photosensitive Layer>

S-2:

F-1:
—(CH₂CH)₃₀—
        |
        COOC₂H₄C₆F₁₃
—(CH₂CH)₇₀—
        |
        C—(OC₂H₄)₁₁—(OC₃H₆)₂₂—OC₂H₄)₁₁—OH
        ‖
        O

D-1

I-1

<Coating Solution (1) for Protective Layer>

| | |
|---|---|
| Dispersion of Mica (1) shown below | 13.00 g |
| Polyvinyl alcohol (saponification degree: 98% by mole; polymerization degree: 500) | 1.30 g |
| Sodium 2-ethylhexylsulfosuccinate | 0.20 g |
| Vinyl pyrrolidone/vinyl acetate (1/1) copolymer (molecular weight: 70,000) | 0.050 g |
| Surfactant (Emalex 710, produced by Nihon-Emulsion Co., Ltd.) | 0.050 g |
| Water | 133.00 g |

(Preparation of Dispersion of Mica (1))

In 368 g of water was added 32 g of synthetic mica (Somasif ME-100, produced by CO-OP Chemical Co., Ltd.; aspect ratio: 1,000 or more) and the mixture was dispersed using a homogenizer until the average particle diameter (measured by a laser scattering method) became 0.5 μm to obtain Dispersion of Mica (1).

The lithographic printing plate precursors used in respective examples and comparative examples were prepared according to the combinations of the support and the photosensitive layer as shown in Table 4 below.

[Image Exposure, Development Processing and Evaluation of Lithographic Printing Plate Precursor]

(Image Exposure)

The lithographic printing plate precursor was subjected to image exposure by a violet semiconductor laser plate setter Vx9600 (having InGaN semiconductor laser: emission: 405 nm±10 nm/output: 30 mW) produced by FUJIFILM Electronic Imaging, Ltd. As for the image, halftone dots of 35% were drawn using an FM screen (TAFFETA 20, produced by Fuji Film Co., Ltd.) in a plate surface exposure amount of 0.09 mJ/cm$^2$ and at resolution of 2,438 dpi.

(Development Processing)

The development processing was performed according to each of Development Processings 1 to 3 shown below as shown in Table 4.

<Development Processing 1>

The lithographic printing plate precursor exposed imagewise was subjected to pre-heat and development processing using an automatic development processor as shown in FIG. 1 within 30 seconds after the imagewise exposure. In the automatic development processor shown in FIG. 1, the lithographic printing plate precursor was subjected to heat treatment at 105° C. for 10 seconds in a heating unit (pre-heat unit) and subjected to development and gum treatment at the same time in a development processing unit. Specifically, the lithographic printing plate precursor pre-heated was immersed in a developer to remove the photosensitive layer in the non-image area by rubbing and to undergo the oil-desensitizing treatment at the same time. Thereafter, the lithographic printing plate precursor was dried in a drying step. The transporting speed of the lithographic printing plate precursor was 100 cm/min.

<Development Processing 2>

Figure 2:
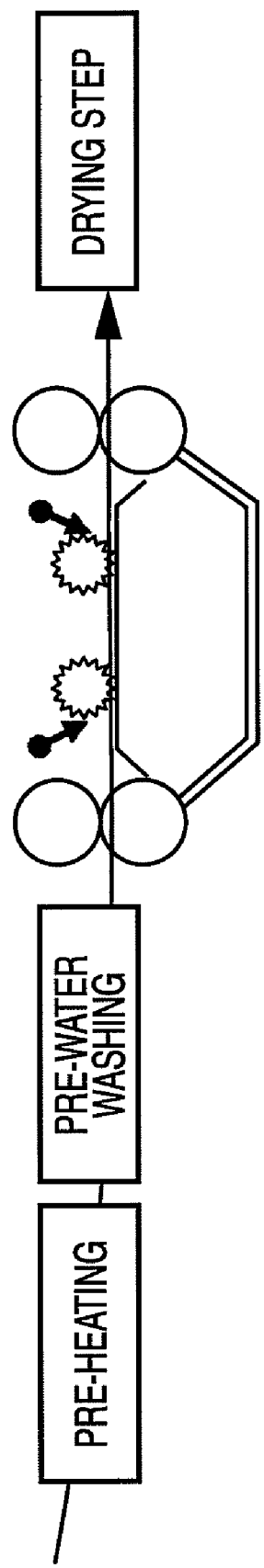
FIG. 2 is an illustration for schematically showing another development processor for use in the processing method of a lithographic printing plate precursor according to the invention.

The lithographic printing plate precursor exposed imagewise was subjected to development processing using an automatic development processor of horizontal transportation system as shown in FIG. 2 within 30 seconds after the imagewise exposure. In the development processing, a pre-water washing step is provided just after the pre-heat step. The heat treatment was conducted at plate surface temperature of 95° C. for about 10 seconds and then the protective layer was removed in the pre-water washing step. After removing the protective layer, the lithographic printing plate precursor was transported in the horizontal direction and the photosensitive layer in the non-image area was removed by rubbing with a brush while supplying the developer from a spray pipe. After the development, the lithographic printing plate precursor was dried with warm air in a drying step. The transporting speed of the lithographic printing plate precursor was 80 cm/min.

<Development Processing 3>

Figure 3:
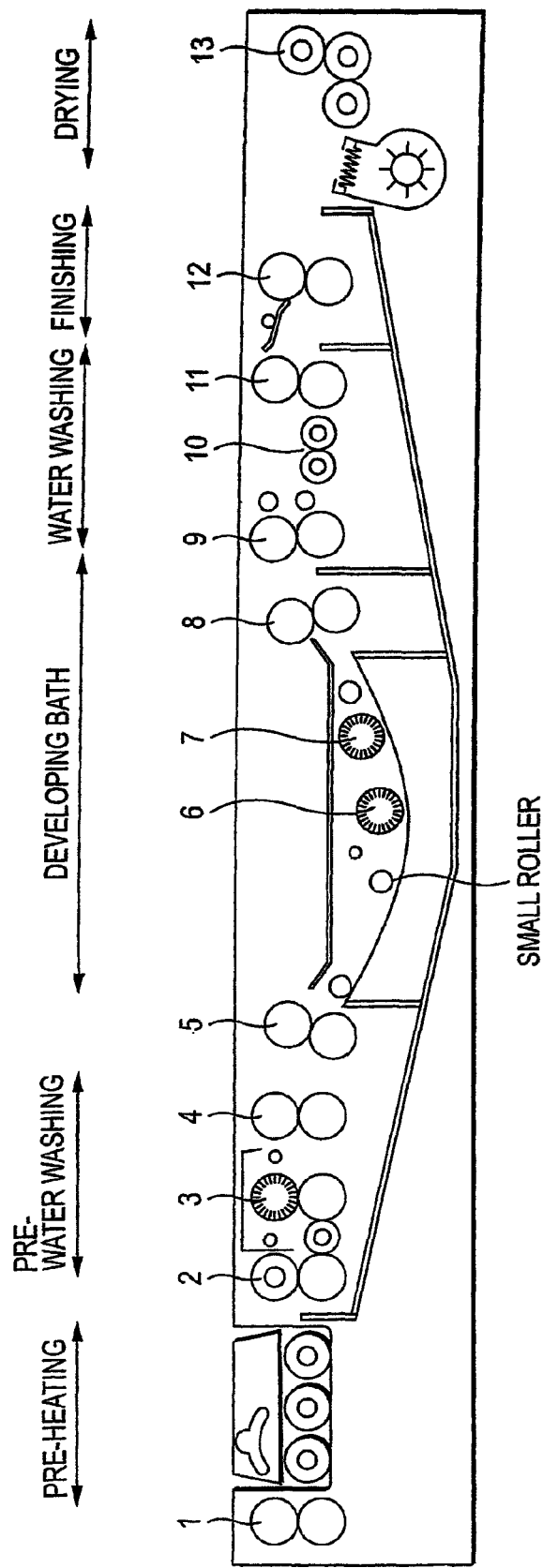
FIG. 3 is an illustration for schematically showing still another development processor for use in the processing method of a lithographic printing plate precursor according to the invention.

The lithographic printing plate precursor exposed imagewise was subjected to development processing using an automatic development processor (LP1250PLX, produced by Fuji Film Co., Ltd.) within 30 seconds after the imagewise exposure. The automatic development processor was composed of a heating unit, a water-washing unit, a developing unit, a rinsing unit and a finishing unit in this order. The heating condition in the heating unit was at 100° C. for 10 seconds. In the developing tank, the developer shown in Table 4 was supplied. In the water-washing tank, water was supplied. In the finishing tank, a solution prepared by diluting a gum solution (FP-2W, produced by Fuji Film Co., Ltd.) twice with water was supplied. The temperature of the developer was 28° C. The transportation of the lithographic printing plate precursor was performed at a transporting speed of 110 cm/min. A schematic view of the automatic development processor is shown in FIG. 3.

The compositions of the processing solutions used in the development processing are shown below, respectively. The pH of each processing solutions was adjusted at 4.5 with phosphoric acid and sodium hydroxide.

TABLE 1

|  | Processing Solution 1 | Processing Solution 2 | Processing Solution 3 | Processing Solution 4 | Processing Solution 5 | Processing Solution 6 | Processing Solution 7 |
|---|---|---|---|---|---|---|---|
| Water | 8249.8 | 8179.8 | 8179.8 | 8179.8 | 8179.8 | 8279.8 | 8879.8 |
| Gum arabic | 250 | 250 | 250 | 250 | 250 | 250 | 250 |
| Enzyme-modified potato starch | 700 | 700 | 700 | 700 | 700 | 700 | 700 |
| Sodium salt of dioctylsulfosuccinic acid ester | 50 | 50 | 50 | 50 | 50 | 50 | 50 |
| Ammonium primary phosphate | 10 | 10 | 10 | 10 | 10 | 10 | 10 |
| Citric acid | 10 | 10 | 10 | 10 | 10 | 10 | 10 |
| 2-Bromo-2-nitropropane-1,3-diol | 0.1 | 0.1 | 0.1 | 0.1 | 0.1 | 0.1 | 0.1 |
| 2-Methyl-4-isothiazolin-3-one | 0.1 | 0.1 | 0.1 | 0.1 | 0.1 | 0.1 | 0.1 |
| Amphoteric Surfactant W-2 | 700 | 700 | 700 | 700 | 700 | 700 | — |
| Anionic Surfactant A-1 | 30 | 100 | — | — | — | — | 100 |
| Anionic Surfactant A-5 | — | — | 100 | — | — | — | — |
| Anionic Surfactant A-8 | — | — | — | 100 | — | — | — |
| Anionic Surfactant A-11 | — | — | — | — | 100 | — | — |
| Total | 10000 (g) | 10000 (g) | 10000 (g) | 10000 (g) | 10000 (g) | 10000 (g) | 10000 (g) |

TABLE 2

|  | Processing Solution 8 | Processing Solution 9 | Processing Solution 10 |
|---|---|---|---|
| Water | 7749.8 | 7749.8 | 7749.8 |
| Benzyl alcohol | 50 | 50 | 50 |
| Ethylene glycol | 50 | 50 | 50 |
| Glycerin | 50 | 50 | 50 |
| Gum arabic | 250 | 250 | 250 |
| Enzyme-modified potato starch | 700 | 700 | 700 |
| Sodium salt of dioctylsulfosuccinic acid ester | 50 | 50 | 50 |
| Ammonium primary phosphate | 10 | 10 | 10 |
| Citric acid | 10 | 10 | 10 |
| 2-Bromo-2-nitropropane-1,3-diol | 0.1 | 0.1 | 0.1 |
| 2-Methyl-4-isothiazolin-3-one | 0.1 | 0.1 | 0.1 |
| Amphoteric Surfactant W-1 | 1000 | 1000 | 1000 |
| Anionic Surfactant A-1 | 80 | — | — |

TABLE 2-continued

|  | Processing Solution 8 | Processing Solution 9 | Processing Solution 10 |
|---|---|---|---|
| Compound A | — | 80 | — |
| Compound B | — | — | 80 |
| Total | 10000 (g) | 10000 (g) | 10000 (g) |

Compound A:

Compound B:
$C_{12}H_{25}$—O—$(CH_2CH_2O)_n$—OH
(n = 10)

TABLE 3

|  | Processing Solution 11 | Processing Solution 12 |
|---|---|---|
| Water | 9050 | 8790 |
| Ammonium primary phosphate | 10 | 10 |
| Amphoteric Surfactant W-2 | 850 | 850 |
| Anionic Surfactant A-1 | 90 | 350 |
| Total | 10000 (g) | 10000 (g) |

With respect to the development processing, in addition to the development processing (fresh solution development) using the processing solution as described above, development processing (fatigued solution development) using a processing solution prepared by adding 1 part by weight of the binder polymer included in the photosensitive layer of the lithographic printing plate precursor to be processed to the processing solution was conducted.

(Evaluation)

<Evaluation of Developing Property>

With the lithographic printing plate obtained by performing the development processing, reflection density (OD) of the non-image area was measured by a reflection densitometer produced by Gretag Macbeth in a cyan mode. The reflection density of the aluminum support measure in the same manner was 0.65. Therefore, when the reflection density of the non-image area is 0.65, it indicates that the photosensitive layer is substantially removed, that is, the developing property is good.

<Evaluation of Printing Stain>

The lithographic printing plate after the development processing was mounted on a printing machine, SOR-M, produced by Heidelberg, and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G (N) black ink (produced by Dai-Nippon Ink & Chemicals, Inc.). On the 500th printed material, stain (background satin) in the non-image area was observed and when the background stain was not recognized, the observation result of the printed material just after the initiation of printing was also considered to evaluate the printing stain according to the following criteria:

○: Background satin did not occur even just after the initiation of printing (good).
Δ: Slight background satin occurred only just after the initiation of printing.
Δ×: Slight background satin partly occurred.
×: Background satin occurred.

The results of the evaluation are shown in table 4.

TABLE 4

|  | Development Processing | Binder Polymer Of Photosensitive Layer | Support | Processing Solution | Remarks | Fresh Solution Development | | Fatigued Solution Development | | Evaluation Judgment |
|---|---|---|---|---|---|---|---|---|---|---|
|  |  |  |  |  |  | Developing Property | Printing Stain | Developing Property | Printing Stain |  |
| Example 1 | Development Processing 1 | Binder Polymer 1 | Support 2 | Processing Solution 1 |  | 0.65 | ○ | 0.65 | Δ | OK |
| Example 2 |  |  |  | Processing Solution 2 |  | 0.65 | ○ | 0.65 | ○ | OK |
| Example 3 |  |  |  | Processing Solution 3 |  | 0.65 | ○ | 0.65 | ○ | OK |
| Example 4 |  |  |  | Processing Solution 4 |  | 0.65 | ○ | 0.65 | ○ | OK |
| Example 5 |  |  |  | Processing Solution 5 |  | 0.65 | ○ | 0.65 | ○ | OK |
| Comparative Example 1 |  |  |  | Processing Solution 6 |  | 0.65 | ○ | 0.65 | × | NG |
| Comparative Example 2 |  |  |  | Processing Solution 7 |  | 1.51 | × | 1.51 | × | NG |
| Example 6 | Development Processing 1 | Binder Polymer 1 | Support 2 | Processing Solution 8 |  | 0.65 | ○ | 0.65 | ○ | OK |
| Comparative Example 3 |  |  |  | Processing Solution 9 |  | 0.65 | ○ | 0.65 | Δ× | NG |
| Comparative Example 4 |  |  |  | Processing Solution 10 |  | 0.65 | ○ | 0.65 | × | NG |
| Example 7 | Development Processing 1 | Binder Polymer 1 | Support 2 | Processing Solution 11 | With Separate Gumming Step | 0.65 | ○ | 0.65 | ○ | OK |
| Comparative Example 5 |  |  |  | Processing Solution 12 | With Separate Gumming Step | 0.72 | Δ× | 0.76 | Δ× | NG |

TABLE 4-continued

| | Binder Polymer Of | | | | | Fresh Solution Development | | Fatigued Solution Development | | |
|---|---|---|---|---|---|---|---|---|---|---|
| | Development Processing | Photosensitive Layer | Support | Processing Solution | Remarks | Developing Property | Printing Stain | Developing Property | Printing Stain | Evaluation Judgment |
| Example 8 | Development Processing 2 | Binder Polymer 1 | Support 2 | Processing Solution 2 | | 0.65 | ∘ | 0.65 | ∘ | OK |
| Example 9 | Development Processing 3 | Binder Polymer 1 | Support 2 | Processing Solution 11 | | 0.65 | ∘ | 0.65 | ∘ | OK |
| Example 10 | Development Processing 1 | Binder Polymer 2 | Support 1 | Processing Solution 3 | | 0.65 | ∘ | 0.65 | ∘ | OK |
| Example 11 | Development Processing 1 | Binder Polymer 3 | Support 3 | Processing Solution 5 | | 0.65 | ∘ | 0.65 | ∘ | OK |
| Example 12 | Development Processing 1* | Binder Polymer 1 | Support 2 | Processing Solution 2 | | 0.65 | ∘∘ | 0.65 | ∘ | OK |

Binder Polymer 1:

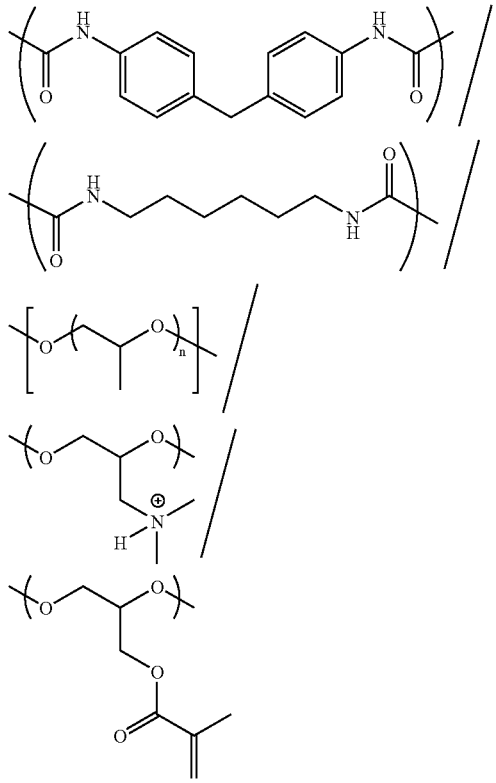

40/10/10/25.8/14.2

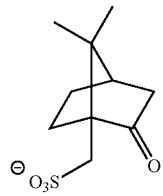

MW: 59000

Binder Polymer 2:

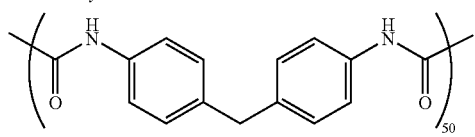

TABLE 4-continued

| | Binder Polymer Of | | | | Fresh Solution Development | | Fatigued Solution Development | | |
|---|---|---|---|---|---|---|---|---|---|
| Development Processing | Photosensitive Layer | Support | Processing Solution | Remarks | Developing Property | Printing Stain | Developing Property | Printing Stain | Evaluation Judgment |

Mw: 80000
Binder Polymer 3

Mw: 55000

Development Processing 1*: In Example 12, the plate surface exposure amount was changed from 0.09 mJ/cm² to 0.20 mJ/cm² and the development processing was carried out according to Development Processing 1 except for eliminating the pre-heat.

From the results shown in Table 4, it can be seen that although the processing method of a lithographic printing plate precursor according to the invention is characterized by processing with the processing solution containing both the amphoteric surfactant and the specific anionic surfactant, when the processing solution not containing the anionic surfactant is used as shown in Comparative Example 1, the printing stain occurs according to the processing with the fatigued solution though the printing stain do not occur according to the processing with the fresh solution. In Comparative Example 1, the reflection density of the non-image area is an equivalent level to that of the aluminum support in the processing with the fresh solution and in the processing with the fatigued solution. However, the fact of the matter is that when a certain amount or more of the photosensitive layer component is dissolved in the processing solution as in the fatigued solution, readsorption of the binder component on the surface of support from the processing solution occurs simultaneously with removal of the photosensitive layer by the development. Thus, since only the binder component adsorbs on the surface of support without the pigment component, the printing stain occurs even when the reflection density of the non-image area is an equivalent level to that of the support.

On the contrary, it is apparent that in Example 1, the printing stain in the processing with the fatigued solution is improved in an acceptable level. Further, in Example 2 wherein the amount of the anionic surfactant is increased, the greater effect is obtained and the printing stain is not recognized even just after the initiation of printing. This is because that the readsorption of the binder component on the surface of support in the processing with the fatigued solution is prevented.

It can also be seen that the good results are obtained even when the kind of the anionic surfactant is varied as shown in Examples 3 to 5. Further, it can be seen that the good results are obtained even when the kind of the photosensitive layer component or the support is varied as shown in Examples 10 and 11.

On the contrary, when the amphoteric surfactant is eliminated, the development can be hardly conducted as shown in Comparative Example 2.

From these results, it can be understood that the processing of a lithographic printing plate precursor which is excellent in the developing property and does not cause the printing stain is achieved by the combination of the amphoteric surfactant and the specific anionic surfactant.

Moreover, the good results are obtained even when the processing solution containing an organic solvent is used as shown in Example 6. On the contrary, in the case of using an anionic surfactant having the total number of carbon atoms outside the scope of the invention (as in Comparative Example 3) or in the case of using a nonionic surfactant in place of the anionic surfactant (as in Comparative Example 4), the printing stain occurs.

As shown in Example 7, the good results are also obtained even when the aqueous solution which does not contain the water-soluble resin is used. In Example 7, after the development processing, the water washing and gum treatment (Gum solution FN-6) were conducted by connecting a water washing unit and a gumming unit to the development processing unit. On the other hand, in Comparative example 5 wherein the anionic surfactant is excessively added, the developing property is clearly decreased and the printing stain occurs not only in the processing with the fatigued solution but also in the processing with the fresh solution.

As shown in Example 8, the good printed materials are obtained without the occurrence of printing stain in the processing with the fatigued solution even when the horizontal transportation system is used.

As shown in Example 9, the good developing property is obtained and the occurrence of printing stain is prevented even when the automatic development processor which is ordinarily employed in a conventional alkali development system is used.

Furthermore, as shown in Example 12, the good results are obtained in the case of performing the image recording with a high exposure amount and eliminating the pre-heating.

This application is based on Japanese Patent application JP 2007-256706, filed Sep. 28, 2007, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A processing solution for development of a lithographic printing plate precursor comprising an aqueous solution having pH of from 2 to 10 and comprising an amphoteric surfactant and an anionic surfactant selected from an anionic surfactant having an aliphatic chain and a total number of carbon atoms included in the aliphatic chain of 6 or more and an anionic surfactant having an aromatic ring and a total number of carbon atoms of 12 or more, wherein the content of the anionic surfactant is from 0.1 to 3.3% by weight of the aqueous solution, and the amphoteric surfactant is a betaine amphoteric surfactant represented by formula <2>:

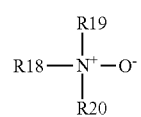

wherein R18, R19 and R20 each represents a hydrogen atom or an alkyl group, provided that all of R18, R19 and R20 are not hydrogen atoms at the same time.

2. The processing solution of claim 1, wherein the aqueous solution has pH in a range of from 3.0 to 7.0.

3. The processing solution of claim 1, wherein the anionic surfactant having an aliphatic chain and a total number of carbon atoms included in the aliphatic chain of 6 or more is an anionic surfactant represented by the following formula <4> or formula <5>:

$$C_l H_{2l+1}-X \qquad <4>$$

$$C_{n-m}H_{2(n-m)+1}OC_m H_{2m}-X \qquad <5>$$

wherein l, n and m each represents an integer satisfying $l \geq 6$, $n \geq 6$ and $n \geq m \geq 0$, and X represents a sulfonate, a sulfuric monoester salt, a carboxylate or a phosphate.

* * * * *